(12) United States Patent
Maruyama et al.

(10) Patent No.: US 8,895,909 B2
(45) Date of Patent: Nov. 25, 2014

(54) PHOTOSENSITIVE RESIN COMPOSITION, LIGHT-SHIELDING COLOR FILTER, METHOD OF PRODUCING THE SAME AND SOLID-STATE IMAGE SENSOR

(71) Applicant: FUJIFILM Corporation, Tokyo (JP)

(72) Inventors: Yoichi Maruyama, Shizuoka-ken (JP); Hiroyuki Einaga, Shizuoka-ken (JP); Toru Fujimori, Shizuoka-ken (JP); Kazuto Shimada, Shizuoka-ken (JP); Tomotaka Tsuchimura, Shizuoka-ken (JP); Yushi Kaneko, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/953,748

(22) Filed: Jul. 30, 2013

(65) Prior Publication Data

US 2013/0306919 A1    Nov. 21, 2013

Related U.S. Application Data

(62) Division of application No. 12/401,632, filed on Mar. 11, 2009.

(30) Foreign Application Priority Data

Mar. 18, 2008 (JP) ................................. 2008-069923
Mar. 31, 2008 (JP) ................................. 2008-092582

(51) Int. Cl.

| | |
|---|---|
| H01L 27/00 | (2006.01) |
| G02B 5/23 | (2006.01) |
| G03F 7/00 | (2006.01) |
| G03F 7/029 | (2006.01) |
| G03F 7/031 | (2006.01) |
| G03F 7/033 | (2006.01) |
| G03F 7/105 | (2006.01) |
| G02B 5/22 | (2006.01) |
| H01L 27/146 | (2006.01) |

(52) U.S. Cl.
CPC ................ *G02B 5/23* (2013.01); *G03F 7/0007* (2013.01); *G03F 7/029* (2013.01); *G03F 7/031* (2013.01); *G03F 7/033* (2013.01); *G03F 7/105* (2013.01); *G02B 5/223* (2013.01); *H01L 27/14621* (2013.01)
USPC ...... 250/208.1; 250/226; 257/432; 430/270.1

(58) Field of Classification Search
CPC ..... C08G 2650/16; G03F 7/0007; C08F 2/50; C08F 4/16; C08F 2/04; C08F 2/06; C08F 2/10; G02B 5/223; G02B 5/23
USPC ............... 250/226, 208.1, 216; 257/431, 432; 252/586; 430/7, 270.1

See application file for complete search history.

(56) References Cited

U.S. PATENT DOCUMENTS 7,381,511 B2 *   6/2008   Ikegami et al. ............ 430/58.85
7,670,745 B2 *   3/2010   Etou et al. ..................... 430/189

(Continued)

FOREIGN PATENT DOCUMENTS

| EP | 1826200 | 8/2007 |
|---|---|---|
| EP | 2105792 | 9/2009 |

(Continued)

OTHER PUBLICATIONS

Jisha et al. ("Self-written waveguide in methylene blue sensitized poly(vinyl alcohol)/acrylamide photopolymer material", Applied Optics, vol. 47, No. 35, Dec. 10, 2008).*

(Continued)

*Primary Examiner* — Francis M Legasse, Jr.
(74) *Attorney, Agent, or Firm* — SOLARIS Intellectual Property Group, PLLC

(57) ABSTRACT

The invention provides a photosensitive resin composition that includes titanium black, a photopolymerizable compound, a resin A having an acid value of from 70 mgKOH/g to 250 mgKOH/g, a resin B having an acid value of from 26 mgKOH/g to 65 mgKOH/g, a photopolymerization initiator, and a solvent, the photopolymerization initiator including an oxime photopolymerization compound.

19 Claims, 1 Drawing Sheet

(56) References Cited

U.S. PATENT DOCUMENTS

| | | |
|---|---|---|
| 2004/0157140 A1 | 8/2004 | Kamata et al. |
| 2005/0002350 A1 | 1/2005 | Ono |
| 2005/0023508 A1 | 2/2005 | Fujimaki |
| 2005/0175930 A1 | 8/2005 | Lee |
| 2005/0258406 A1 | 11/2005 | Onishi et al. |
| 2006/0013857 A1 | 1/2006 | Kronenthal |
| 2006/0138577 A1 | 6/2006 | Hashimoto |
| 2006/0197823 A1* | 9/2006 | Ohta et al. ............. 347/127 |
| 2006/0204730 A1* | 9/2006 | Nakamura et al. ....... 428/195.1 |
| 2007/0025424 A1 | 2/2007 | Hahm et al. |
| 2007/0053279 A1* | 3/2007 | Magnitskii et al. ....... 369/275.1 |
| 2007/0254240 A1 | 11/2007 | Sasaki et al. |
| 2008/0003583 A1 | 1/2008 | Hyde et al. |
| 2008/0035836 A1 | 2/2008 | Lee et al. |
| 2008/0118864 A1* | 5/2008 | Sasaki et al. ............. 430/270.1 |
| 2008/0318018 A1 | 12/2008 | Segawa et al. |
| 2009/0236509 A1 | 9/2009 | Maruyama et al. |

FOREIGN PATENT DOCUMENTS

| | | | | |
|---|---|---|---|---|
| JP | 9-54431 | | 2/1997 | |
| JP | 10-46042 | | 2/1998 | |
| JP | 10-246955 | | 9/1998 | |
| JP | 2000019731 A | | 1/2000 | |
| JP | 2000-47382 | | 2/2000 | |
| JP | 2004269441 A | * | 9/2004 | ........... C07D 471/06 |
| JP | 2004-287298 | | 10/2004 | |
| JP | 2004287298 A | | 10/2004 | |
| JP | 2004-339355 | | 12/2004 | |
| JP | 2004-341245 | | 12/2004 | |
| JP | 2004341245 A | | 12/2004 | |
| JP | 2004347852 A | * | 12/2004 | ............. G03F 7/004 |
| JP | 2005-128483 | | 5/2005 | |
| JP | 2005128483 A | | 5/2005 | |
| JP | 2005-208336 | | 8/2005 | |
| JP | 2006-36750 | | 2/2006 | |
| JP | 2006-053569 | | 2/2006 | |
| JP | 2006-156801 | | 6/2006 | |
| JP | 2006-276878 | | 10/2006 | |
| JP | 2006284784 A | | 10/2006 | |
| JP | 2007-025535 | | 2/2007 | |
| JP | 2007-072034 | | 3/2007 | |
| JP | 2007-115921 | | 5/2007 | |
| JP | 2007332045 A | | 12/2007 | |
| JP | 2008-020602 | | 1/2008 | |
| JP | 2008020602 A | | 1/2008 | |
| JP | 2010519592 A | | 6/2010 | |
| TW | 200639124 | | 11/2006 | |
| WO | 2005/103823 | | 11/2005 | |
| WO | 2006/070794 | | 7/2006 | |
| WO | 2007/105644 | | 9/2007 | |

OTHER PUBLICATIONS

Partial English language translation of the following: Office action dated May 28, 2013 from the Japanese Patent Office in a Japanese patent application corresponding to the instant patent application. This office action translation is submitted now in order to supplement the understanding of patent document JP 2007-72034 and JP 2007-25535 which are cited in the office action and are being disclosed in the instant information Disclosure Statement.
Japanese Office Action dated Mar. 21, 2012 which was issued in the corresponding Japanese Application.
Japanese Office Action dated Aug. 7, 2012 issued in the corresponding Japanese Application with English Translation.
EP communication, dated Jul. 8, 2009, issued in corresponding EP Application No. 09003743.3.
Partial English language translation of the following: Office action dated Oct. 31, 2013, from the Taiwanese Patent Office in a Taiwanese patent application corresponding to the instant patent application. This office action translation is submitted now in order to supplement the understanding of patent document TW200639124 which are cited in the office action and are being disclosed in the instant Information Disclosure Statement.
Taiwanese Office Action dated Aug. 8, 2014 which was issued in the corresponding Taiwanese Application.

* cited by examiner

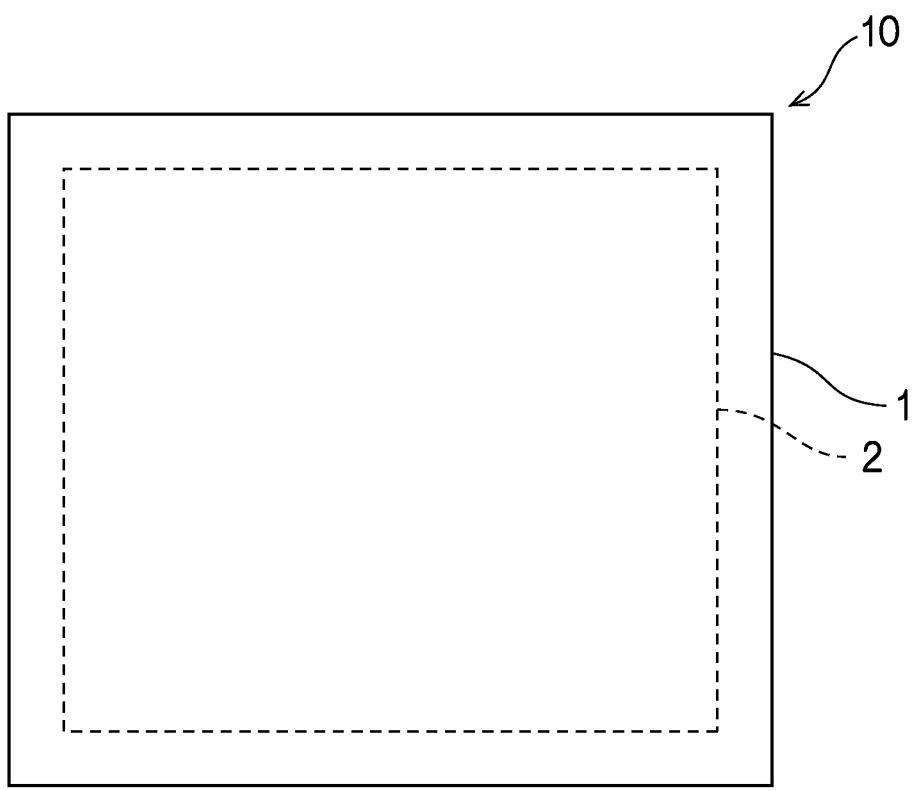

PHOTOSENSITIVE RESIN COMPOSITION, LIGHT-SHIELDING COLOR FILTER, METHOD OF PRODUCING THE SAME AND SOLID-STATE IMAGE SENSOR

CROSS-REFERENCE TO RELATED APPLICATION

This application is a divisional application of application Ser. No. 12/401,632, filed Mar. 11, 2009, which is based upon and claims the benefit of priority from prior Japanese Patent Application No. 2008-069923, filed Mar. 18, 2008, and Japanese Patent Application No. 2008-092582, filed Mar. 31, 2008. The entire contents of these applications are incorporated herein by reference in their entirety.

BACKGROUND OF THE INVENTION

1. Field of the Invention

The invention relates to a photosensitive resin composition, a light-shielding color filter, a method of producing the same, and a solid-state image sensor.

2. Description of the Related Art

Color filters used in liquid crystal display devices are provided with a light-shielding film called black matrix for the purpose of shielding a space between colored pixels from light, improving contrast, or the like. In addition, solid-state image sensors are also provided with a light-shielding color filter for the purpose of preventing noise, improving image quality, or the like.

As a composition used for forming a black matrix for liquid crystal display devices, or a light-shielding color filter for solid-state image sensors, a photosensitive resin composition including a black color material such as carbon black and titanium black is known (for example, see Japanese Patent Application Laid-Open (JP-A) No. 10-246955, JP-A No. 9-54431, JP-A No. 10-46042, JP-A No. 2006-36750 and JP-A No. 2007-115921).

Further, a photopolymerizable composition including two or more kinds of resins having a different acid value is known as a composition that may reduce the scumming of a color filter (for example, see JP-A No. 2000-47382).

SUMMARY OF THE INVENTION

A first exemplary embodiment of the invention provides a photosensitive resin composition including a black colorant, a photopolymerizable compound, a resin, a photopolymerization initiator and a solvent, the composition capable of forming a light-shielding color filter having a ratio $OD_{1200}/OD_{365}$ of from 0.5 to 3, where $OD_{1200}$ is an optical density at a wavelength of 1200 nm and $OD_{365}$ is an optical density at a wavelength of 365 nm.

A second exemplary embodiment of the invention provides a photosensitive resin composition including titanium black, a photopolymerizable compound, a resin A having an acid value of from 70 to 250 mgKOH/g, a resin B having an acid value of from 26 to 65 mgKOH/g, a photopolymerization initiator, and a solvent.

BRIEF DESCRIPTION OF THE DRAWING

FIG. 1 is a schematic diagram showing a step formed in a light-shielding color filter.

DETAILED DESCRIPTION OF THE INVENTION

First Exemplary Embodiment

The first exemplary embodiment of the invention provides a photosensitive resin composition including a black colorant, a photopolymerizable compound, a resin, a photopolymerization initiator and a solvent, the composition capable of forming a light-shielding color filter having a ratio $OD_{1200}/OD_{365}$ of from 0.5 to 3, where $OD_{1200}$ is an optical density at a wavelength of 1200 nm and $OD_{365}$ is an optical density at a wavelength of 365 nm.

Black matrixes for liquid crystal display devices need to have a light-shielding effect in a visible-light range. On the other hand, light-shielding color filters for solid-state image sensors need to have a light-shielding effect both in an infrared region and visible-light region.

Further, while miniaturization of black matrixes for liquid crystal display devices have been demanded, light-shielding color filters for solid-state image sensors (in particular, light-shielding color filters used for a surface of a support opposite to a surface on which light-receiving elements are formed (hereinafter, referred to as a "back side" sometimes) need to have an ability of uniformly shielding a large area from light, as compared with the black matrixes for liquid crystal display devices.

However, when the above-mentioned conventional photosensitive resin composition is used for a light-shielding color filter having a large area, a portion with a thickness less than the thickness in the center (steps region) may occur in the periphery of the light-shielding color filter, which may cause degradation in light-shielding performances in the periphery.

Under such circumstances as mentioned above, an object of the present exemplary embodiment is to provide a photosensitive resin composition capable of forming a light-shielding color filter in which degradation in light-shielding performances in the periphery is suppressed; a light-shielding color filter in which degradation in light-shielding performances in the periphery is suppressed; a method of producing the same; and a solid-state image sensor that exhibits less noise and excellent color reproducibility.

<Photosensitive Resin Composition>

The photosensitive resin composition a photosensitive resin composition includes a black colorant, a photopolymerizable compound, a resin, a photopolymerization initiator and a solvent, the composition capable of forming a light-shielding color filter having a ratio $OD_{1200}/OD_{365}$ of from 0.5 to 3, where $OD_{1200}$ is an optical density at a wavelength of 1200 nm and $OD_{365}$ is an optical density at a wavelength of 365 nm.

By using the photosensitive resin composition having the above composition for a light-shielding color filter, occurrence of step regions in the periphery of light-shielding color filter may be suppressed, and degradation in light-shielding properties in the periphery of light-shielding color filter may be suppressed.

If the above-mentioned ratio of $OD_{1200}/OD_{365}$ is less than 0.5, a light-shielding effect in the infrared region, which is necessary for light-shielding color filters for solid-state image sensors, may not be sufficient. On the other hand, if the above-mentioned ratio of $OD_{1200}/OD_{365}$ is more than 3, the balance between light-shielding performances in the visible-light region and infrared region may be lost.

The "light-shielding color filter" in the present exemplary embodiment refers to a light-shielding pattern obtained by exposing a photosensitive resin composition to light and developing it, the composition including at least a black color material, a photopolymerizable compound, a resin, a photopolymerization initiator, and a solvent. The color of the "light-shielding color filter" in the present exemplary embodiment may be an achromatic color such as black or gray, or may be a chromatic color such as gray mixed with a chromatic color.

The step region in the present exemplary embodiment refers to a portion in the form of a step observed in a light-shielding color filter having the size of about 50 μm on a side (in particular, about 200 μm on a side) which is formed by applying a photosensitive resin composition and exposing the composition to light, followed by developing it. When the light-shielding color filter is observed with an optical microscope from the above of film surface, the step may be seen as a line in an almost similar shape to the pattern edge of the light-shielding color filter.

FIG. 1 is a schematic view of a step formed in a light-shielding color filter 10. The solid line represents a pattern edge 1 of light-shielding color filter 10, and the broken line represents a step 2. The broken line is actually observed as a solid line.

The film thickness of light-shielding color filter 10 in a region outside step 2 (the region sandwiched between pattern edge 1 and step 2 in FIG. 1) is less than the thickness in a region inside step 2 (the region surrounded by step 2 in FIG. 1). Therefore, light-shielding performances in the region outside step 2 (hereinafter, referred to as a "step region" sometimes) is less than the light-shielding performances in the other portion. As a result, adverse effects such as noises may occur when such a light-shielding color filter is used in a solid-state image sensor.

The optical density (OD) in the present exemplary embodiment is obtained by measuring the transmittance of the obtained film using an optical densiometer U-4100, trade name, manufactured by Hitachi High-Technologies Corporation, and converting the obtained transmittance (% T) to OD value in accordance with the following Equation 1.

$$OD \text{ value} = -\text{Log}(\% T/100) \quad \text{Equation 1}$$

In the present exemplary embodiment, the optical density at a wavelength of λ nm is described as "$OD_\lambda$".

In the present exemplary embodiment, the optical density of light-shielding color filter is not particularly limited as long as the aforementioned requirements can be satisfied. However, from the viewpoint of achieving the effects of the present exemplary embodiment more effectively, the ratio of optical density preferably satisfies the following requirements.

Specifically, the ratio of $OD_{1200}/OD_{365}$ is preferably 0.5 or more and 2.5 or less, more preferably 0.7 or more and 2.5 or less, further preferably 1.0 or more and 2.5 or less, and particularly preferably 1.3 or more and 2.0 or less.

The optical density at a wavelength of 1200 nm ($OD_{1200}$) is preferably 2 or more and 10 or less, 2 or more and 9 or less, further preferably 3 or more and 9 or less, and particularly preferably 4 or more and 9 or less.

The optical density at a wavelength of 365 nm ($OD_{365}$) is preferably 1 or more and 7 or less, more preferably 1 or more and 6 or less, and further preferably 2 or more and 6 or less.

The optical density at a wavelength region of 900 nm to 1300 nm is preferably 2 or more and 9 or less, more preferably 2 or more and 8 or less, further preferably 3 or more and 8 or less, and particularly preferably 4 or more and 8 or less.

The ratio of $OD_{900}/OD_{365}$ is preferably 0.5 or more and 2.5 or less, more preferably 0.7 or more and 2.5 or less, further preferably 1.0 or more and 2.5 or less, and particularly preferably 1.3 or more and 2.5 or less.

The ratio of $OD_{1100}/OD_{365}$ is preferably 0.4 or more and 2.5 or less, more preferably 0.6 or more and 2.5 or less, further preferably 1.0 or more and 2.5 or less, and particularly preferably 1.3 or more and 2.5 or less.

The ratio of $OD_{1300}/OD_{365}$ is preferably 0.4 or more and 2.5 or less, more preferably 0.5 or more and 2.5 or less, further preferably 1.0 or more and 2.3 or less, and particularly preferably 1.1 or more and 2.0 or less.

Each component of the photosensitive resin composition of the present exemplary embodiment will be explained below.

<Black Color Material>

The black color material in the present exemplary embodiment may be any known black pigments or black dyes. However, in particular, the black color material is preferably carbon black, titanium black, iron oxide, manganese oxide, graphite or the like, and among them, carbon black and titanium black are more preferably from the viewpoint of realizing high optical density at small amounts.

The photosensitive resin composition of the present exemplary embodiment may contain only one kind of black color material, or may contain two or more kinds.

The average particle size (average primary particle size) of the black color material is preferably small, considering the occurrence of foreign matters or the influences on the yield in the production solid-state image sensors. The average primary particle size is preferably 100 nm or less, further preferably 50 nm or less, and particularly preferably 30 nm or less.

The average particle size can be measured by applying a colorant onto a suitable substrate and observing it by a scanning electronic microscope.

The content of black colorant in the photosensitive resin composition is not particularly limited. However, in order to obtain high optical density at a small thickness, the content is preferably as high as possible, specifically 5 to 98% by mass, further preferably 10 to 95% by mass, and particularly preferably 15 to 95% by mass.

If the content of black color material is 5% by mass or more, high optical density can be obtained even at a small thickness. If the content of black colorant is 98% by mass or less, light curing may be promoted more effectively, film strength may be enhanced, and development latitude may be extended.

The above-mentioned carbon black is black fine particles containing fine particles of carbon. Preferably, the particles contains carbon fine particles having a diameter of about 3 to 1,000 nm. In addition, the surface of the fine particles may have various kinds of functional groups including a carbon atom, a hydrogen atom, an oxygen atom, a sulfur atom, a nitrogen atom, a halogen atom, other atoms of inorganic element, or the like.

In addition, characteristics of carbon black may be modified by changing the particle size, structure (association among particles), surface nature (functional groups) or the like, depending on purposes. It is also possible to change the black degree, compatibility with a coating material, or to impart conductivity to the particles.

Specific examples of above-mentioned carbon black include, for example, carbon blacks manufactured by Mitsubishi Chemical Corporation such as #2400, #2350, #2300, #2200, #1000, #980, #970, #960, #950, #900, #850, MCF88, #650, MA600, MA7, MA8, MA11, MA100, MA220, IL30B, IL31B, IL7B, IL11B, IL52B, #4000, #4010, #55, #52, #50, #47, #45, #44, #40, #33, #32, #30, #20, #10, #5, CF9, #3050, #3150, #3250, #3750, #3950, DIABLACK A, DIABLACK N220M, DIABLACK N234, DIABLACK I, DIABLACK LI, DIABLACK II, DIABLACK N339, DIABLACK SH, DIABLACK SHA, DIABLACK LH, DIABLACK H, DIABLACK HA, DIABLACK SF, DIABLACK N550M, DIABLACK E, DIABLACK G, DIABLACK R, DIABLACK N760M and DIABLACK LP;

carbon blacks manufactured by Cancurve Company such as THERMAX N990, N991, N907, N908, N990, N991 and N908;

carbon blacks manufactured by Asahi Carbon Company such as ASAHI #80, ASAHI #70, ASAHI #70L, ASAHI F-200, ASAHI #66, ASAHI #66HN, ASAHI #60H, ASAHI #60U, ASAHI #60, ASAHI #55, ASAHI #50H, ASAHI #51, ASAHI #50U, ASAHI #50, ASAHI #35, ASAHI #15 and ASAHI THERMAL;

carbon blacks manufactured by Degussa Company such as COLORBLACK FW200, COLORBLACK FW2, COLORBLACK FW2V, COLORBLACK FW1, COLORBLACK FW18, COLORBLACK S170, COLORBLACK S160, SPECIAL BLACK 6, SPECIAL BLACK 5, SPECIAL BLACK 4, SPECIAL BLACK 4A, PRINTEX U, PRINTEX V, PRINTEX 140U and PRINTEX 140V;

carbon blacks manufactured by Cabot Japan K.K. such as SHOBLACK N134, SHOBLACK N110, SHOBLACK N234, SHOBLACK N220, SHOBLACK N219, SHOBLACK N285, SHOBLACK N339, SHOBLACK N330, SHOBLACK N326, SHOBLACK N351, SHOBLACK N330T, SHOBLACK IP200, SHOBLACK IP300, SHOBLACK MAF, SHOBLACK N500 and SHOBLACK N762;

carbon blacks manufactured by Shinnikka Carbon Co., Ltd. such as NITERON #300, NITERON #200, NITERON #200H, NITERON #200IS and NITERON #200L;

carbon blacks manufactured by Tokai Carbon Co., Ltd. such as SEAST 9H, SEAST 9, SEAST 7HM, SEAST 6, SEAST 600, SEAST 5H, SEAST KH, SEAST 3H, SEAST 3, SEAST 300, SEAST NH, SEAST N, SEAST 3M, SEAST SVH, SEAST 116HM, SEAST 116, SEAST SO, SEAST F, SEAST FM, SEAST V and SEAST S; and carbon blacks manufactured by Cabot Corporation such as VULCAN 10H, VULCAN 9, VULCAN 7H, VULCAN 6, VULCAN 6LM, REGAL 300, VULCAN M, VULCAN 3H, VULCAN 4H, VULCAN J, VULCAN 3, VULCANN 299, STERLING-SO, STERLING V, STERLING VH, STERLING 142, STERLING-NS and REGAL-SRF.

In addition, specific examples of the carbon black include those manufactured by Columbian Chemicals, those manufactured by Engineered Carbon Inc., those manufactured by Sid Richardson CARBON & ENERGY Co., and the like.

It is sometimes preferable that the above-mentioned carbon black has an insulation properties.

The carbon black having insulation properties refers to carbon black that shows insulation properties when the volume resististivity thereof as powders is measured in accordance with the following method. Carbon black having insulation properties has an organic compound on the surface of particles thereof, for example, by means of adsorption, covering, or chemical bonding (grafting).

Specifically, a coating composition is prepared by dispersing carbon black and a copolymer of benzyl methacrylate and methacrylic acid copolymerized at a molar ratio of 70:30 (mass-average molecular weight: 30,000) in propylene glycol monomethyl ether at a mass ratio of 20:80 (carbon black: copolymer). The coating composition is applied onto a chromium substrate of 1.1 mm thick and 10 cm×10 cm to prepare a coating film having a dry film thickness of 3 μm. The coating film is heated at 220° C. for about 5 minutes with a hot plate, and the volume resistivity is measured by applying a current with a high-resistivity meter, HIRESTA-UP (MCP-HT450) manufactured by Mitsubishi Chemical Corporation in compliance with JISK6911, at 23° C. and 65% relative humidity. The volume resistivity of carbon black is preferably $10^5$ Ω·cm or more, more preferably $10^6$ Ω·cm or more, and particularly preferably $10^7$ Ω·cm or more.

Examples of the carbon black having the above insulating properties include resin-coated carbon black disclosed in, for example, JP-A No. 11-60988, JP-A No. 11-60989, JP-A No. 10-330643, JP-A No. 11-80583, JP-A No. 11-80584, JP-A No. 9-124969 and JP-A No. 9-95625.

The above-mentioned titanium black is black particles having a titanium atom, preferably lower titanium oxide, titanium oxynitride or the like. Titanium black particles may be surface-modified for the purpose of improving dispersibility, suppressing aggregation properties or the like, as necessary. Specifically, titanium black may be coated with silicon oxide, titanium oxide, germanium oxide, aluminium oxide, magnesium oxide or zirconium oxide. In addition, titanium black may be treated with a water-repellent substance as described in JP-A No. 2007-302836.

In addition, titanium black may be used in combination with one or more kinds of black pigment such as a composite oxide of Cu, Fe, Mn, V, Ni or the like, cobalt oxide, iron oxide, carbon black, aniline black or the like, for the purpose of controlling dispersibility, colorability or the like. In this case, 50% by mass or more of the pigment is titanium black particles.

In addition, existing colorants such as a pigment or dye of red, blue, green, yellow, cyan, magenta, violet, orange or the like may also be added for the purpose of controlling the light-shielding effect at a desired wavelength.

Examples of commercially available products of titanium black include TITANIUM BLACK 10S, 12S, 13R, 13M, 13M-C, 13R and 13R-N, trade name, manufactured by Mitsubishi Materials Corporation, TILACK D, trade name, manufactured by AKO KASEI CO., LTD, and the like.

Methods of producing titanium black include a method of heating and reducing a mixture of titanium dioxide and metal titanium under reductive atmosphere (JP-A No. 49-5432); a method of reducing fine particles of titanium dioxide obtained by subjecting tetrachloride titanium to high-temperature hydrolysis under reductive atmosphere including hydrogen (JP-A No. 57-205322); a method of reducing titanium dioxide or titanium hydroxide at high temperature in the presence of ammonia (JP-A No. 60-65069 and JP-A No. 61-201610); and a method attaching a vanadium compound to titanium dioxide or titanium hydroxide, and reducing it at high temperature in the presence of ammonia (JP-A No. 61-201610). However, the method is not limited to the above.

The particle size of titanium black is not particularly limited, but preferably 3 to 2000 nm, and more preferably 10 to 500 nm from the viewpoint of dispersibility and colorability.

The specific surface area of titanium black is not particularly limited, but the value measured by a BET method is usually about 5 to 150 $m^2/g$, and preferably about 20 to 100 $m^2/g$ in order that titanium black that has been treated with a water-repellent exhibits a desired water repellency.

A dispersing agent having an acid value and/or amine value may be used for dispersing carbon black or titanium black described above. Specific examples of the dispersing agent include SOLSPERSE 24000 or SOLSPERSE 33500, trade name, manufactured by Avecia Limited, DISPERBYK 161, trade name, manufactured by BYK-Chemie Japan, and the like. Herein, the dispersing agent "having an acid value and/or amine value" refers to a dispersing agent having at least one of a group having an acid value and a group having an amine value.

Other examples of the dispersing agent include a polymer obtained by polymerizing a monomer such as (meth)acrylic acid (acrylic acid and methacrylc acid), (meth)acrylic acid ester or (meth)acrylic amide or a derivative thereof, or styrene or a derivative thereof, and a copolymer obtained by copolymerizing the above-described monomers.

Examples of the above-mentioned monomer include styrene-based monomers such as styrene, o-methyl styrene, m-methyl styrene, p-methyl styrene, α-methyl styrene, p-methoxy styrene, p-tert-butyl styrene, p-phenyl styrene, o-chlorostyrene, m-chlorostyrenea and p-chlorostyrene; (meth)acrylic acid-based monomers such as acrylic acid, methyl acrylate, ethyl acrylate, propyl acrylate, n-butyl acrylate, isobutyl acrylate, dodecyl acrylate, stearyl acrylate, 2-ethylhexyl acrylate, hydroxyethyl acrylate, hydroxypropyl acrylate, methacrylic acid, methyl methacrylate, ethyl methacrylate, propyl methacrylate, n-butyl methacrylate, isobutyl methacrylate, n-octyl methacrylate, dodecyl methacrylate, benzyl methacrylate, 2-ethylhexyl methacrylate, stearyl methacrylate, hydroxyethyl mecrylate and hydroxypropyl mecrylate; ethylene, propylene, butylene, vinyl chloride, vinyl acetate, acrylic nitrile, acrylic amide, methacrylic amide, and N-vinyl pyrrolidone. The dispersing agent is preferably a (meth)acrylic acid ester-based polymer.

Other materials that may be used for dispersing include resins such as polyurethane and polyimide, and siloxane-based polymers described in JP-A No. 2002-241616, JP-A No. 2002-234995, and the like.

The weight average molecular weight of the resin that may be used as a dispersing agent is not particularly limited as long as dispersibility can be obtained, but preferably 500 to 200,000, more preferably 800 to 50,000, and still more preferably 1,000 to 30,000 from the viewpoint of dispersibility.

The dispersion medium used for dispersing a black colorant such as the aforementioned carbon black or titanium black may be various kinds of water-soluble or water-insoluble dispersion media as long as it can serve as a solvent for a dispersion. Examples of the dispersion medium includes water; alcohols such as methyl alcohol, ethyl alcohol, isopropyl alcohol, butyl alcohol and allyl alcohol; glycols such as ethylene glycol, propylene glycol, propylene glycol monomethyl ether, diethylene glycol, polyethylene glycol, polypropylene glycol, diethylene glycol monoethyl ether, polypropylene glycol monoethyl ether, polyethylene glycol monoallyl ether and polypropylene glycol monoallyl ether, and derivatives thereof; glycerols such as glycerol, glycerol monoethyl ether and glycerol monoallyl ether, and derivatives thereof; ethers such as tetrahydrofuran and dioxane; ketones such as methylethyl ketone and methylisobutyl ketone;

hydrocarbons such as liquid paraffin, decane, decene, methylnaphthalene, decaline, kerosene, diphenylmethane, toluene, dimethyl benzene, ethyl benzene, diethyl benzene, propyl benzene, cyclohexane and partially water-added triphenyl; silicone oils such as polydimethyl siloxane, partially octyl-substituted polydimethyl siloxane, partially phenyl-substituted polydimethyl siloxane and fluorosilicone oil; halogenated hydrocarbons such as chlorobenzene, dichlorobenzene, bromobenzene, chlorodiphenyl and chlorodiphenylmethane; fluorides such as DAIFLOIL (trade name, manufactured by DAIKIN INDUSTRIES, Ltd.) and DEMNUM (trade name, manufactured by DAIKIN INDUSTRIES, Ltd.); ester compounds such as ethyl benzoate, octyl benzoate, dioctyl phthalate, trioctyl trimellitate, dibutyl sebacate, ethyl(meth)acrylate, butyl(meth)acrylate, dodecyl (meth)acrylate, ethyl acetate, butyl acetate and propylene glycol monomethyl ether acetate; and amide solvents such as N,N-dimethylacrylic amide, N,N-dimethylacetamide and N-methylpyrrolidone. The dispersion medium may be suitably selected and used alone or in combination of two or more.

In the preparation of a dispersion containing a black colorant (such as titanium black) in the present exemplary embodiment, the content of polymer component is preferably 5 to 200 parts by mass, more preferably 10 to 100 parts by mass with respect to 100 parts by mass of the black colorant.

If the content of polymer component is 5 parts by mass or more, the surface nature of black colorant may be more suitably maintained. If the content of polymer component is 200 parts by mass or less, characteristics that are essential to a black colorant such as light-shielding effect or colorability.

The photosensitive resin composition of the present exemplary embodiment may contain the above-described black colorant alone or in combination of two or more kinds. The black colorant in the present exemplary embodiment preferably includes titanium black from the viewpoint of effectively suppressing the degradation in light-shielding performances in the periphery of the color filter.

In addition to above-described black colorant, known colorants such as pigment or dye of red, blue, green, yellow, cyano, magenta, violet, orange or the like may be also be added to the photosensitive resin composition of the present exemplary embodiment for the purpose of controlling light-shielding effect at desired wavelength.

The contents of the colorant to be used in combination (additional colorant) is preferably in the range of 2-50 parts by mass, more preferably 2 to 30 parts by mass and most preferably 2 to 10 parts by mass, with respect to 100 parts by mass of the total amount of black colorant and additional colorant.

<Photopolymerizable Compound>

The photosensitive resin composition of the present exemplary embodiment contains a photopolymerizable compound.

The photopolymerizable compound may be, for example, a compound obtained by addition polymerization having at least one ethylene-unsaturated double bond. Specifically, the photopolymerizable compound may be selected from compounds having one or more ethylene-unsaturated bond at a terminal, preferably compounds having two or more ethylene-unsaturated bonds at a terminal. Such compounds are well known in the field of the art and may be used in the present exemplary embodiment with no particular limitation. Chemical forms of these compounds include, for example, monomer, prepolymer (i.e., dimer or trimer) and oligomer, a mixture thereof, and a copolymer thereof. Examples of the monomer and the copolymer thereof include unsaturated carboxylic acid (for example, acrylic acid, methacrylic acid, itaconic acid, crotonic acid, isocrotonic acid, maleic acid and the like) and esters or amides thereof.

Among these, esters of unsaturated carboxylic acid and an aliphatic polyhydric alcohol compound and amides of unsaturated carboxylic acid and an aliphatic polyamine compound are preferable.

Other suitable examples include products obtained by addition-reaction of unsaturated carboxylic acid ester or amide having a neucleophilic substituent such as a hydroxyl group, amino group or a mercapto group with a mono-functional or multi-functional isocyanate or epoxy compound; and products obtained by dehydrocondensation reaction with mono-functional or multi-functional carboxylic acid; and the like. Also suitably used are products obtained by addition reaction of unsaturated carboxylic acid ester or amide having an electrophilic substituent such as an isocyanate group or epoxy group with a mono-functional or multi-functional alcohol, amine or thiol; and products obtained by substitution reaction of unsaturated carboxylic acid ester or amide having a leaving substituent such as a halogen group or tosyloxy group with a mono-functional or multi-functional alcohol, amine or thiol. Yet further examples include the aforementioned compounds in which the unsaturated carboxylic acid is changed to unsaturated phosphonic acid, styrene, vinyl ether or the like.

Specific examples of the esters unsaturated carboxylic acid and an aliphatic polyhydric alcohol compound include acrylate esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylol propane triacrylate, trimethylol propane tri(acryloyloxypropyl) ether, trimethylol ethane triacrylate, hexanediol diacrylate, 1,4-cyclohexanediol diacrylate, tetraethylene glycol diacrylate, pentaerythritol diacrylate, pentaerythritol triacrylate, pentaerythritol tetracrylate, dipentaerythritol diacrylate, dipentaerythritol hexacrylate, sorbitol triacrylate, sorbitol tetracrylate, sorbitol pentacrylate, sorbitol hexacrylate, tri(acryloyloxyethyl) isocyanurate, polyester acrylate oligomer, and isocyanuric acid EO-modified triacrylate;

methacrylic acid esters such as tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis [p-(3-methacryloxy-2-hydroxypropoxy)phenyl] dimethylmethane, and bis-[p-(methacryloxyethoxy)phenyl] dimethylmethane;

itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate;

crotonic acid esters such as ethylene glycol dicrotonate, tetramethylene glycol dicrotonate, pentaerythritol dicrotonate, and sorbitol tetradicrotonate;

isocrotonic acid esters such as ethylene glycol diisocrotonate, pentaerythritol diisocrotonate, and sorbitol tetraisocrotonate; and maleic acid esters such as ethylene glycol dimaleate, triethylene glycol dimaleate, pentaerythritol dimaleate, and sorbitol tetramaleate.

Other examples of the esters which may be suitably used include, for example, aliphatic alcohol-based esters described in Japanese Patent Publication (JP-B) No. 51-47334 and JP-A No. 57-196231, esters having an aromatic skeleton described in JP-A No. 59-5240, JP-A No. 59-5241 and JP-A No. 2-226149, esters containing an amino group described in JP-A No. 1-165613, and the like. The above-described ester monomers may be used alone or in combination of two or more kinds Specific examples of the amides of unsaturated carboxylic acid and an aliphatic polyamine compound include methylene bis-acrylic amide, methylene bis-methacrylic amide, 1,6-hexamethylene bis-acrylic amide, 1,6-hexamethylene bis-methacrylic amide, diethylenetriamine tris-acrylic amide, xylylene bis-acrylic amide, xylylene bis-methacrylic amide, and the like.

Examples of other preferable amide-based monomers include those having a cyclohexylene structure as described in JP-B No. 54-21726.

In addition, urethane-based compounds obtained by addition polymerization of isocyanate and a hydroxy group are also preferable. Specific examples thereof include, for example, a vinylurethane compound containing two or more polymerizable vinyl groups in one molecule that is obtained by adding a vinyl monomer containing a hydroxy group represented by the following Formula (A) to a polyisocyanate compound having two or more isocyanate groups in one molecule, as described in JP-B No. 48-41708 and the like.

$$CH_2=C(R^4)COOCH_2CH(R^5)OH \qquad (A)$$

(In Formula (A), $R^4$ and $R^5$ each independently represent H or $CH_3$)

Also preferable are urethane acrylates as described in JP-A No. 51-37193, JP-B No. 2-32293 and JP-B No. 2-16765, and urethane compounds having an ethyleneoxide-based skeleton as described in JP-B No. 58-49860, JP-B No. 56-17654, JP-B No. 62-39417 and JP-B No. 62-39418. Further, by using a compound obtained by addition polymerization having an amino structure or sulfide structure in the molecule as described in JP-A No. 63-277653, JP-A No. 63-260909 or JP-A No. 1-105238, a photosensitive resin composition having excellent photosensitivity (speed) may be obtained.

Yet further examples include multi-functional acrylates and methacrylates such as polyesteracrylates as described in JP-A No. 48-64183, JP-B No. 49-43191 and JP-B No. 52-30490 and epoxyacrylates obtained by reaction of epoxy resin and (meth)acrylate. In addition, other examples include specific unsaturated compounds as described in JP-B No. 46-43946, JP-B No. 1-40337 and JP-B No. 1-40336, vinylphosphonic acid-based compounds as described in JP-A No. 2-25493 and the like. In addition, a structure containing a perfluoroalkyl group as described in JP-A No. 61-22048 is suitably used in some cases. Furthermore, light-curing monomers and oligomers as described in Journal of the Adhesion Society of Japan, vol. 20, No. 7, pp. 300-308 (1984) may also be used.

Details of usage of the aforementioned photopolymerizable compound such as the structure of the compound, number of the compound to be used in combination, or the addition amount may be set arbitrarily according to the design for the eventual performances of the photosensitive resin composition. For example, the photopolymerizable compound may be selected in view of the following.

In terms of increasing sensitivity, the compound preferably contain more unsaturated groups per one molecule. In many cases, the compound is preferably difunctional or more. In terms of increasing the strength of a cured film, the compound is preferably trifunctional or more. Further, it is also effective to control both of the sensitivity and strength by using two or more kinds of photopolymerizable compounds having a different number of functional group or a different kind of polymerizable group (such as an acrylate, methacrylate, styrene-based compound, and vinyl ether-based compound) in combination.

The selection and usage of the photopolymerizable compound is a significant factor also in terms of compatibility with other components contained in the photosensitive resin composition (such as a photopolymerization initiator, colorant (pigment or dye) or binder polymer) or dispersibility in the composition. For example, the compatibility may be improved by using a low-purity compound or by using two or more kinds of compounds in combination. It is also possible to select the structure of the compound in order to improve the adhesion of the composition to a hard surface of a support or the like.

The content of the photopolymerizable compound (when two or more kinds are used, the total content thereof) in the total solid content of the photosensitive resin composition of the present exemplary embodiment is not particularly limited, but preferably 5 to 80% by mass, more preferably 10 to 80% by mass, further preferably 10 to 75% by mass, yet more preferably 15 to 75% by mass, even more preferably 15 to 60% by mass, and particularly preferably 20 to 60% by mass, from the viewpoint of effectively obtaining the effects of the present exemplary embodiment.

<Resin>

The photosensitive resin composition of the present exemplary embodiment contains a resin.

The resin is preferably a linear organic polymer, and any known ones may be arbitrarily used. The linear organic polymer is preferably soluble or swellable to water or weak alkali water in order to enable development using water or weak alkali water. The linear organic polymer may be selected and used depending on usage, not only as a film forming agent but also as a developing agent for water, weak alkali water or organic solvent. For example, by selecting a water-soluble organic polymer, aqueous development can be performed. Examples of the water-soluble linear organic polymer include radical polymers having a carboxylic acid group on a side chain, such as those described in JP-A No. 59-44615, JP-B No. 54-34327, JP-B No. 58-12577, JP-B No. 54-25957, JP-A No. 54-92723, JP-A No. 59-53836 and JP-A No. 59-71048, for example, resins obtained by polymerization or copolymerization of a monomer having a carboxyl group; resins obtained by hydrolysis or half-esterization or half-amidation of acid anhydride unit that has been btained by polymerization or copolymerization of a monomer having an acid anhydride; epoxyacrylate obtained by modifying an epoxy resin with unsaturated monocarboxylic acid and acid anhydride; and the like. Monomers having a carboxyl group include acrylic acid, methacrylic acid, itaconic acid, crotonic acid, maleic acid, fumaric acid, 4-carboxylstyrene and the like. Monomers having an acid anhydride include maleic anhydride and the like.

Other examples of the resin include acidic cellulose derivatives having a carboxylic acid group in a side chain, and resins obtained by adding a cyclic acid anhydride to a polymer having a hydroxy group are also applicable.

A copolymer may be used as the resin in the present exemplary embodiment (for example, alkali-soluble resin). Other than the aforementioned monomers, monomers described in the following (1) to (12) may also used for the copolymer.

(1) Acrylates and methacrylates having an aliphatic hydroxy group such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate and 4-hydroxybutyl methacrylate.

(2) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-aryloxyethyl acrylate and propargyl acrylate.

(3) Alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-aryloxyethyl methacrylate and propargyl methacrylate.

(4) Acrylic amides or methacrylic amides such as acrylic amide, methacrylic amide, N-methylol acrylic amide, N-ethylacrylic amide, N-hexyl methacrylic amide, N-cyclohexylacrylic amide, N-hydroxyethylacrylic amide, N-phenylacrylic amide, N-nitrophenylacrylic amide, N-ethyl-N-phenylacrylic amide, vinylacrylic amide, vinyl methacrylic amide, N,N-diallyl acrylic amide, N,N-diallyl methacrylic amide, allyl acrylic amide and allyl methacrylic amide.

(5) Vinyl ethers such as ethylvinyl ether, 2-chloroethylvinyl ether, hydroxyethylvinyl ether, propylvinyl ether, butylvinyl ether, octylvinyl ether and phenylvinyl ether.

(6) Vinyl esters such as vinyl acetate, vinylchloro acetate, vinyl butyrate and vinyl benzoate.

(7) Styrenes such as styrene, α-methyl styrene, methyl styrene, chloromethyl styrene and p-acetoxy styrene.

(8) Vinyl ketones such as methylvinyl ketone, ethylvinyl ketone, propylvinyl ketone and phenylvinyl ketone.

(9) Olefins such as ethylene, propylene, isobutylene, butadiene and isoprene.

(10) N-vinylpyrrolidone, acrylonitrile, methacrylonitrile and the like.

(11) Unsaturated imides such as maleimide, N-acryloylacrylic amide, N-acetylmethacrylic amide, N-propionylmethacrylic amide and N-(p-chlorobenzoyl)methacrylic amide.

(12) Methacrylic acid-based monomers having a heteroatom bonded at α-position, for example, compounds described in JP-A No. 2002-309057 and JP-A No. 2002-311569 and the like.

Among the above, (meth)acrylic resins having an allyl group or vinyl ester group and a carboxyl group in a side chain, alkali-soluble resins having a double bond in a side chain described in JP-A No. 2000-187322 and JP-A No. 2002-62698, and alkali-soluble resins having an amide group in a side chain described in JP-A No. 2001-242612 exhibit a favorable balance among film strength, sensitivity and developing properties.

Urethane-based binder polymers containing an acidic group described in JP-B No. 7-12004, JP-B No. 7-120041, JP-B No. 7-120042, JP-B No. 8-12424, JP-A No. 63-287944, JP-A No. 63-287947, JP-A No. 1-271741, JP-A No. 11-352691, and urethane-based binder polymers having an acidic group and a double bond in a side chain described in JP-A No. 2002-107918 exhibit excellent strength, and are thus effective in terms of printing durability and adaptability to low-level exposure.

Acetal-modified polyvinyl alcohol-based binder polymers having an acidic group as described in European Patent No. 993966, European Patent No. 1204000, JP-A No. 2001-318463 or the like exhibit an excellent balance between film strength and developing properties.

Further, polyvinylpyrrolidone, polyethyleneoxide and the like are also useful water-soluble linear organic polymers. Alcohol-soluble nylon, a polyether of 2,2-bis-(4-hydroxyphenyl)-propane and epichlorohydrin, and the like are also useful in terms of increasing cured film strength.

Among the resins as described above, resins having a polymerizable group are preferable for use in the present exemplary embodiment. The polymerizable group is preferably a group containing a double bond, more preferably an acryloyl group or methacryloyl group.

The weight average molecular weight of the resin contained in the photosensitive resin composition of the present exemplary embodiment is preferably 5,000 or more, more preferably from 10,000 to 300,000. The number average molecular weight is preferably 1,000 or more, more preferably from 2,000 to 250,000. The polydispersity index (weight average molecular weight/number average molecular weight) is preferably 1 or more, more preferably from 1.1 to 10.

The resin may be any one of a random polymer, a block polymer, a graft polymer and the like.

The resin in the present exemplary embodiment may be synthesized by a known method. Examples of the solvent used in the synthesis include tetrahydrofuran, ethylenedichloride, cyclohexanone, methylethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylform amide, N,N-dimethylacetamide, toluene, ethyl acetate, methyl lactate, ethyl lactate, dimethyl sulfoxide, water and the like. The solvent may be used alone or in combination of two or more kinds.

Examples of the radical polymerization initiator used in the synthesis of the resin in the present exemplary embodiment include known compounds such as azo-based initiators, peroxide initiators and the like.

The content of the resin (when two or more kinds are used, the total content thereof) in the total solid content of the photosensitive resin composition of the present exemplary embodiment is not particularly limited, but preferably 5 to 50% by mass, more preferably 10 to 40% by mass and particularly preferably 10 to 35% by mass, from the viewpoint of effectively obtaining the effects of the present exemplary embodiment.

<Photopolymerization Initiator>

The photosensitive resin composition of the present exemplary embodiment contains a photopolymerization initiator.

The photopolymerization initiator is not particularly limited as long as it can cause polymerization of the aforementioned photopolymerizable compound, but preferably selected from the viewpoint of properties, initiation effectiveness, absorption wavelength, availability, cost and the like.

Examples of the photopolymerization initiator include active halogen compounds such as a halomethyloxadiazole compound and a halomethyl-s-triazine compound, a 3-aryl substituted coumarin compound, a rofin dimer, a benzophenone compound, an acetophenone compound and a derivative thereof, a cyclopentadiene-benzene-iron complex and a salt thereof, and an oxime compound.

Examples of the halomethyloxadiazole compound include 2-halomethyl-5-vinyl-1,3,4-oxadiazole compounds as described in JP-B No. 57-6096, 2-trichloromethyl-5-styryl-1,3,4-oxadiazole, 2-trichloromethyl-5-(p-cyanostyryl)-1,3,4-oxadiazole, and 2-trichloromethyl-5-(p-methoxystyryl)-1,3,4-oxadiazole.

Examples of the halomethyl-s-triazine-based compound include vinyl-halomethyl-s-triazine compound as described in JP-B No. 59-1281, 2-(naphth-1-yl)-4,6-bis-halomethyl-s-triazine compounds and 4-(p-aminophenyl)-2,6-di-halomethyl-s-triazine compounds as described in JP-A No. 53-133428.

Specific examples of the halomethyl-s-triazine-based compound include 2,4-bis(trichloromethyl)-6-p-methoxystyryl-s-triazine, 2,6-bis(trichloromethyl)-4-(3,4-methylene dioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphth-1-yl)-4,6-bis-trichloromethyl-s-triazine, 2-(4-methoxy-naphth-1-yl)-4,6-bis-trichloromethyl-s-triazine, 2-(4-ethoxy-naphth-1-yl)-4,6-bis-trichloromethyl-s-triazine, 2-(4-butoxy-naphth-1-yl)-4,6-bis-trichloromethyl-s-triazine, 2-[4-(2-methoxyethyl)-naphth-1-yl]-4,6-bis-trichloromethyl-s-triazine, 2-[4-(2-ethoxyethyl)-naphth-1-yl]-4,6-bis-trichloromethyl-s-triazine, 2-[4-(2-butoxyethyl)-naphth-1-yl]-4,6-bis-trichloromethyl-s-triazine, 2-(2-methoxy-naphth-1-yl)-4,6-bis-trichloromethyl-s-triazine, 2-(6-methoxy-5-methyl-naphth-2-yl)-4,6-bis-trichloromethyl-s-triazine, 2-(6-methoxy-naphth-2-yl)-4,6-bis-trichloromethyl-s-triazine, 2-(5-methoxy-naphth-1-yl)-4,6-bis-trichloromethyl-s-triazine, 2-(4,7-dimethoxy-naphth-1-yl)-4,6-bis-trichloromethyl-s-triazine, 2-(6-ethoxy-naphth-2-yl)-4,6-bis-trichloromethyl-s-triazine, 2-(4,5-dimethoxy-naphth-1-yl)-4,6-bis-trichloromethyl-s-triazine, 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-(p-N-chloroethylaminophenyl)-2,6-di(trichloromethyl)-s-triazine, 4-(p-N-ethoxycarbonylmethylaminophenyl)-2,6-di(trichloromethyl)-s-triazine, 4-[p-N,N-di(phenyl)aminophenyl]-2,6-di(trichloromethyl)-s-triazine, 4-(p-N-chloroethylcarbonylaminophenyl)-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[o-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-(m-bromo-p-N,N-di(chloroethyl)aminophenyl)-2,6-di(trichloromethyl)-s-triazine, 4-(m-chloro-p-N,N-di(chloroethyl)aminophenyl)-2,6-di(trichloromethyl)-s-triazine, 4-(m-phloro-p-N,N-di(chloroethyl)aminophenyl)-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(o-phloro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s- triazine, 4-(o-chloro-p-N-chloroethylaminophenyl)-2,6-di(trichloromethyl)-s-triazine, 4-(o-fluoro-p-N-chloroethylaminophenyl)-2,6-di(trichloromethyl)-s-triazine, and the like.

Other useful photopolymerization initiator include TAZ series manufactured by Midori Kagaku Co., Ltd. (for example, TAZ-107, TAZ-110, TAZ-104, TAZ-109, TAZ-140, TAZ-204, TAZ-113, TAZ-123), T series manufactured by PANCHIM Ltd. (for example, T-OMS, T-BMP, T-R, T-B), IRGACURE series (for example, IRGACURE 651, IRGACURE 184, IRGACURE 500, IRGACURE 1000, IRGACURE 149, IRGACURE 819, IRGACURE 261) and DAROCURE series (for example, DAROCURE1173) manufactured by Ciba Japan K.K., 4,4'-bis(diethylamino)-benzophenone, 2-(O-benzoyloxime)-1-[4-(phenylthio)phenyl]-1,2-octanedione, 1-(O-acetyloxime)-1-[9-ethyl-6-(2-methylbenzoyl)-9H-carbozol-3-yl]ethanone, 2-benzyl-2-dimethylamino-4-morpholinobutyrophenone, 2,2-dimethoxy-2-phenylacetophenone, 2-(o-chlorphenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazoliyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer, benzoin isopropyl ether, and the like.

Among these photopolymerization initiators, oxime-based photopolymerization initiators are preferable. Among the oxime-based photopolymerization initiators, preferable are 2-(O-benzoyloxime)-1-[4-(phenylthio)phenyl]-1,2-octanedione and 1-(O-acetyloxime)-1-[9-ethyl-6-(2-methylbenzoyl)-9H-carbozol-3-yl]ethanone.

In addition, as the oxime-based photopolymerization initiator, a compound (hereinafter, referred to as "novel oxime compound") represented by Formula (1) below is also preferable.

(Novel Oxime Compound)

The novel oxime compound in the present exemplary embodiment is a compound represented by Formula (1) below.

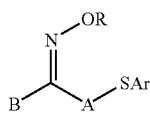

(1)

In aforementioned Formula (1), R and B each independently represent a monovalent substituent, A represents a bivalent organic group, and Ar represents an aryl group.

The monovalent substituent represented by R is preferably a monovalent non-metal atom group as shown below.

Examples of the monovalent non-metal atom group represented by R include an optionally substituted alkyl group, an optionally substituted aryl group, an optionally substituted alkenyl group, an optionally substituted alkynyl group, an optionally substituted alkylsulfinyl group, an optionally substituted arylsulfinyl group, an optionally substituted alkylsulfonyl group, an optionally substituted arylsulfonyl group, an optionally substituted acyl group, an optionally substituted alkoxycarbonyl group, an optionally substituted aryloxycarbonyl group, an optionally substituted phosphinoyl group, an optionally substituted heterocyclic group, an optionally substituted alkylthiocarbonyl group, an optionally substituted arylthiocarbonyl group, an optionally substituted dialkylaminocarbonyl group, an optionally substituted dialkylaminothiocarbonyl group, and the like.

The optionally substituted alkyl group is preferably an alkyl group having a carbon number of 1 to 30, such as a methyl group, an ethyl group, a propyl group, a butyl group, a hexyl group, an octyl group, a decyl group, a dodecyl group, an ocdadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, a 3-nitrophenacyl group, or the like.

The optionally substituted aryl group is preferably an aryl group having a carbon number of 6 to 30, such as a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-tolyl group, an m-tolyl group, a p-tolyl group, a xylyl group, an o-dumenyl group, an m-cumenyl group, a p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluorantenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, or the like.

The optionally substituted alkenyl group is preferably an alkenyl group having a carbon number of 2 to 10, such as a vinyl group, an allyl group, a styryl group, or the like.

The optionally substituted alkynyl group is preferably an alkynyl group having a carbon number of 2 to 10, such as an ethynyl group, a propynyl group, a propargyl group, or the like.

The optionally substituted alkylsulfinyl group is preferably an alkylsulfinyl group having a carbon number of 1 to 20, such as a methylsulfinyl group, an ethylsulfinyl group, a propylsulfinyl group, an isopropylsulfinyl group, a butylsulfinyl group, a hexylsulfinyl group, a cyclohexylsulfinyl group, an octylsulfinyl group, a 2-ethylhexylsulfinyl group, a decanoylsulfinyl group, a dodecanoylsulfinyl group, an octadecanoylsulfinyl group, a cyanomethylsulfinyl group, a methoxymethylsulfinyl group, or the like.

The optionally substituted arylsulfinyl group is preferably an arylsulfinyl group having a carbon number of 6 to 30, such as a phenylsulfinyl group, a 1-naphthylsulfinyl group, a 2-naphthylsulfinyl group, a 2-chlorophenylsulfinyl group, a 2-methylphenylsulfinyl group, a 2-methoxyphenylsulfinyl group, a 2-butoxyphenylsulfinyl group, a 3-chlorophenylsulfinyl group, a 3-trifluoromethylphenylsulfinyl group, a 3-cyanophenylsulfinyl group, a 3-nitrophenylsulfinyl group, a 4-fluorophenylsulfinyl group, a 4-cyanophenylsulfinyl group, a 4-methoxyphenylsulfinyl group, a 4-methylsulfanylphenylsulfinyl group, a 4-phenylsulfanylphenylsulfinyl group, a 4-dimethylaminophenylsulfinyl group, or the like.

The optionally substituted alkylsulfonyl group is preferably an alkylsulfonyl group havign a carbon number of 1 to 20, such as a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanoylsulfonyl group, a dodecanoylsulfonyl group, an octadecanoylsulfonyl group, a cyanomethylsulfonyl group, a methoxymethylsulfonyl group, a perfluoroalkylsulfonyl group, or the like.

The optionally substituted arylsulfonyl group is preferably an arylsulfonyl group having a carbon number of 6 to 30, such as a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, a 4-dimethylaminophenylsulfonyl group, or the like.

The optionally substituted acyl group is preferably an acyl group having a carbon number of 2 to 20, such as an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, a 4-methoxybenzoyl group, or the like.

The optionally substituted alkoxycarbonyl group is preferably an alkoxycarbonyl group having a carbon number of 2 to 20, such as a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, a trifluoromethyloxycarbonyl group, or the like.

The optionally substituted aryloxycarbonyl group may be, for example, a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, a 4-methoxyphenyloxycarbonyl group, or the like.

The optionally substituted phosphinoyl group is preferably a phosphinoyl group having a carbon number of 2 to 50, such as a dimethylphosphinoyl group, a diethylphosphinoyl group, a dipropylphosphinoyl group, a diphenylphosphinoyl group, a dimethoxyphosphinoyl group, a diethoxyphosphinoyl group, a dibenzoylphosphinoyl group, a bis(2,4,6-trimethylphenyl)phosphinoyl group, or the like.

The optionally substituted heterocyclic group is preferably an aromatic or aliphatic heterocyclic group including a nitrogen atom, an oxygen atom, a sulfur atom or a phosphorus atom, such as a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalnilyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, a thioxantolyl group, or the like.

The optionally substituted alkylthiocarbonyl group may be, for example, a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, a trifluoromethylthiocarbonyl group, or the like.

The optionally substituted arylthiocarbonyl group may be a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, a 4-methoxyphenylthiocarbonyl group, or the like.

The optionally substituted dialkylaminocarbonyl group may be a dimethylaminocarbonyl group, a diethylaminocarbonyl group, a dipropylaminocarbonyl group, a dibutylaminocarbonyl group, or the like.

The optionally substituted dialkylaminothiocarbonyl group may be a dimethylaminothiocarbonyl group, a dipropylaminothiocarbonyl group, a dibutylaminothiocarbonyl group, or the like.

Among the above, R is more preferably an acyl group, specifically an acetyl group, an ethyloyl group, a propioyl group, a benzoyl group or a tolyl group, from the point of enhancing sensitivity.

The monovalent substituent represented by B may be an optionally substituted aryl group, an optionally substituted heterocyclic group, an optionally substituted arylcarbonyl group, or an optionally substituted heterocyclic carbonyl group. Among these, the monovalent substituent represented by B is particularly preferably the structures as shown below.

In the structures below, Y, X and n are defined in the same manner as Y, X and n in Formula (2) described later, respectively, and preferable examples thereof are also the same as those of Formula (2).

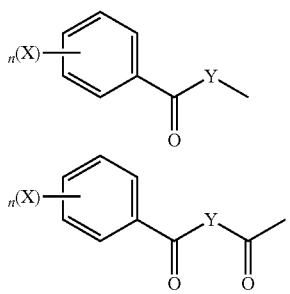

The bivalent organic group represented by A may be an optionally substituted alkylene group having a carbon number of 1 to 12, an optionally substituted cyclohexylene group, an optionally substituted alkynylene group, or the like.

Examples of a substituent that may be introduced into such groups include a halogen group such as a fluorine atom, a chlorine atom, a bromine atom and an iodine atom, an alkoxy group such as a methoxy group, an ethoxy group and a tert-butoxy group, an aryloxy group such as a phenoxy group and a p-tolyloxy group, an alkoxycarbonyl group such as a methoxycarbonyl group, a butoxycarbonyl group and a phenoxycarbonyl group, an acyloxy group such as an acetoxy group, a propionyloxy group and a benzoyloxy group, an acyl group such as an acetyl group, a benzoyl group, an isobutyryl group, an acryloyl group, a methacryloyl group and a methoxalyl group, an alkylsulfanyl group such as a methylsulfanyl group and a tert-butylsulfanyl group, an arylsulfanyl group such as a phenylsulfanyl group and a p-tolylsulfanyl group, an alkylamino group such as a methylamino group and a cyclohexylamino group, a dialkylamino group such as a dimethylamino group, a diethylamino group, a morpholino group and a piperidino group, an arylamino group such as a phenylamino group and a p-tolylamino group, an alkyl group such as a methyl group, an ethyl group, a tert-butyl group and a dodecyl group, an aryl group such as a phenyl group, a p-tolyl group, a xylyl group, a cumenyl group, a naphthyl group, an anthryl group and a phenanthryl group and in addition, a hydroxy group, a carboxy group, a formyl group, a mercapto group, a sulfo group, a mesyl group, a p-toluenesulfonyl group, an amino group, a nitro group, a cyano group, a trifluoromethyl group, a trichloromethyl group, a trimethylsilyl group, a phosphinico group, a phosphono group, a trimethyl ammoniumyl group, a dimethylsulfoniumyl group, a triphenylphenacylphosphoniumyl group, and the like.

Among them, A is preferably a non-substituted alkylene group, an alkylene group substituted by an alkyl group (such as a methyl group, an ethyl group, a tert-butyl group or a dodecyl group), an alkylene group substituted by an alkenyl group (such as a vinyl group or an allyl group), an alkylene group substituted by an aryl group (such as a phenyl group, a p-tolyl group, a xylyl group, a cumenyl group, a naphthyl group, an anthryl group, a phenanthryl group or a styryl group) from the viewpoint of enhancing sensitivity and suppressing coloration caused by heating or aging.

The aryl group represented by Ar is preferably an aryl group having a carbon number of 6 to 30, which may have a substituent.

Specific examples of the aryl group include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-tolyl group, an m-tolyl, a p-tolyl group, a xylyl group, an o-cumenyl group, an m-cumenyl group, a p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluorantenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group. Among these, the aryl group is preferably a substituted or non-substituted phenyl group from the viewpoint of enhancing sensitivity and suppressing coloration caused by heating or aging.

When the aforementioned phenyl group has a substituent, examples of the substituent include a halogen group such as a fluorine atom, a chlorine atom, a bromine atom and an iodine atom, an alkoxy group such as a methoxy group, an ethoxy group and a tert-butoxy group, an aryloxy group such as a phenoxy group and a p-tolyloxy group, an alkylthioxy group such as a methylthioxy group, an ethylthioxy group and a tert-butylthioxy group, an arylthiooxy group such as a phenylthioxy group and a p-tolylthioxy group, an alkoxycarbonyl group such as a methoxycarbonyl group, a butoxycarbonyl group and a phenoxycarbonyl group, an acyloxy group such as an acetoxy group, a propionyloxy group and a benzoyloxy group, an acyl group such as an acetyl group, a benzoyl group, an isobutyryl group, an acryloyl group, a methacryloyl group and a methoxalyl group, an alkylsulfanyl group such as a methylsulfanyl group and a tert-butylsulfanyl group, an arylsulfanyl group such as a phenylsulfanyl group and a p-tolylsulfanyl group, an alkylamino group such as a methylamino group and a cyclohexylamino group, a dialkylamino group such as a dimethylamino group, a diethylamino group, a morpholino group and a piperidino group, an arylamino group such as a phenylamino group and a p-tolylamino group, an alkyl group such as an ethyl group, a tert-butyl group and a dodecyl group, a hydroxyl group, a carboxyl group, a formyl group, a mercapto group, a sulfo group, a mesyl group, a p-toluenesulfonyl group, an amino group, a nitro group, a cyano group, a trifluoromethyl group, a trichloromethyl group, a trimethylsilyl group, a phosphinico group, a phosphono group, a trimethyl ammoniumyl group, a dimethylsulfoniumyl group, and a triphenylphenacylphosphoniumyl group.

The structure "SAr" formed by Ar and S in Formula (1) is preferably the structures as shown below from the view point of sensitivity.

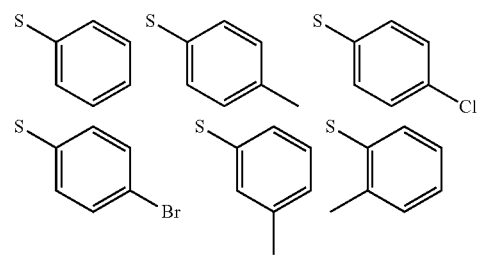

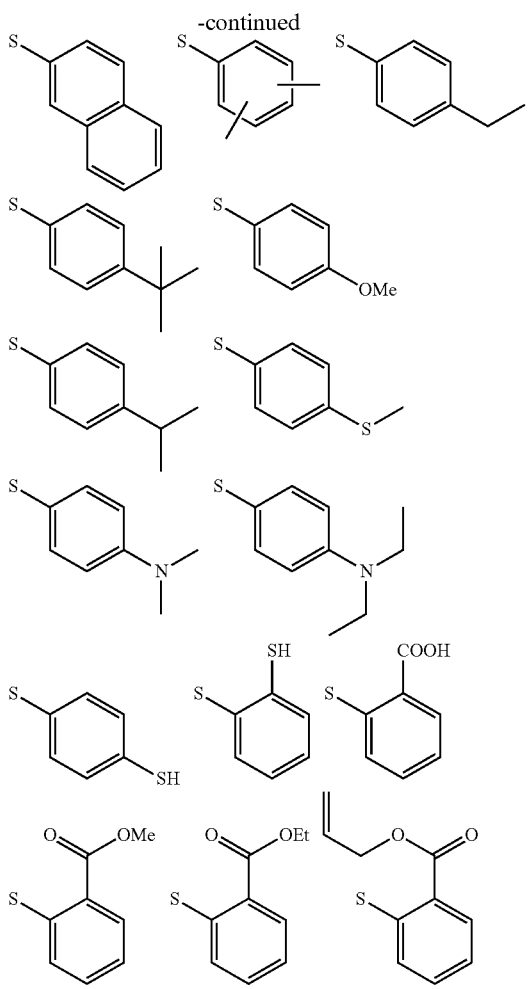

The novel oxime compound in the present exemplary embodiment is preferably a compound represented by Formula (2) below.

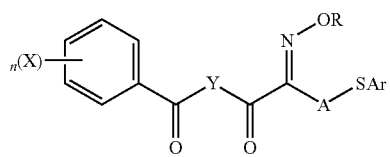

In Formula (2), R and X each independently represent a monovalent substituent, A and Y each independently represent a bivalent organic group, Ar represents an aryl group, and N is an integer of 0 to 5.

R, A and Ar in Formula (2) are defined in the same manner as R, A and Ar, respectively in Formula (1), and preferable examples thereof are also the same as those of Formula (1).

Examples of the monovalent substituent represented by X include an optionally substituted alkyl group, an optionally substituted aryl group, an optionally substituted alkenyl group, an optionally substituted alkynyl group, an optionally substituted alkoxy group, an optionally substituted aryloxy group, an optionally substituted alkylthioxy group, an optionally substituted arylthioxy group, an optionally substituted acyloxy group, an optionally substituted alkylsulfanyl group, an optionally substituted arylsulfanyl group, an optionally substituted alkylsulfinyl group, an optionally substituted arylsulfinyl group, an optionally substituted alkylsulfonyl group, an optionally substituted arylsulfonyl group, an optionally substituted acyl group, an optionally substituted alkoxycarbonyl group, an optionally substituted carbamoyl group, an optionally substituted sulfamoyl group, an optionally substituted amino group, an optionally substituted phosphinoyl group, an optionally substituted heterocyclic group, and a halogen group.

The optionally substituted alkyl group is preferably an alkyl group having a carbon number of 1 to 30, such as a methyl group, an ethyl group, a propyl group, a butyl group, a hexyl group, an octyl group, a decyl group, a dodecyl group, an ocdadecyl group, an isopropyl group, an isobutyl group, a sec-butyl group, a tert-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, 4-methylphenacyl group, a 2-methylphenacyl group, a 3-fluorophenacyl group, a 3-trifluoromethylphenacyl group, a 3-nitrophenacyl group, or the like.

The optionally substituted aryl group is preferably an aryl group having a carbon number of 6 to 30, such as a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-tolyl group, an m-tolyl group, a p-tolyl group, a xylyl group, an o-cumenyl group, an m-cumenyl group, a p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluorantenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, or the like.

The optionally substituted alkenyl group is preferably an alkenyl group having a carbon number of 2 to 10, such as a vinyl group, an allyl group, a styryl group, or the like.

The optionally substituted alkynyl group is preferably an alkynyl group having a carbon number of 2 to 10, such as an ethynyl group, a propynyl group, a propargyl group, or the like.

The optionally substituted alkoxy group is preferably an alkoxy group having a carbon number of 1 to 30, such as a methoxy group, an ethoxy group, a propyloxy group, an isopropyloxy group, a butoxy group, an isobutoxy group, a sec-butoxy group, a tert-butoxy group, a pentyloxy group, an isopentyloxy group, a hexyloxy group, a heptyloxy group, an octyloxy group, a 2-ethylhexyloxy group, a decyloxy group, a dodecyloxy group, an octadecyloxy group, an ethoxycarbonylmethyl group, a 2-ethylhexyloxycarbonylmethyloxy group, an aminocarbonylmethyloxy group, an N,N-dibutylaminocarbonylmethyloxy group, an N-methylaminocarbonylmethyloxy group, an N-ethylaminocarbonylmethyloxy group, an N-octylaminocarbonylmethyloxy group, an N-methyl-N-benzyl aminocarbonylmethyloxy group, a benzyloxy group, a cyanomethyloxy group, or the like.

The optionally substituted aryloxy group is preferably an aryloxy group having a carbon number of 6 to 30, such as a phenyloxy group, a 1-naphthyloxy group, a 2-naphthyloxy group, a 2-chlorophenyloxy group, a 2-methylphenyloxy group, a 2-methoxyphenyloxy group, a 2-butoxyphenyloxy group, a 3-chlorophenyloxy group, a 3-trifluoromethylphenyloxy group, a 3-cyanophenyloxy group, a 3-nitrophenyloxy group, a 4-fluorophenyloxy group, a 4-cyanophenyloxy group, a 4-methoxyphenyloxy group, a 4-dimethylaminophenyloxy group, a 4-methylsulfanylphenyloxy group, a 4-phenylsulfanylphenyloxy group, or the like.

The optionally substituted alkylthioxy group is preferably a thioalkoxy group having a carbon number of 1 to 30, such as a methylthioxy group, an ethylthioxy group, a propylthioxy group, an isopropylthioxy group, a butylthioxy group, an isobutylthioxy group, a sec-butylthioxy group, a tert-butylthioxy group, a pentylthioxy group, an isopentylthioxy group, a hexylthioxy group, a heptylthioxy group, an octylthioxy group, a 2-ethylhexylthioxy group, a decylthioxy group, a dodecylthioxy group, an octadecylthioxy group, a benzylthioxy group, or the like.

The optionally substituted arylthioxy group is preferably an arylthioxy group having a carbon number of 6 to 30, such as a phenylthioxy group, a 1-naphthylthioxy group, a 2-naphthylthioxy group, a 2-chlorophenylthioxy group, a 2-methylphenylthioxy group, a 2-methoxyphenylthioxy group, a 2-butoxyphenylthioxy group, a 3-chlorophenylthioxy group, a 3-trifluoromethylphenylthioxy group, a 3-cyanophenylthioxy group, a 3-nitrophenylthioxy group, a 4-fluorophenylthioxy group, a 4-cyanophenylthioxy group, a 4-methoxyphenylthioxy group, a 4-dimethylaminophenylthioxy group, a 4-methylsulfanylphenylthioxy group, a 4-phenylsulfanylphenylthioxy group, or the like.

The optionally substituted acyloxy group is preferably an acyloxy group having a carbon number of 2 to 20, such as an acetyloxy group, a propanoyloxy group, a butanoyloxy group, a pentanoyloxy group, a trifluoromethylcarbonyloxy group, a benzoyloxy group, a 1-naphthylcarbonyloxy group, a 2-naphthylcarbonyloxy group, or the like.

The optionally substituted alkylsulfanyl group is preferably an alkylsulfanyl group having a carbon number of 1 to 20, such as a methylsulfanyl group, an ethylsulfanyl group, a propylsulfanyl group, an isopropylsulfanyl group, a butylsulfanyl group, a hexylsulfanyl group, a cyclohexylsulfanyl group, an octylsulfanyl group, a 2-ethylhexylsulfanyl group, a decanoylsulfanyl group, a dodecanoylsulfanyl group, an octadecanoylsulfanyl group, a cyanomethylsulfanyl group, a methoxymethylsulfanyl group, or the like.

The optionally substituted arylsulfanyl group is preferably an arylsulfanyl group having a carbon number of 6 to 30, such as a phenylsulfanyl group, a 1-naphthylsulfanyl group, a 2-naphthylsulfanyl group, a 2-chlorophenylsulfanyl group, a 2-methylphenylsulfanyl group, a 2-methoxyphenylsulfanyl group, a 2-butoxyphenylsulfanyl group, a 3-chlorophenylsulfanyl group, a 3-trifluoromethylphenylsulfanyl group, a 3-cyanophenylsulfanyl group, a 3-nitrophenylsulfanyl group, a 4-fluorophenylsulfanyl group, a 4-cyanophenylsulfanyl group, a 4-methoxyphenylsulfanyl group, a 4-methylsulfanylphenylsulfanyl group, a 4-phenylsulfanylphenylsulfanyl group, a 4-dimethylaminophenylsulfanyl group, or the like.

The optionally substituted alkylsulfinyl group is preferably an alkylsulfinyl group having a carbon number of 1 to 20, such as a methylsulfinyl group, an ethylsulfinyl group, a propylsulfinyl group, an isopropylsulfinyl group, a butylsulfinyl group, a hexylsulfinyl group, a cyclohexylsulfinyl group, an octylsulfinyl group, a 2-ethylhexylsulfinyl group, a decanoylsulfinyl group, a dodecanoylsulfinyl group, an octadecanoylsulfinyl group, a cyanomethylsulfinyl group, a methoxymethylsulfinyl group, or the like.

The optionally substituted arylsulfinyl group is preferably an arylsulfinyl group having a carbon number of 6 to 30, such as a phenylsulfinyl group, a 1-naphthylsulfinyl group, a 2-naphthylsulfinyl group, a 2-chlorophenylsulfinyl group, a 2-methylphenylsulfinyl group, a 2-methoxyphenylsulfinyl group, a 2-butoxyphenylsulfinyl group, a 3-chlorophenylsulfinyl group, a 3-trifluoromethylphenylsulfinyl group, a 3-cyanophenylsulfinyl group, a 3-nitrophenylsulfinyl group, a 4-fluorophenylsulfinyl group, a 4-cyanophenylsulfinyl group, a 4-methoxyphenylsulfinyl group, a 4-methylsulfanylphenylsulfinyl group, a 4-phenylsulfanylphenylsulfinyl group, a 4-dimethylaminophenylsulfinyl group, or the like.

The optionally substituted alkylsulfonyl group is preferably an alkylsulfonyl group having a carbon number of 1 to 20, such as a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanoylsulfonyl group, a dodecanoylsulfonyl group, an octadecanoylsulfonyl group, a cyanomethylsulfonyl group, a methoxymethylsulfonyl group, or the like.

The optionally substituted arylsulfonyl group is preferably an arylsulfonyl group having a carbon number of 6 to 30, such as a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, a 4-dimethylaminophenylsulfonyl group, or the like.

The optionally substituted acyl group is preferably an acyl group having a carbon number of 2 to 20, such as an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, a 4-methoxybenzoyl group, or the like.

The optionally substituted alkoxycarbonyl group is preferably an alkoxycarbonyl group having a carbon number of 2 to 20, such as a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, a phenoxycarbonyl group, a trifluoromethyloxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, a 4-methoxyphenyloxycarbonyl group, or the like.

The optionally substituted carbamoyl group is preferably a carbamoyl group having a carbon number of 1 to 30, such as an N-methylcarbamoyl group, an N-ethylcarbamoyl group, an N-propylcarbamoyl group, an N-butylcarbamoyl group, an N-hexylcarbamoyl group, an N-cyclohexylcarbamoyl group, an N-octylcarbamoyl group, an N-decylcarbamoyl group, an N-octadecylcarbamoyl group, an N-phenylcarbamoyl group, an N-2-methylphenylcarbamoyl group, an N-2-chlorophenylcarbamoyl group, an N-2-isopropoxyphenylcarbamoyl group, an N-2-(2-ethylhexyl)phenylcarbamoyl group, an N-3-chlorophenylcarbamoyl group, an N-3-nitrophenylcarbamoyl group, an N-3-cyanophenylcarbamoyl group, an N-4-methoxyphenylcarbamoyl group, an N-4-cyanophenylcarbamoyl group, an N-4-methylsulfanylphenylcarbamoyl group, an N-4-phenylsulfanylphenylcarbamoyl group, an N-methyl-N-phenylcarbamoyl group, an N,N-dimethylcarbamoyl group, an N,N-butylcarbamoyl group, an N,N-diphenylcarbamoyl group, or the like.

The optionally substituted sulfamoyl group is preferably a sulfamoyl having a carbon number of 0 to 30, such as a sulfamoyl group, an N-alkylsulfamoyl group, an N-arylsulfamoyl group, an N,N-dialkylsulfamoyl group, an N,N-diarylsulfamoyl group, an N-alkyl-N-arylsulfamoyl group, or the like. More Specific examples of the optionally substituted sulfamoyl group include an N-methylsulfamoyl group, an N-ethylsulfamoyl group, an N-propylsulfamoyl group, an N-butylsulfamoyl group, an N-hexylsulfamoyl group, an N-cyclohexylsulfamoyl group, an N-octylsulfamoyl group, an N-2-ethylhexylsulfamoyl group, an N-decylsulfamoyl group, an N-octadecylsulfamoyl group, an N-phenylsulfamoyl group, an N-2-methylphenylsulfamoyl group, an N-2-chlorophenylsulfamoyl group, an N-2-methoxyphenylsulfamoyl group, an N-2-isopropoxyphenylsulfamoyl group, an N-3-chlorophenylsulfamoyl group, an N-3-nitrophenylsulfamoyl group, an N-3-cyanophenylsulfamoyl group, an N-4-methoxyphenylsulfamoyl group, an N-4-cyanophenylsulfamoyl group, an N-4-dimethylaminophenylsulfamoyl group, an N-4-methylsulfanylphenylsulfamoyl group, an N-4-phenylsulfanylphenylsulfamoyl group, an N-methyl-N-phenylsulfamoyl group, an N,N-dimethylsulfamoyl group, an N,N-dibutylsulfamoyl group, an N,N-diphenylsulfamoyl group, or the like.

The optionally substituted amino group is preferably an amino group having a carbon number of 0 to 50, such as —NH$_2$, an N-alkylamino group, an N-arylamino group, an N-acylamino group, an N-sulfonylamino group, an N,N-dialkylamino group, an N,N-diarylamino group, an N-alkyl-N-arylamino group, an N,N-disulfonylamino group or the like. More specific examples of the optionally substituted amino group include a N-methylamino group, an N-ethylamino group, an N-propylamino group, an N-isopropylamino group, an N-butylamino group, an N-tert-butylamino group, an N-hexylamino group, an N-cyclohexylamino group, an N-octylamino group, an N-2-ethylhexylamino group, an N-decylamino group, an N-octadecylamino group, an N-benzylamino group, an N-phenylamino group, an N-2-methylphenylamino group, an N-2-chlorophenylamino group, an N-2-methoxyphenylamino group, an N-2-isopropoxyphenylamino group, an N-2-(2-ethylhexyl)phenylamino group, an N-3-chlorophenylamino group, an N-3-nitrophenylamino group, an N-3-cyanophenylamino group, an N-3-trifluoromethylphenylamino group, an N-4-methoxyphenylamino group, an N-4-cyanophenylamino group, an N-4-trifluoromethylphenylamino group, an N-4-methylsulfanylphenylamino group, an N-4-phenylsulfanylphenylamino group, an N-4-dimethylaminophenylamino group, an N-methyl-N-phenylamino group, an N,N-dimethylamino group, an N,N-diethylamino group, an N,N-dibutylamino group, an N,N-diphenylamino group, an N,N-diacetylamino group, an N,N-dibenzylamino group, an N,N-(dibutylcarbonyl)amino group, an N,N-(dimethylsulfonyl)amino group, an N,N-(diethylsulfonyl)amino group, an N,N-(dibutylsulfonyl)amino group, an N,N-(diphenylsulfonyl)amino group, a morpholino group, a 3,5-dimethylmorpholino group, a carbazole group, or the like.

The optionally substituted phosphinoyl group is preferably a phosphinoyl group having a carbon number of 2 to 50, such as a dimethylphosphinoyl group, a diethylphosphinoyl group, a dipropylphosphinoyl group, a diphenylphosphinoyl group, a dimethoxyphosphinoyl group, a diethoxyphosphinoyl group, a dibenzylphosphinoyl group, a bis(2,4,6-trimethylphenyl)phosphinoyl group, or the like.

The optionally substituted heterocyclic group is preferably an aromatic or aliphatic heterocyclic group including a nitrogen atom, an oxygen atom, a sulfur atom or a phosphorus atom, such as a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalnilyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, a thioxantolyl group, or the like.

The halogen group may be a fluorine atom, a chlorine atom, a bromine atom, an iodine atom, or the like.

The above-described optionally substituted alkyl group, optionally substituted aryl group, optionally substituted alkenyl group, optionally substituted alkynyl group, optionally substituted alkoxy group, optionally substituted aryloxy group, optionally substituted alkylthioxy group, optionally substituted arylthioxy group, optionally substituted acyloxy group, optionally substituted alkylsulfanyl group, optionally substituted arylsulfanyl group, optionally substituted alkylsulfinyl group, optionally substituted arylsulfinyl group, optionally substituted alkylsulfonyl group, optionally substituted arylsulfonyl group, optionally substituted acyl group, optionally substituted alkoxycarbonyl group, optionally substituted carbamoyl group, optionally substituted sulfamoyl group, optionally substituted amino group, and optionally substituted heterocyclic group may be further substituted by a substituent.

Examples of the substituent include a halogen group such as a fluorine atom, a chlorine atom, a bromine atom and an iodine atom, an alkoxy group such as a methoxy group, an ethoxy group and a tert-butoxy group, an aryloxy group such as a phenoxy group and a p-tolyloxy group, an alkoxycarbonyl group such as a methoxycarbonyl group, a butoxycarbonyl group and a phenoxycarbonyl group, an acyloxy group such as an acetoxy group, a propionyloxy group and a benzoyloxy group, an acyl group such as an acetyl group, a benzoyl group, an isobutyryl group, an acryloyl group, a methacryloyl group and a methoxalyl group, an alkylsulfanyl group such as a methylsulfanyl group and a tert-butylsulfanyl group, an arylsulfanyl group such as a phenylsulfanyl group and a p-tolylsulfanyl group, an alkylamino group such as a methylamino group and a cyclohexylamino group, a dialkylamino group such as a dimethylamino group, a diethylamino group, a morpholino group and a piperidino group, an arylamino group such as a phenylamino group and a p-tolylamino group, an alkyl group such as an methyl group, an ethyl group, a tert-butyl group and a dodecyl group, an aryl group such as a phenyl group, a p-tolyl group, a xylyl group, a cumenyl group, a naphthyl group, an anthryl group and a phenanthryl group, a hydroxyl group, a carboxyl group, a formyl group, a mercapto group, a sulfo group, a mesyl group, a p-toluenesulfonyl group, an amino group, a nitro group, a cyano group, a trifluoromethyl group, a trichloromethyl group, a trimethylsilyl group, a phosphinico group, a phosphono group, a trimethyl ammoniumyl group, a dimethylsulfoniumyl group, a triphenylphenacylphosphoniumyl group, and the like.

Among these, X is preferably an optionally substituted alkyl group, an optionally substituted aryl group, an optionally substituted alkenyl group, an optionally substituted alkynyl group, an optionally substituted alkoxy group, an optionally substituted aryloxy group, an optionally substituted alkylthioxy group, an optionally substituted arylthioxy group, or an optionally substituted amino group, from the viewpoint of improving solubility to a solvent and absorption efficiency at a long wavelength region.

In addition, in Formula (2), n is an integer of 0 to 5, preferably an integer of 0 to 2.

The bivalent organic group represented by Y may have a structure shown in below. In the structures shown below, "*" represents a position at which Y is bonded to an adjacent carbon atom in Formula (2).

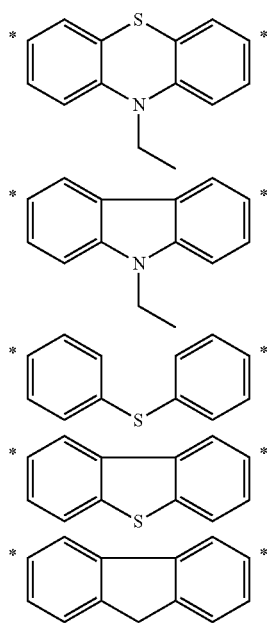

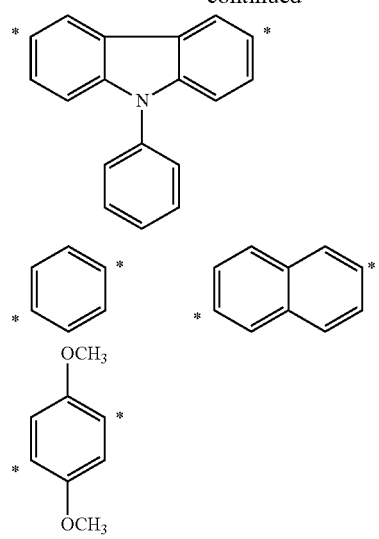

Among these, the structure is preferably the following structures from the viewpoint of sensitivity.

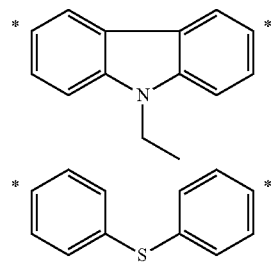

The novel oxime compound in the present exemplary embodiment is preferably a compound represented by Formula (3) below.

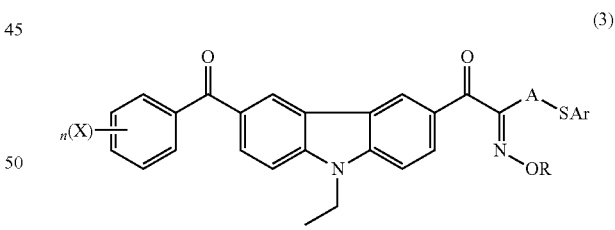

(3)

In Formula (3), R and X each independently represent a monovalent substituent, A represents a bivalent organic group, Ar represents an aryl group, and n is an integer of 0 to 5.

R, X, A, Ar, and n in Formula (3) are defined in the same manner as R, X, A, Ar and n in Formula (2), respectively, and preferable examples thereof are also the same as those of Formula (2).

Specific examples of the novel oxime compound in the present exemplary embodiment will be shown in below. However, the present exemplary embodiment is not limited thereto.

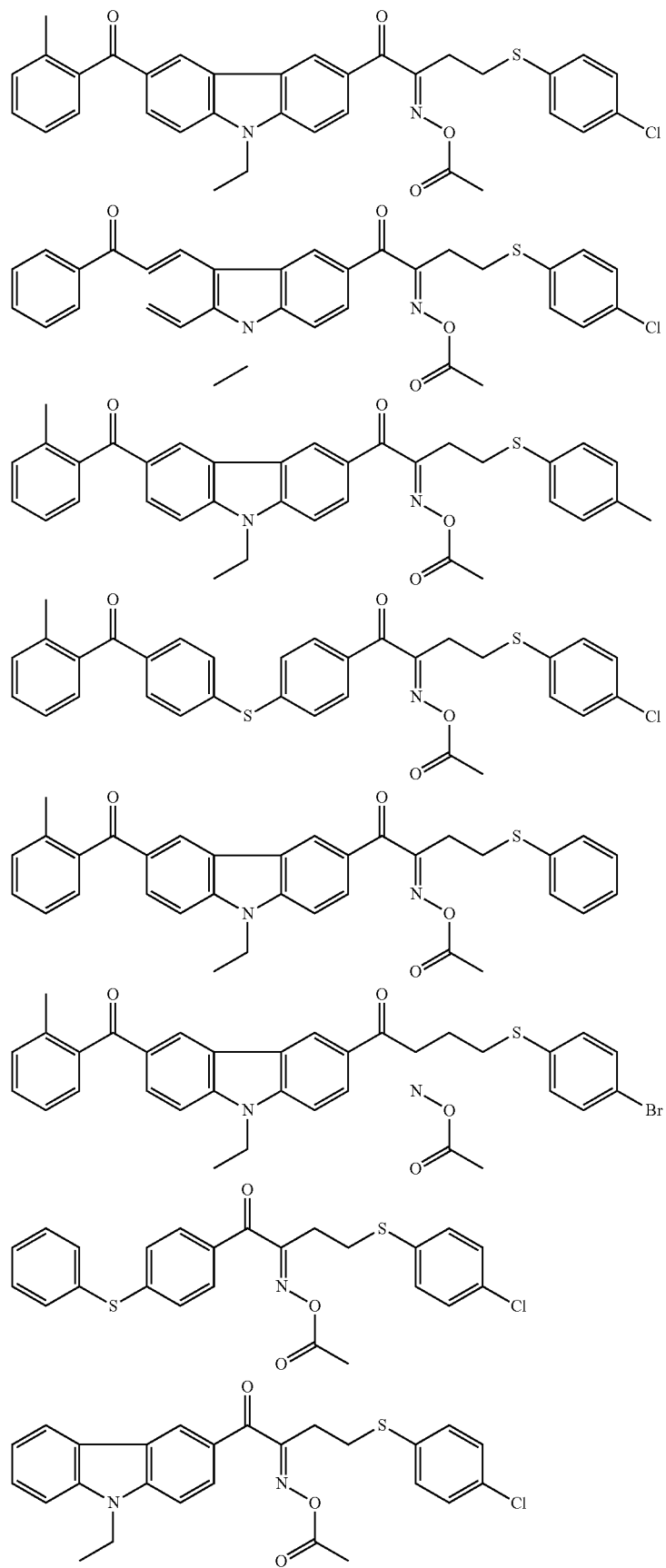

-continued
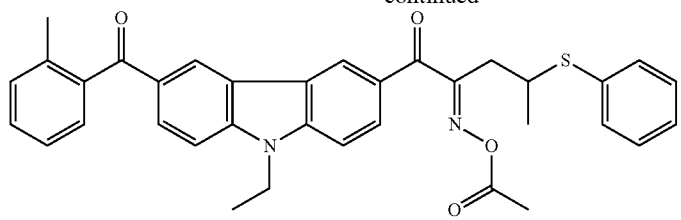
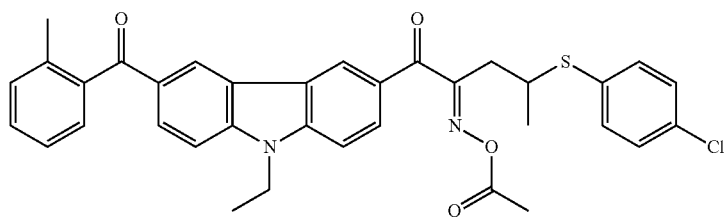
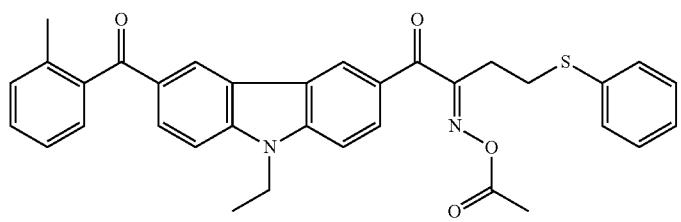
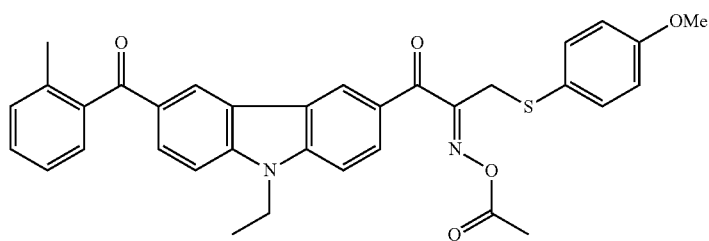
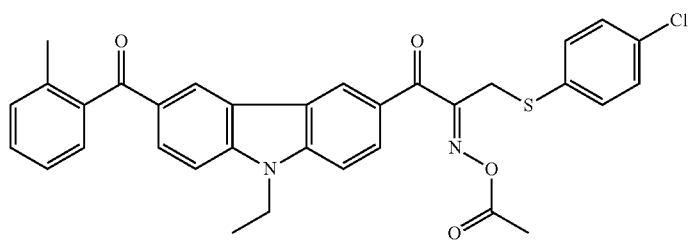
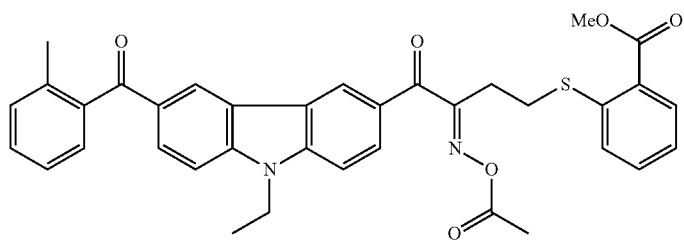
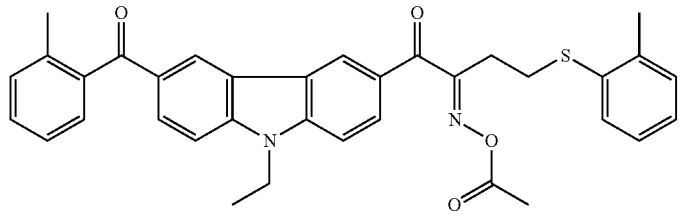

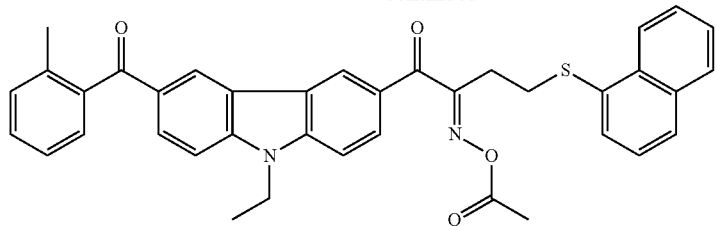
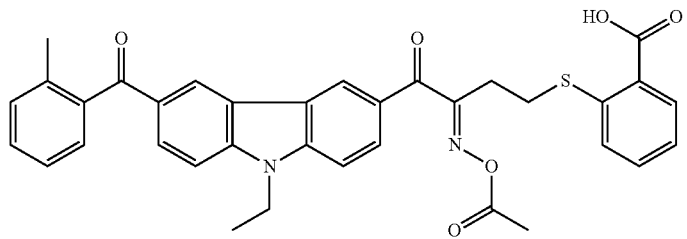
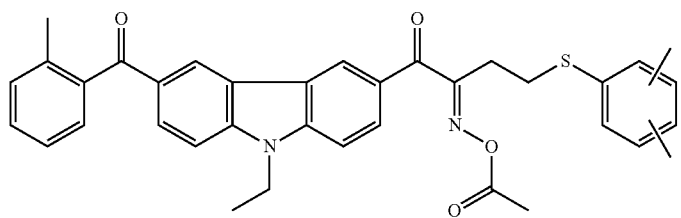
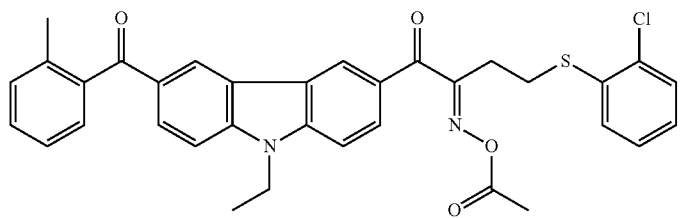
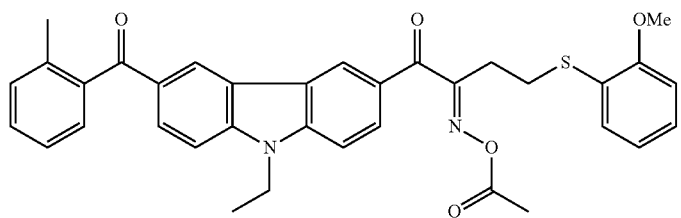
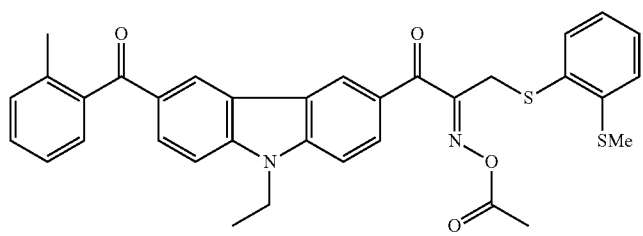
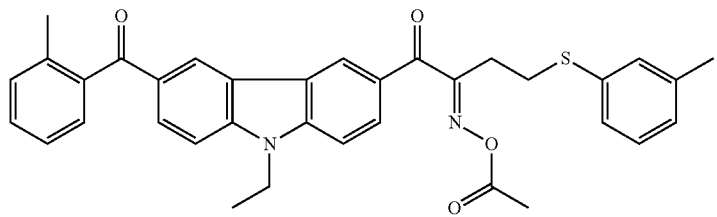

-continued
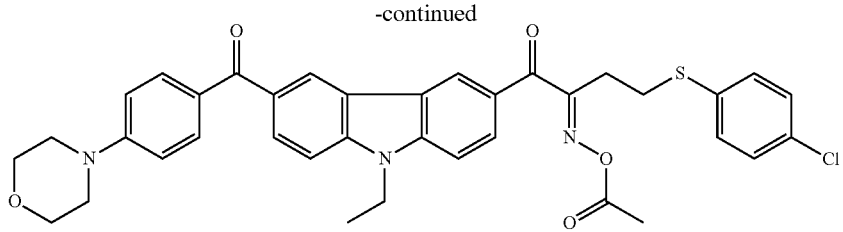
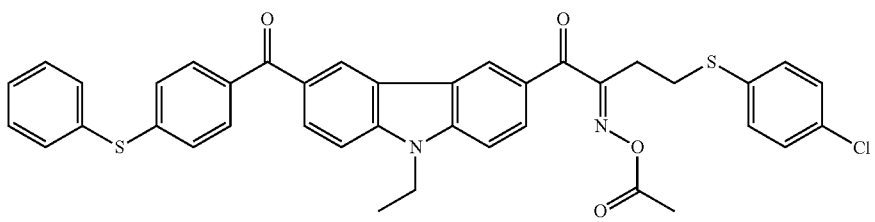
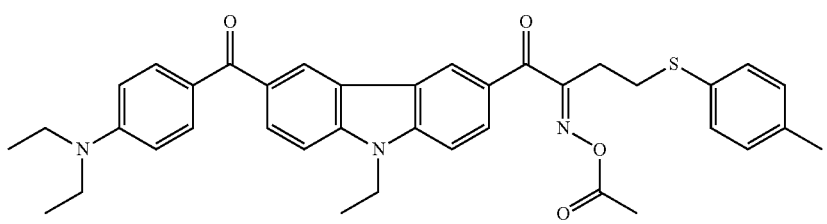
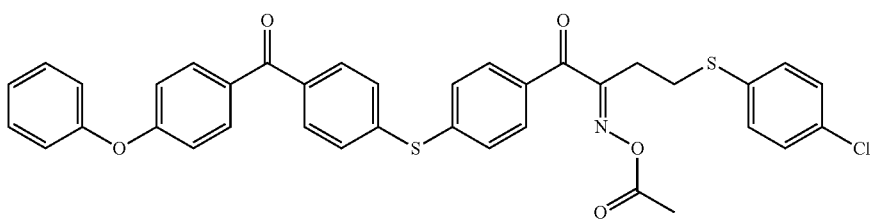
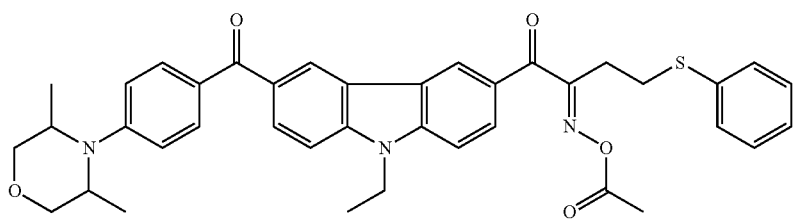
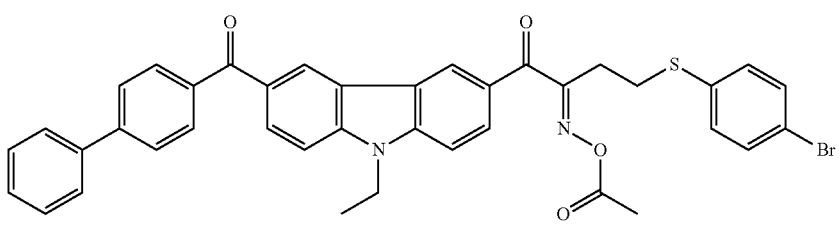
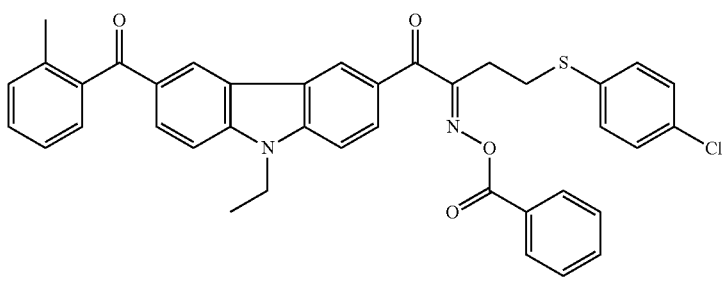

-continued
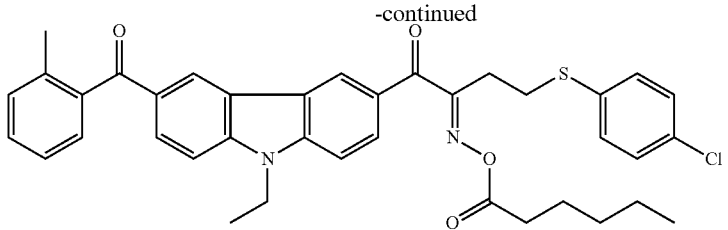
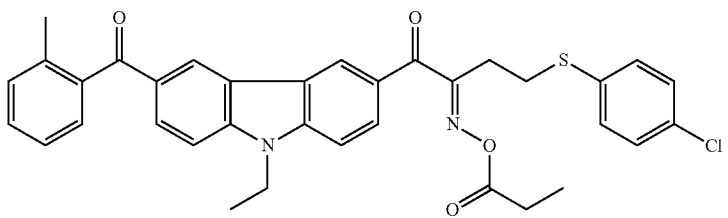
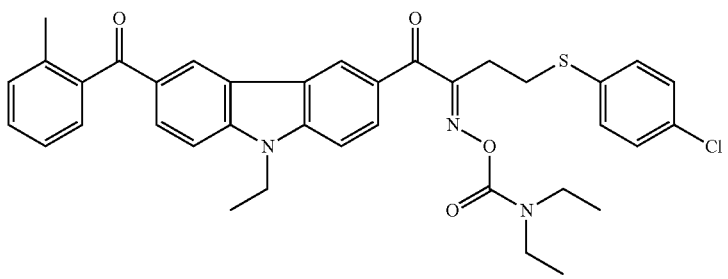
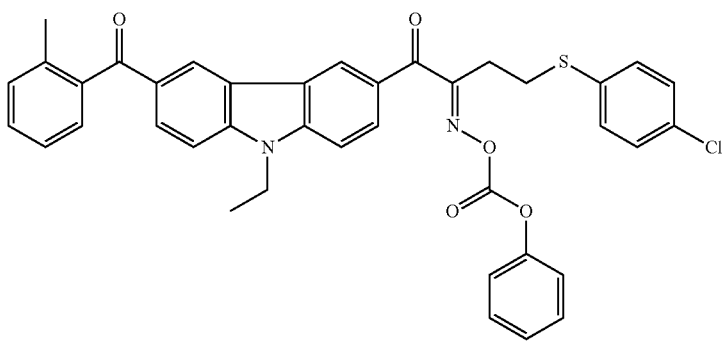
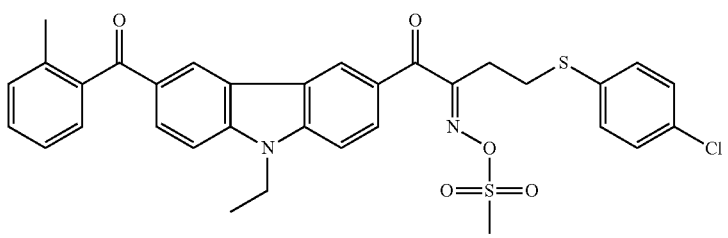
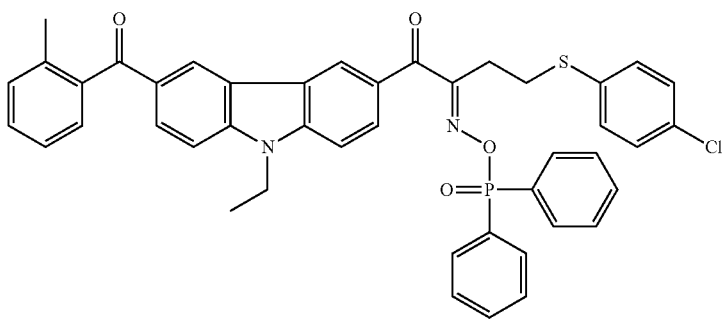

-continued
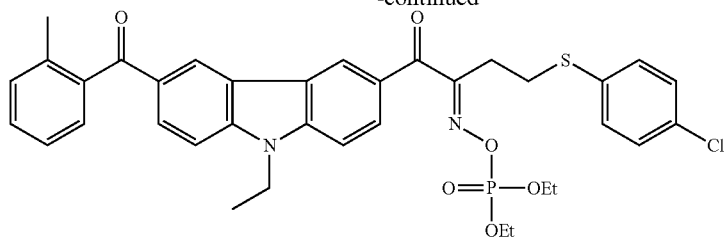
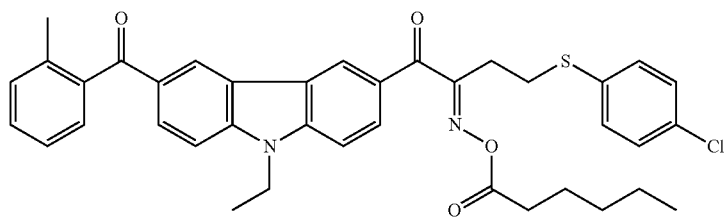
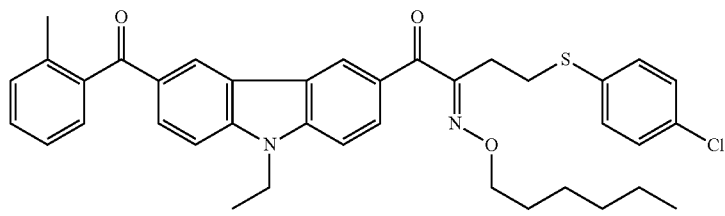
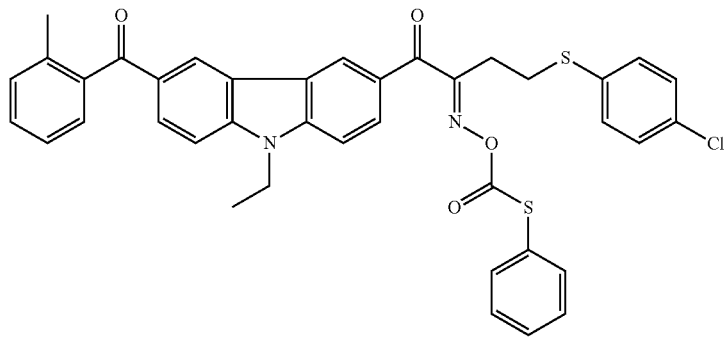
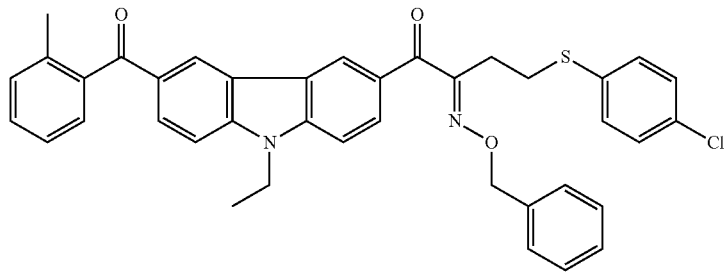
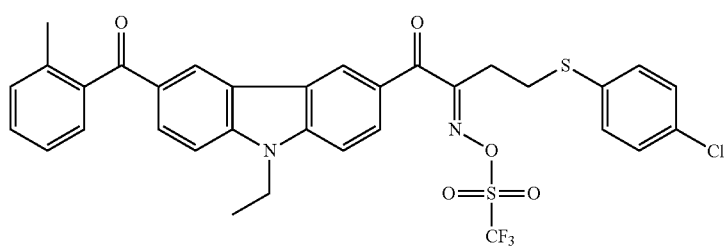

-continued
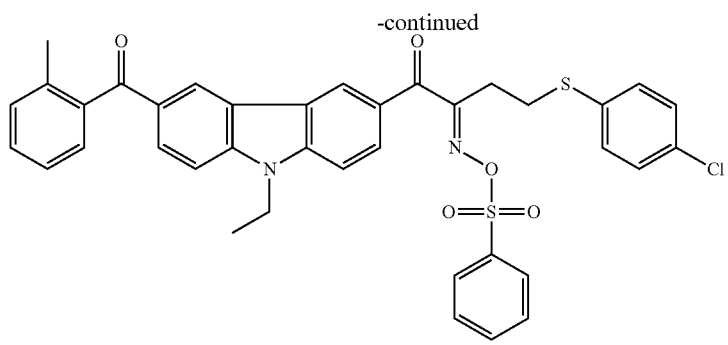
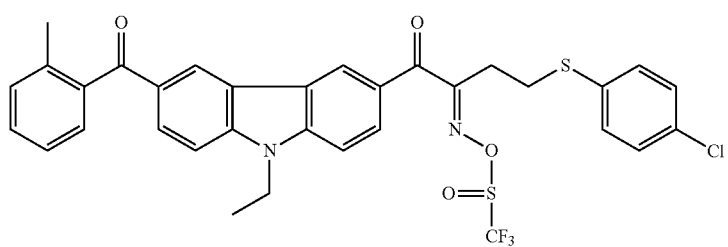
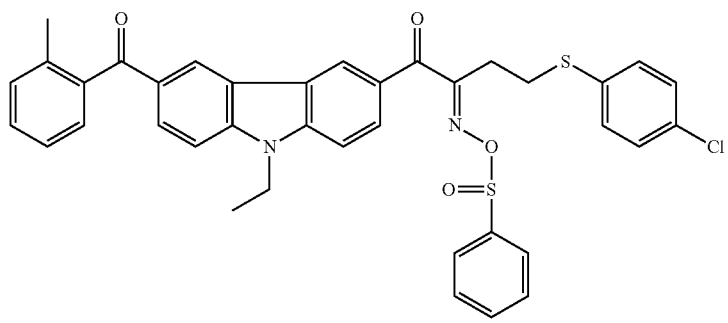
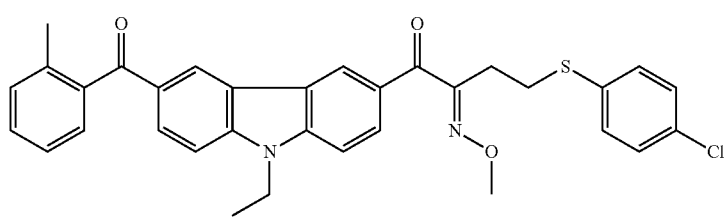
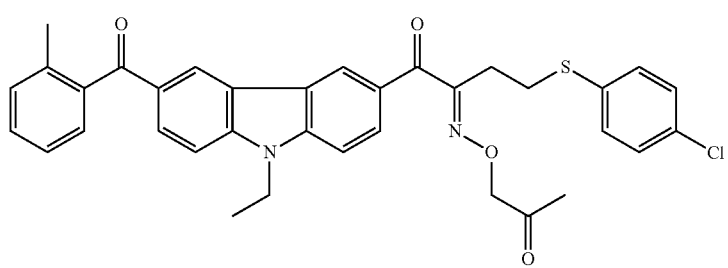
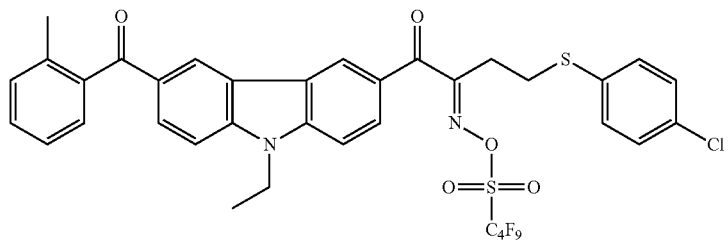

-continued
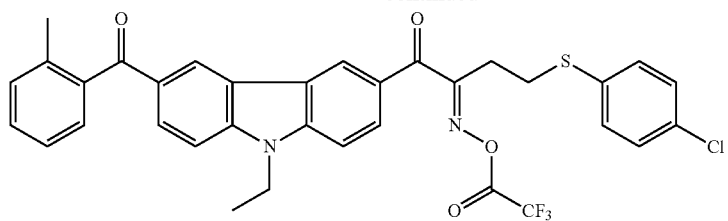
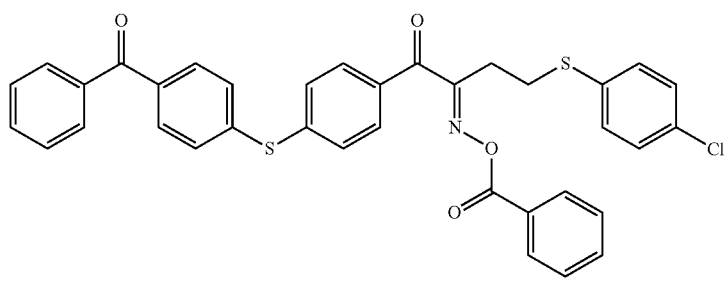
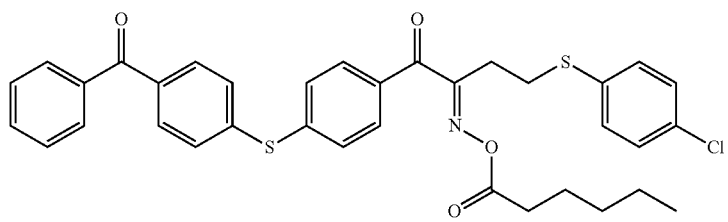
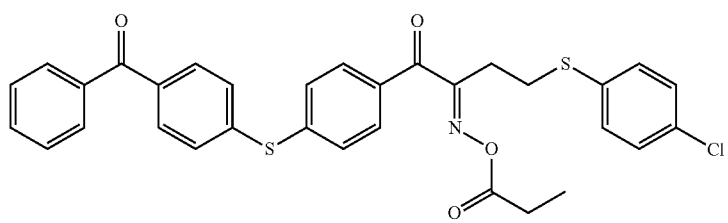
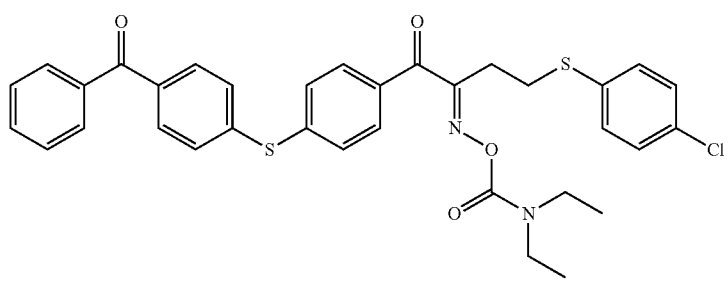
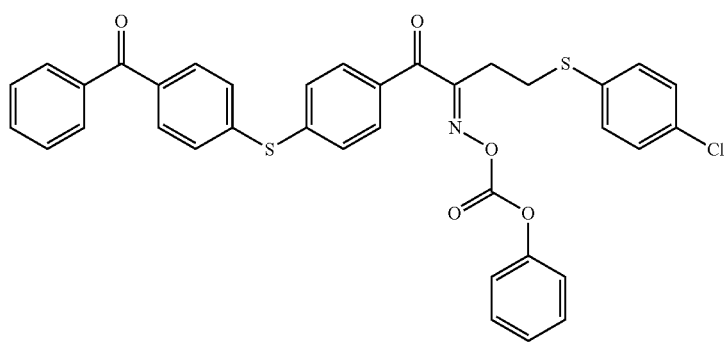

-continued
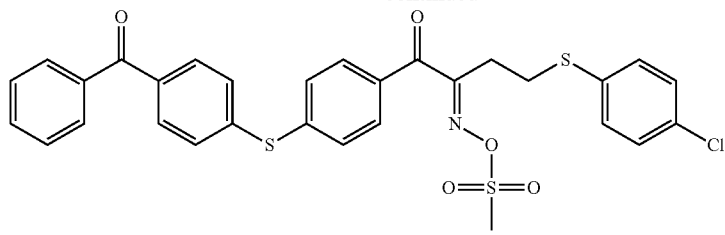
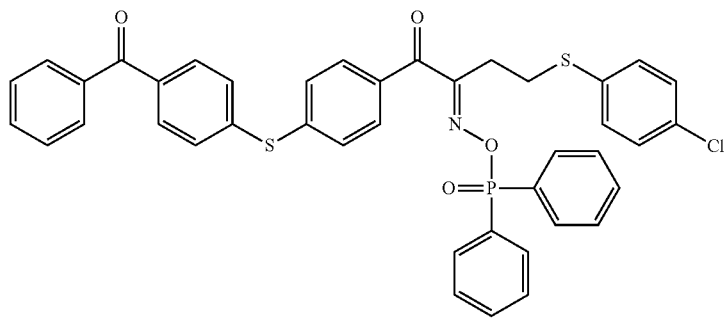
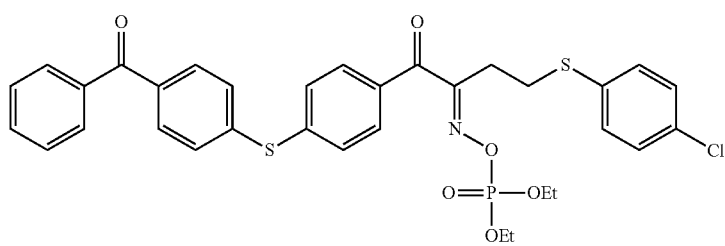
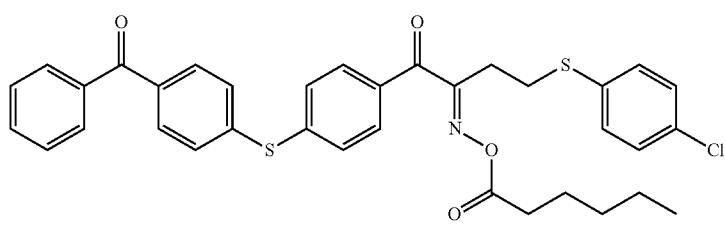
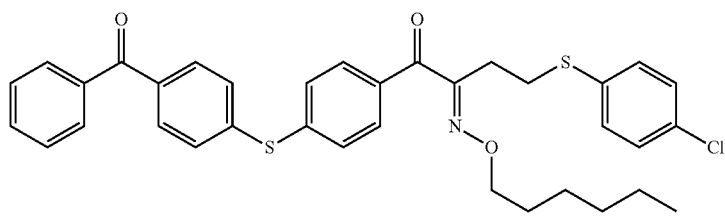
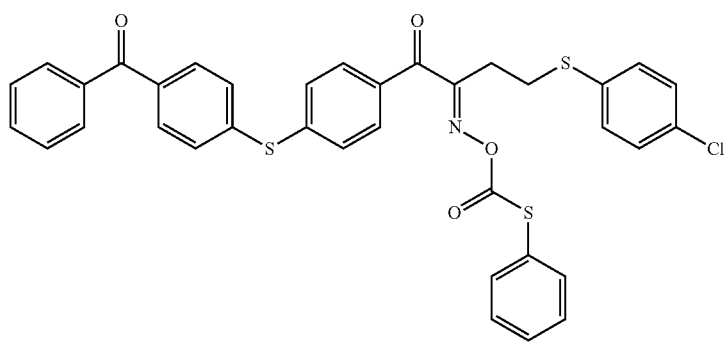

-continued
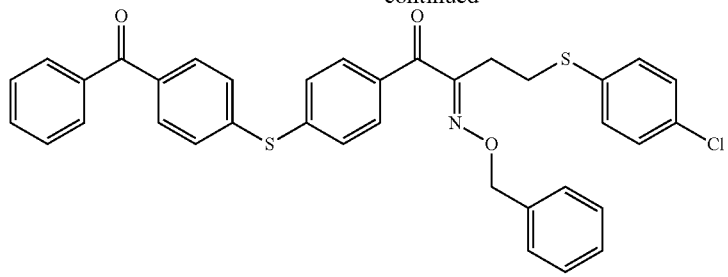
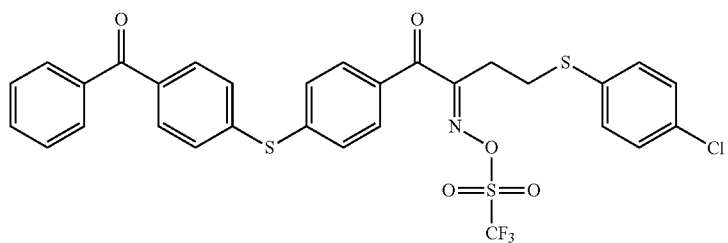
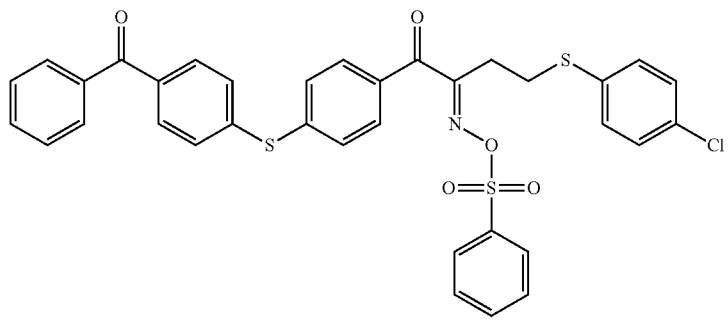
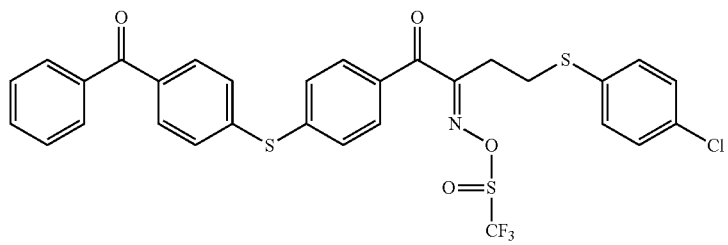
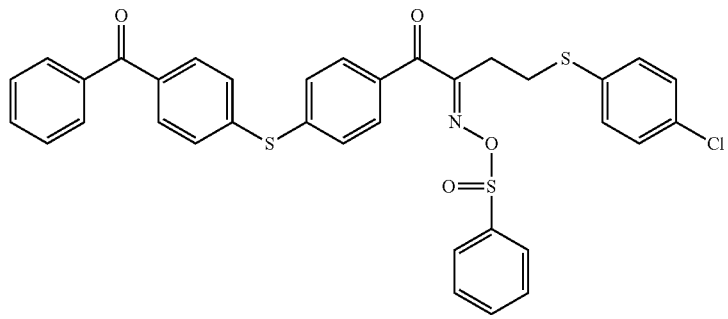
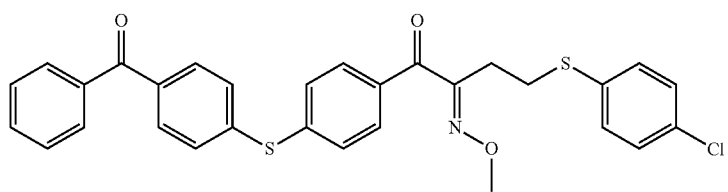

-continued
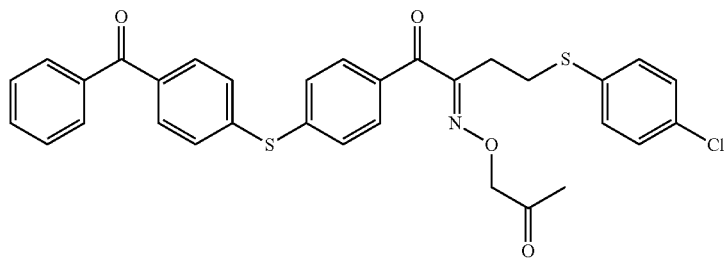
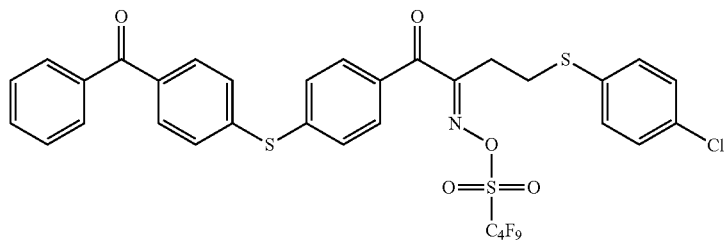
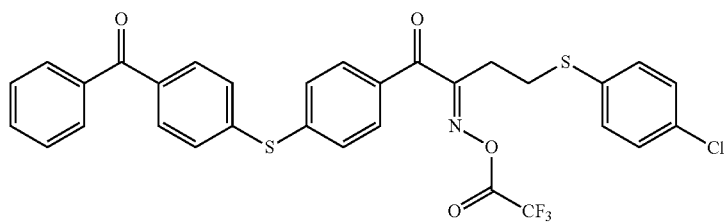
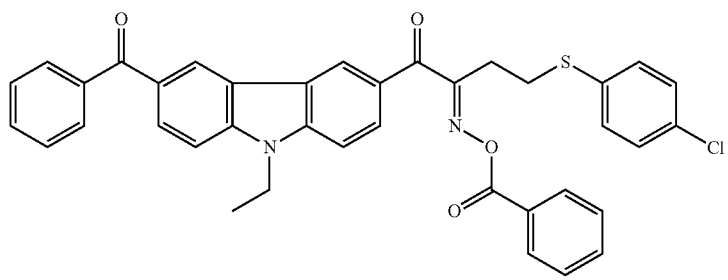
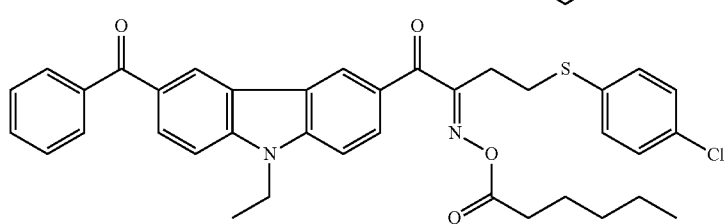
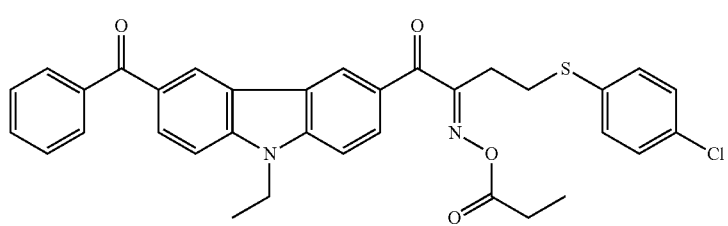
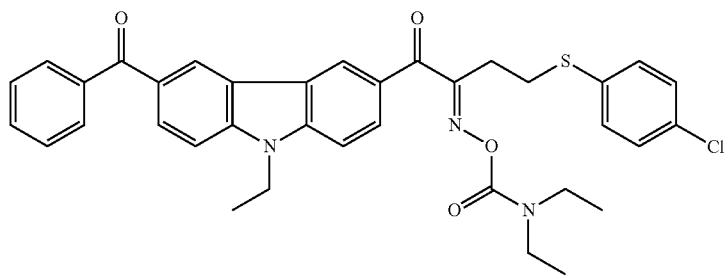

-continued
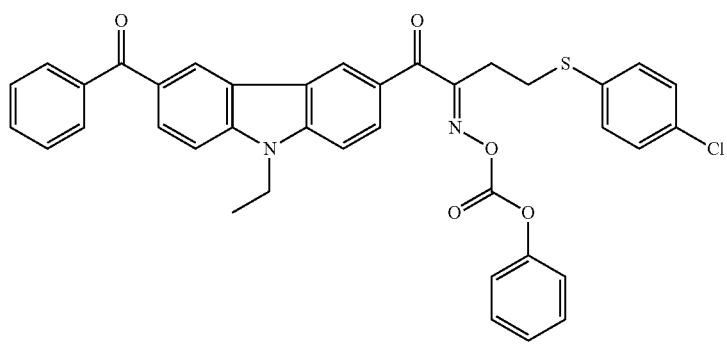
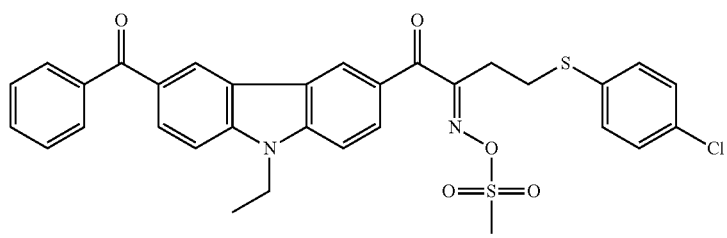
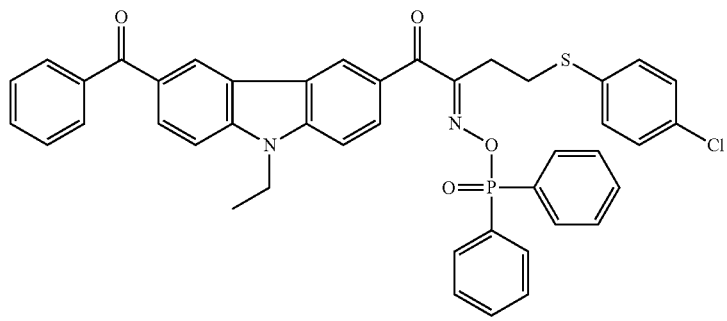
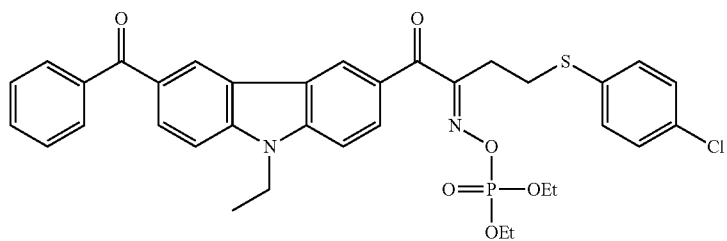
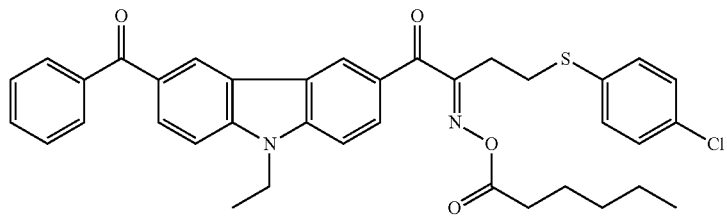
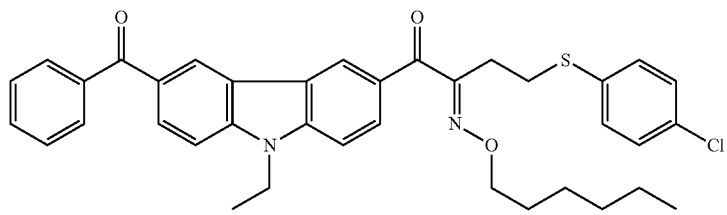

-continued
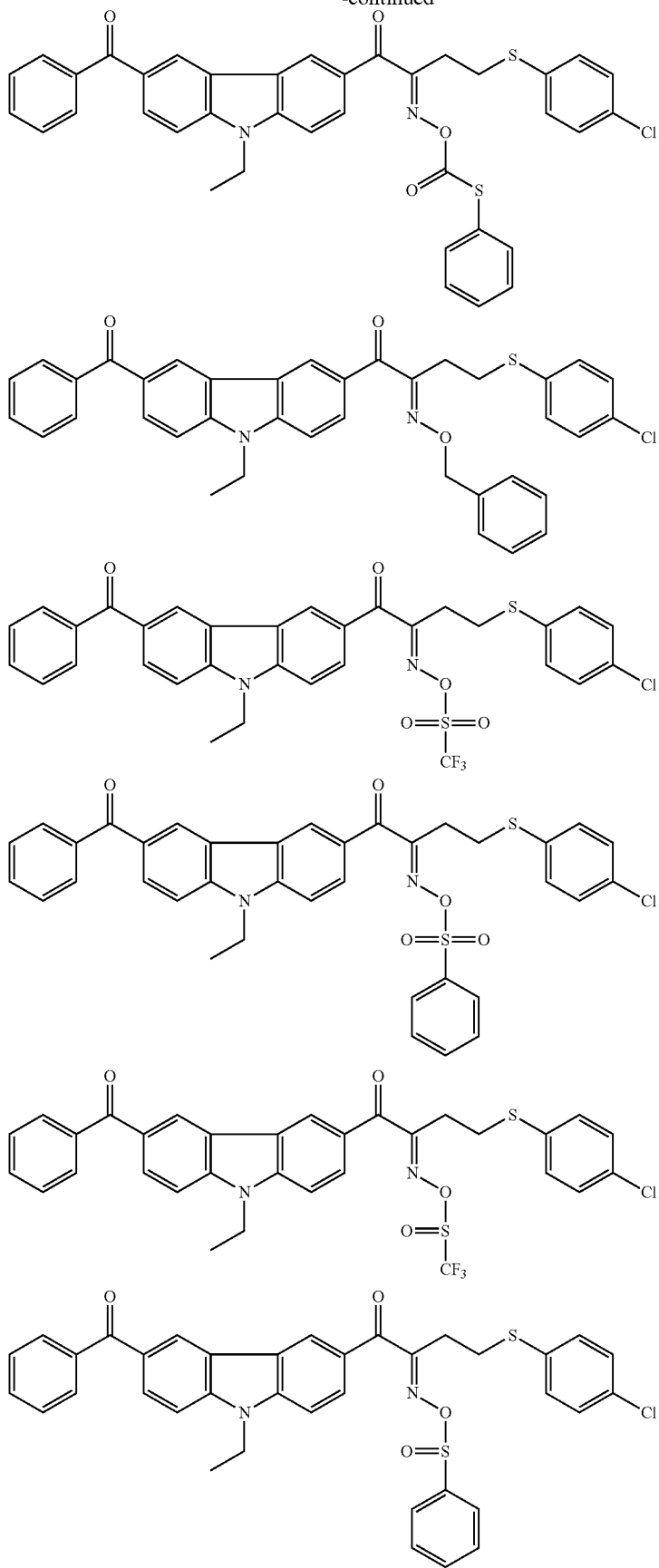

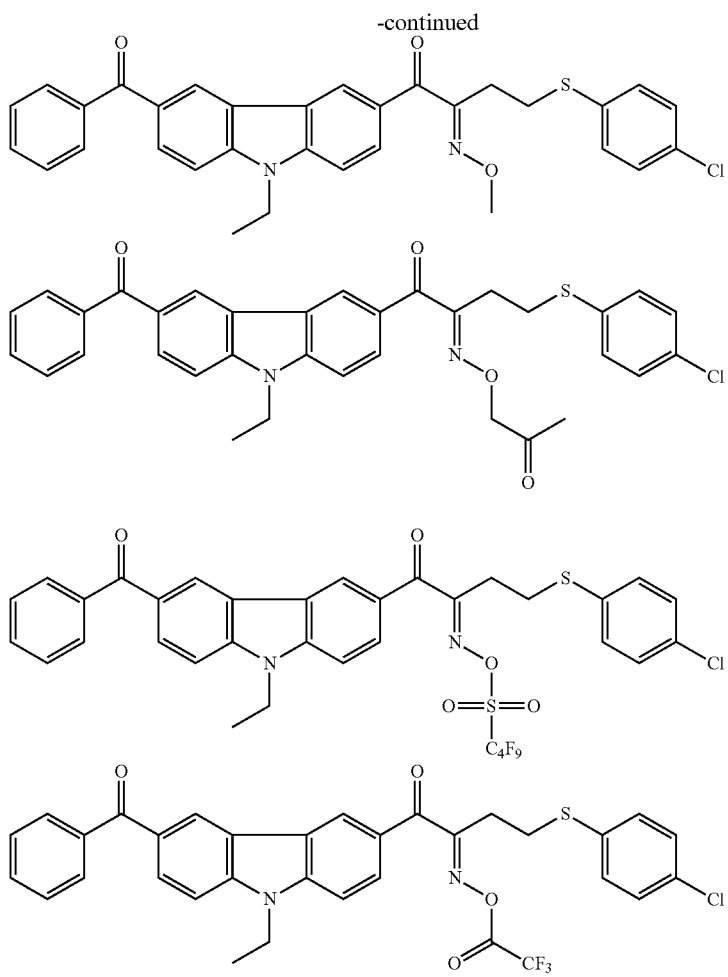

The novel oxime compound in the present exemplary embodiment has a maximum absorption wavelength in a wavelength region of 350 nm to 500 nm. More preferably, the novel oxime compounds has a maximum absorption wavelength in a wavelength region of 360 nm to 480 nm. It is particularly preferable that the novel oxime compounds has a maximum absorption wavelength in a wavelength region of 365 nm or 405 nm.

As described above, the novel oxime compound has an absorption in a longer wavelength region compared to conventional oxime compounds. Consequently, the novel oxime compound may exhibit excellent sensitivity when exposed to light of a wavelength of 365 nm or 405 nm.

The novel oxime compound in the present exemplary embodiment preferably has a molar absorbance coefficient at 365 nm or 405 nm of 10,000 to 300,000, more preferably 15,000 to 300,000, and particularly preferably 20,000 to 200,000 from the viewpoint of sensitivity.

The molar absorbance coefficient of the novel oxime compounds can be measured at a concentration of 0.01 g/L using ethyl acetate as a solvent, by an ultraviolet-visible spectrophotometer (CARRY-5 SPECTROPHOTOMETER, trade name, manufactured by Varian Inc.).

The novel oxime compound in the present exemplary embodiment can be synthesized, for example, by the processes shown below. But the process is not limited thereto.

Synthesis of a Compound Represented by Formula (2)

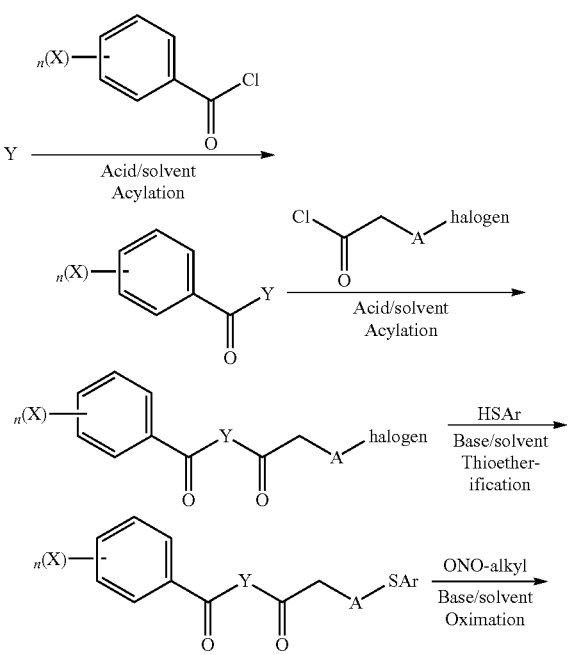

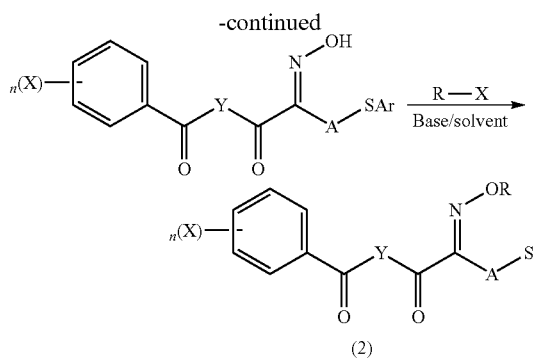

(2)

The content of the novel oxime compound in the photosensitive resin composition of the present exemplary embodiment is preferably 0.1 to 30% by mass, more preferably 1 to 25% by mass, and particularly preferably 2 to 20% by mass in the total solid content of the photosensitive resin composition.

The novel oxime compound may be used alone, or may be used in combination of two or more kinds.

The novel oxime compound in the present exemplary embodiment decomposes upon application of light, and serves as a photopolymerizable initiator that initiates and promotes polymerization of a photopolymerizable compound. In particular, the novel oxime compound exhibits excellent sensitivity with respect to light of 365 nm or 405 nm.

The photopolymerization initiator may be used in combination with a sensitizer or a light stabilizer.

Specific examples of the sensitizer or light stabilizer include benzoin, benzoinmethylether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acridone, 10-butyl-2-chloroacridone, benzyl, dibenzylacetone, p-(dimethylamino)phenylstrylketone, p-(dimethylamino)phenyl-p-methylstrylketone, benzophenone, p-(dimethylamino)benzophenone (or Michler's ketone), p-(diethylamino)benzophenone, benzoanthrone, benzothiazole-based compounds described in JP-B No. 51-48516 and the like, TINUVIN 1130, TINUVIN 400 (trade name, manufactured by Ciba Japan, K.K.) and the like.

The photosensitive resin composition of the present exemplary embodiment may include other initiator than the above-described photopolymerization initiator.

Specific examples of such initiators include the vicinal polyketolaldonyl compounds disclosed in U.S. Pat. No. 2,367,660, the α-carbonyl compounds disclosed in U.S. Pat. No. 2,367,661 and U.S. Pat. No. 2,367,670, the acyloin ethers disclosed in U.S. Pat. No. 2,448,828, the aromatic acyloin compounds substituted by α-hydrocarbon disclosed in U.S. Pat. No. 2,722,512, the polynuclear quinone compounds disclosed in U.S. Pat. No. 3,046,127 and U.S. Pat. No. 2,951,758, the combination of triallylimidazole dimer and p-aminophenyl ketone disclosed in U.S. Pat. No. 3,549,367, the benzothiazole-based compound and trihalomethyl-s-triazine-based compounds disclosed in JP-B No. 51-48516, and the like.

The photosensitive resin composition of the present exemplary embodiment may contain only one kind of photopolymerization initiatior, or may contain two or more kinds in combination.

The content of the photopolymerization initiatior (when two or more kinds are used, the total content thereof) in the total solid content of the photosensitive resin composition of the present exemplary embodiment is preferably 3 to 20% by mass, more preferably 4 to 19% by mass and particularly preferably 5 to 18% by mass, from the viewpoint of achieving the effects of the present exemplary embodiment more effectively.

<Solvent>

The photosensitive resin composition of the present exemplary embodiment contains a solvent. Examples of the solvent include acetone, methylethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropylacetate, N,N-dimethylformamide, dimethylsulfoxide, γ-butyrolactone, methyl lactate, ethyl lactate, and the like.

The solvent may be used alone or as a mixture of two or more kinds. The concentration of the solid content to the solvent is preferably 2 to 60% by mass.

<Other Components>

(Sensitizer)

The photosensitive resin composition of the present exemplary embodiment may contain a sensitizer. The sensitizer is preferably capable of sensitizing the above-described photopolymerization initiatior by an electron-transfer mechanism or energy-transfer mechanism.

The sensitizer is preferably selected from the following compounds and has an absorption wavelength in a wavelength region of 300 nm to 450 nm.

Polynuclear aromatics (for example, phenanthrene, anthracene, pyrene, perylene, triphenylene or 9,10-dialkoxyanthracene), xanthenes (for example, flourescein, eosin, erythrosine, rhodamine B or rose bengal), thioxanthones (isopropylthioxanthone, diethylthioxanthone or chlorothioxanthone), cyanines (for example, thiacarbocyanine or oxacarbocyanine), merocyanines (for example, merocyanine or carbomerocyanine), phthalocyanines, thiazines (for example, thionine, methylene blue or toluidine blue), acridines (for example, acridine orange, chloroflavin or acriflavin), anthraquinones (for example, anthraquinone), squaryliums (for example, squarylium), acridine orange, coumarins (for example, 7-diethylamino-4-methylcoumarin), ketocoumarin, phenothiazines, phenazines, strylbenzenes, azo compounds, diphenylmethane, triphenylmethane, distrylbenzenes, carbazoles, porphyrins, spiro compounds, quinacridone, indigo, stryl, pyrylium compounds, pyrometene compounds, pyrazolotriazole compounds, benzothiazole compounds, barbituric acid derivatives, thiobarbituric acid derivatives, acetophenone, benzophenone, thioxanthone, aromatic ketone compounds such as Michler's ketone, heterocyclic compounds such as N-aryloxazolidinone, and the like.

When the photosensitive resin composition of the present exemplary embodiment contains the sensitizer, the content of the sensitizer in the photosensitive resin composition is preferably 0.1 to 20% by mass and more preferably 0.5 to 15% by mass in the solid content of the composition, from the viewpoint of light absorption efficiency at a deep portion and initiation-decomposition efficiency.

(Cosensitizer)

The photosensitive resin composition of the present exemplary embodiment may contain a cosensitizer. The cosensitizer has a function of further improving the sensitivity of the above-mentioned photopolymerization initiatior or sensitizer with respect to active radiation rays, or suppressing the inhibition of polymerization of the photopolymerizable compound due to oxygen or the like.

Examples of such cosensitizers include amines, for example, the compounds described in M. R. Sander, et al., "Journal of Polymer Society", Vol. 10, p. 3173 (1972), JP-B No. 44-20189, JP-A No. 51-82102, JP-A No. 52-134692, JP-A No. 59-138205, JP-A No. 60-84305, JP-A No. 62-18537, JP-A No. 64-33104, Research Disclosure No. 33825 and the like, and specific examples thereof include triethanolamine, p-dimethylaminobenzoic acid ethyl ester, p-formyldimethylaniline, p-methylthiodimethylaniline, and the like.

Other examples of the cosensitizer include thiols and sulfides, for example, the thiol compounds described in JP-A No. 53-702, JP-B No. 55-500806 and JP-A No. 5-142772, the disulfide compounds described in JP-A No. 56-75643 and the like, and specific examples include 2-mercaptobenzothiazole, 2-mercaptobenzooxazole, 2-mercaptobenzoimidazole, 2-mercapto-4(3H)-quinazoline, β-mercaptonaphthalene, and the like.

Other examples of the cosensitizer include amino acid compounds (for example, N-phenylglycine and the like), organic metal compounds described in JP-B No. 48-42965 (for example, tributyl tin acetate and the like), hydrogen donors described in JP-B No. 55-34414, sulfur compounds described in JP-A No. 6-308727 (for example, trithiane and the like) and the like.

When the photosensitive resin composition of the present exemplary embodiment contains the cosensitizer, the content of the cosensitizer is preferably in the range of 0.1 to 30% by mass, more preferably in the range of 1 to 25% by mass, and further preferably in the range of 0.5 to 20% by mass, in the total solid content of the photosensitive resin composition, from the viewpoint of improving a curing rate by controlling the balance of polymerization growth rate and chain transfer.

(Thermal Polymerization Inhibitor)

In order to inhibit unnecessary thermal polymerization of the photopolymerizable compound during preparation or storage, a small amount of thermal polymerization inhibitor may be added to the photosensitive resin composition.

Examples of the thermal polymerization inhibitor that may be used in the present exemplary embodiment include hydroquinone, p-methoxyphenol, di-t-butyl-p-cresole, pyrogallol, t-butylcatechol, benzoquinone, 4,4'-thiobis(3-methyl-6-t-butylphenol), 2,2'-methylenebis(4-methyl-6-t-butylphenol), and a primary cerium salt of N-nitrosophenylhydroxyamine.

When the photosensitive resin composition of the present exemplary embodiment contains the thermal polymerization inhibitor, the addition amount of the thermal polymerization inhibitor is preferably about 0.01 to about 5% by mass to the total solid content of the photosensitive resin composition.

Further, if necessary, a higher fatty acid derivative such as behenic acid or behenic acid amide may be added such that the higher fatty acid derivative is present on the surface of a coating film after application and drying, in order to prevent the inhibition of polymerization due to oxygen. The addition amount of the higher fatty acid derivative is preferably about 0.5 to about 10% by mass in the total mass of the composition.

(Adhesion Promoter)

An adhesion promoter may be added to the photosensitive resin composition of the present exemplary embodiment in order to improve the adhesion to a hard surface such as a support. Examples of the adhesion promoter include a silane coupling agent and a titanium coupling agent.

The silane coupling agent include, for example, γ-(2-aminoethyl)aminopropyltrimethoxysilane, γ-(2-aminoethyl)aminopropyldimethoxysilane, β-(3,4-epoxycyclohexyl)ethyltrimethoxysilane, γ-aminopropyltrimethoxysilane, γ-aminopropyltriethoxysilane, γ-methacryloxypropyltrimethoxysilane, γ-methacryloxypropyltriethoxysilane, γ-acryloxypropyltrimethoxysilane, γ-acryloxypropyltriethoxysilane, γ-isocyanatepropyltrimethoxysilane, γ-isocyanatepropyltriethoxysilane, N-β-(N-vinylbenzylaminoethyl)-γ-aminopropyltrimethoxysilane.hydrochloride, γ-glycidoxypropyltrimethoxysilane, γ-glycidoxypropyltriethoxysilane, aminosilane, γ-mercaptopropyltrimethoxysilane, γ-mercaptopropyltriethoxysilane, methyltrimethoxysilane, methyltriethoxysilane, vinyltriacetoxysilane, γ-chloropropyltrimethoxysilane, hexamethyldisilazane, γ-anilinopropyltrimethoxysilane, vinyltrimethoxysilane, vinyltriethoxysilane, vinyltris(β-methoxyethoxy)silane, octadecyldimethyl[3-(trimethoxysilyl)propyl]ammonium chloride, γ-chloropropylmethyldimethoxysilane, γ-mercaptopropylmethyldimethoxysilane, methyltrichlorosilane, dimethyldichlorosilane, trimethylchlorosilane, 2-(3,4-epoxycyclohexyl)ethyltrimethoxysilane, bisallyltrimethoxysilane, tetraethoxysilane, bis(trimethoxysilyl)hexane, phenyltrimethoxysilane, N-(3-acryloxy-2-hydroxypropyl)-3-aminopropyltriethoxysilane, N-(3-methacryloxy-2-hydroxypropyl)-3-aminopropyltriethoxysilane, (methacryloxymethyl)methyldiethoxysilane, (acryloxymethyl)methyldimethoxysilane, and the like.

Among these, the silane coupling agent is preferably γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane or phenyltrimethoxysilane, most preferably γ-methacryloxypropyltrimethoxysilane.

When the photosensitive resin composition of the present exemplary embodiment contains the adhesion promoter, the addition amount of the adhesion promoter is preferably 0.5 to 30% by mass, and more preferably 0.7 to 20% by mass in the total solid content of the photosensitive resin composition.

(Other Additives)

Further, known additives such as an inorganic filler, a plasticizer or an etching agent may be added to the photosensitive resin composition of the present exemplary embodiment in order to improve the properties of the cured film.

Examples of the plasticizer include dioctylphthalate, didodecylphthalate, triethylene glycol dicaprylate, dimethylglycol phthalate, tricresyl phosphate, dioctyladipate, dibutylsebacate, triacetylglycerin and the like. A binder may be used in an amount of 10% by mass or less in the total mass of the photopolymerizable compound and the resin.

<Light-Shielding Color Filter>

The light-shielding color filter of the present exemplary embodiment is formed from the photosensitive resin composition of the present exemplary embodiment, and has a ratio of optical density $OD_{1200}/OD_{365}$, of an optical density at a wavelength of 1200 nm ($OD_{1200}$) to an optical density at a wavelength of 365 nm ($OD_{365}$), is 0.5 or more and 3 or less.

When the light-shielding color filter has the aforementioned constitution, occurrence of steps in the periphery of the light-shielding color filter may be suppressed, thereby improving light-shielding properties at the center and periphery of the light-shielding color filter.

Details of the optical density of the light-shielding color filter of the present exemplary embodiment are explained in the above section concerning the photosensitive resin composition, and preferable embodiments thereof are also the same as that mentioned in the above section.

The thickness of the light-shielding color filter is not particularly limited. However, from the viewpoint of more effectively achieving the effects of the present exemplary embodiment, the thickness is preferably 0.1 μm to 10 μm, more preferably 0.3 μm to 5.0 μm, and particularly preferably 0.5 μm to 3.0 μm.

The size of the light-shielding color filter (the length of each side) is not particularly limited. However, from the viewpoint of more effectively achieving the effects of the present exemplary embodiment, the size is preferably 50 μm or more, more preferably 100 μm or more, further preferably 200 μm or more, yet more preferably 500 μm or more, and particularly preferably 1000 μm or more. The upper limit of the size is not particularly limited, but is preferably 3000 μm.

In addition, the area of the light-shielding color filter is not particularly limited. However, from the viewpoint of more effectively achieving the effects of the present exemplary embodiment, the area is preferably 0.0025 $mm^2$ or more, more preferably 0.01 $mm^2$ or more, further preferably 0.04 $mm^2$ or more, yet more preferably 0.05 $mm^2$ or more, even more preferably 0.2 $mm^2$ or more, and particularly preferably 1 $mm^2$ or more. The upper limit of the area is not particularly limited, but is preferably 9 $mm^2$.

The light-shielding color filter of the present exemplary embodiment can be suitably used for a solid-state image sensor such as a CCD or CMOS, particularly suitably used for a solid-state image sensor such as a CCD or CMOS having more than a million pixels.

<Method of Producing the Light-Shielding Color Filter>

The method of producing the light-shielding color filter of the present exemplary embodiment is not particularly limited. However, one preferable example is a method including applying the above-described photosensitive resin composition of the present exemplary embodiment onto a support, exposing the composition to light through a mask, and developing the composition to form a pattern (hereinafter, referred to as the "method of producing the light-shielding color filter of the present exemplary embodiment").

Specifically, the method of producing the light-shielding color filter of the present exemplary embodiment includes applying the photosensitive resin composition of the present exemplary embodiment onto a support to form a photosensitive layer (hereinafter, sometimes briefly called as the "photosensitive layer-forming step"), exposing the above-mentioned photosensitive layer to light through a mask (hereinafter, sometimes briefly called as the "exposing step"), and after the exposure, developing the above-mentioned photosensitive layer to form a pattern (hereinafter, sometimes briefly called as the "development step").

In the following, each step in the method of producing the light-shielding color filter of the present exemplary embodiment will be explained.

<Photosensitive Layer-Forming Step>

The photosensitive layer-forming step includes applying the photosensitive resin composition of the present exemplary embodiment onto a support to form a photosensitive layer.

Examples of the support that can be used in this step include a photoelectric conversion element substrate used in solid-state image sensors or the like, such as a silicon substrate, complementary metal oxide film semiconductor (CMOS), or the like.

As necessary, a basecoat layer may be provided onto the support in order to improve adhesion to an upper layer, prevent the diffusion of substances, or flatten the surface of the substrate.

The method of applying the photosensitive resin composition of the present exemplary embodiment onto a support may be any application method such as slit application, inkjet application, rotation application, flow-casting application, roll application, screen printing, or the like.

The thickness of the film formed from the photosensitive resin composition is preferably 0.35 μm to 3.0 μm, and more preferably 0.50 μm to 2.5 μm from the viewpoint of resolution and development properties.

The photosensitive resin composition applied onto the support is usually dried under the conditions of 70° C. to 130° C. (more preferably 70° C. to 110° C.) for about 2 minutes to 4 minutes, thereby forming a photosensitive layer.

<Exposing Step>

In the exposing step, the photosensitive layer that has been formed in the above-mentioned photosensitive layer-forming step is exposed to light for curing (in a case of performing the exposure through a mask, only a portion of the film that has been irradiated with light is cured).

The exposure is preferably performed with radiation rays. The radiation rays that can be used in the exposure is particularly preferably ultraviolet rays such as g-line rays or i-line rays, and a high-pressure mercury lamp is preferably used as a light source. The radiation intensity is preferably 5 mJ to 1500 mJ, more preferably 10 mJ to 1000 mJ, and most preferably 10 mJ to 800 mJ.

<Developing Step>

A development is performed following the exposing step. In the development step, portions that have not been irradiated with light in the exposing step are removed with the use of an aqueous alkali solution, leaving the portions that have been irradiated with light to cure.

The developer is desirably an organic alkaline developer, since it causes little damage to the circuit or the like. The development temperature is usually 20° C. to 30° C., and the development time is usually 20 to 240 seconds (more preferably 20 to 90 seconds).

The development is preferably performed using an aqueous alkali solution prepared by diluting an organic alkali compounds such as ammonia water, ethylamine, diethylamine, dimethylethanolamine, tetramethylammonium hydroxide, tetraethylammonium hydroxide, choline, pyrrole, piperidine and 1,8-diazabicyclo-[5,4,0]-7-undecene, in pure water to a concentration of 0.001 to 10 mass %, preferably 0.01 to 1 mass %. When such an aqueous alkali solution is used as a developer, the photosensitive layer is generally washed (rinsed) with pure water after the development.

The method of producing the light-shielding color filter of the present exemplary embodiment may further include, following the photosensitive layer-forming step, exposing step and development step described above, a curing step in which the pattern that has been formed is cured by heating and/or exposing to light.

<Solid-State Image Sensor>

The solid-state image sensor of the present exemplary embodiment includes the light-shielding color filter of the present exemplary embodiment described above.

Since the solid-state image sensor of the present exemplary embodiment is provided with the light-shielding color filter of the present exemplary embodiment, in which degradation of light-shielding performances at the periphery is suppressed, it is possible to reduce the noise and improve the color reproducibility of the solid-state image sensor.

The constitution of the solid-state image sensor of the present exemplary embodiment is not particularly limited as long as it has the light-shielding color filter of the present exemplary embodiment, and functions as a solid-state image sensor. However, one example of the constitution of the solid-state image sensor includes, on a support, a light-receiving element formed from a plural number of photo diodes and polysilicon or the like, which serves as a light-receiving area of the solid-state image sensor (such as a CCD image sensor or a CMOS image sensor), and the light-shielding color filter of the present exemplary embodiment on the surface of the support opposite to the surface on which the light-receiving element is formed.

Second Exemplary Embodiment

The second exemplary embodiment of the present invention provides a photosensitive resin composition including titanium black, a photopolymerizable compound, a resin A having an acid value of from 70 to 250 mgKOH/g, a resin B having an acid value of from 26 to 65 mgKOH/g, a photopolymerization initiator, and a solvent.

In order to prepare a fine pattern using a photosensitive resin composition including titanium black, it is necessary that the resin included in the composition has a high acid value and favorable development solubility.

However, even when a resin having a high acid value is simply used, deterioration in temporal stability of the photosensitive resin composition may occur.

In light of the above, the object of the present exemplary embodiment is to provide a photosensitive resin composition that can form a fine pattern with less amount of development residue and exhibits excellent temporal stability, a light-shielding color filter having a fine pattern with less amount of development residue, a method of producing the same, and a solid-state image sensor having less noise and excellent color reproducibility.

<Photosensitive Resin Composition>

The photosensitive resin composition of the present exemplary embodiment includes titanium black, a photopolymerizable compound, a resin A having an acid value of 70 mg KOH/g or more and 250 mg KOH/g or less, a resin B having an acid value of 26 mg KOH/g or more and 65 mg KOH/g or less, a photopolymerization initiator, and a solvent.

In order to prepare a fine pattern with a photosensitive resin composition including titanium black, it is necessary that the resin included in the composition has a high acid value and favorable development solubility. However, when a resin having a high acid value is simply used, temporal stability of the photosensitive resin composition may deteriorate. On the other hand, when only a resin having a low acid value is used, development residue may be generated upon preparation of a fine pattern.

In this regard, when the photosensitive resin composition has a structure according to the present exemplary embodiment mentioned above, it may be possible to improve the temporal stability of the photosensitive resin composition and to reduce the amount of development residue upon formation of a fine pattern. Further, the fine pattern formed using the photosensitive resin composition of the present exemplary embodiment may exhibit favorable adhesion to a substrate on which the fine pattern is formed.

The photosensitive resin composition of the present exemplary embodiment is particularly suitable for forming a fine pattern having a pattern size of 300 μm or less (more preferably 100 μm or less).

The acid value (unit: mg KOH/g) of the resin in the present exemplary embodiment is the amount (mg) of potassium hydroxide (KOH) that is necessary to neutralize 1 g of the resin.

The acid value in the present exemplary embodiment refers to a value measured according to a process defined in Section 11.1 of JIS K 5407 (1990).

Resin A in the present exemplary embodiment is not particularly limited as long as it has an acid value of 70 mg KOH/g or more and 250 mg KOH/g or less. If the acid value of resin A is less than 70 mg KOH/g, or more than 250 mg KOH/g, temporal stability or occurrence of development residue may deteriorate.

In addition, resin B in the present exemplary embodiment is not particularly limited as long as it has an acid value of 26 mg KOH/g or more and 65 mg KOH/g or less. If the acid value of resin B is less than 26 mg KOH/g, or more than 65 mg KOH/g, temporal stability or occurrence of development residue may deteriorate.

The photosensitive resin composition of the present exemplary embodiment may contain a single kind of resin A and a single kind of resin B, respectively, or may contain two or more kinds of resin A and/or resin B. In addition, the photosensitive resin composition of the present exemplary embodiment may contain other resin than resins A and B.

The acid value of resin A and resin B in the present exemplary embodiment is preferably within the range described below, from the viewpoint of more effectively improving temporal stability and suppressing the amount of development residue at the same time.

Specifically, the acid value of resin A is preferably 70 mg KOH/g or more and 250 mg KOH/g or less, and more preferably 75 mg KOH/g or more and 200 mg KOH/g or less.

In addition, the acid value of resin B is preferably 26 mg KOH/g or more and 65 mg KOH/g or less, and more preferably 30 mg KOH/g or more and 60 mg KOH/g or less.

The weight average molecular weight of resin A and resin B in the present exemplary embodiment and the mass ratio resin A/resin B is preferably within the range described below, from the viewpoint of more effectively improving temporal stability and suppressing the amount of development residue at the same time.

The weight average molecular weight of resin A is not particularly limited, but is preferably 1,000 to 100,000, more preferably 2,000 to 50,000, and particularly preferably 3,000 to 30,000, from the viewpoint of development properties.

The weight average molecular weight of resin B is not particularly limited, but is preferably 1,000 to 100,000, more preferably 2,000 to 50,000, and particularly preferably 3,000 to 30,000 from the viewpoint of temporal stability.

The mass ratio Resin A/Resin B of resin A and resin B in the photosensitive resin composition of the present exemplary embodiment is preferably 0.5 to 10.5, more preferably 1 to 10, and particularly preferably 2 to 8.

The total content of resin A and of resin B in the total solid content of the photosensitive resin composition of the present exemplary embodiment is preferably 1 to 50 mass %, more preferably 2 to 40 mass %, and particularly preferably 5 to 30 mass %.

The method of regulating the acid value of resin A and resin B to the above-mentioned range in the present exemplary embodiment is not particularly limited. The method may be, for example, a method of regulating the acid value by controlling the content of a polymeric compound having an acidic group in polymeric compounds used as the raw material of the resin; a method of regulating the acid value by controlling the ratio of an acidic group to be introduced into a main chain after the synthesis of the main chain part of the resin; a method of regulating the acid value by synthesizing a resin having an acidic group in a side chain and reacting a specific compound with the acidic group in the side chain while controlling the reaction rate.

Hereinafter, each component of the photosensitive resin composition of the present exemplary embodiment will be explained.

<Resin>

The photosensitive resin composition of the present exemplary embodiment contains resin A and resin B, and optionally other resin (hereinafter, any of these resins are referred to as the "resin").

The resin used in the present exemplary embodiment may be similar to the resins that may be used in the above-mentioned first exemplary embodiment, and preferable examples are also similar.

<Titanium Black>

The photosensitive resin composition of the present exemplary embodiment contains titanium black.

The titanium black used in the present exemplary embodiment may be similar to the titanium black that may be used in the above-mentioned first exemplary embodiment, and preferable examples are also similar. The dispersion agent and dispersion medium used for the dispersion of titanium black are also similar to those that may used in the above-mentioned first exemplary embodiment.

The content of titanium black in the photosensitive resin composition is not particularly limited. However, in order to obtain a thin film with high optical density, the content of titanium black is preferably as high as possible, preferably 5 to 98 mass %, further preferably 10 to 95 mass %, and particularly preferably 15 to 95 mass %.

If the content of titanium black is 5 mass % or more, it may be possible to obtain high optical density even with a small film thickness. If the content of titanium black is 98 mass % or less, it may be possible to more effectively promote light-curing and improve film strength, thereby widening the development latitude.

<Black Colorant Other Than Titanium Black>

A black colorant other than titanium black may be used in combination with titanium black in the photosensitive resin composition of the present exemplary embodiment. The black colorant other than titanium black that may be used may be similar to those that may be used in the above-mentioned first exemplary embodiment, and preferable examples are also similar.

The black colorant other than titanium black may be any known black pigments or black dyes, but preferably carbon black, iron oxide, manganese oxide, graphite or the like, from the viewpoint of achieving high optical density with a small amount. Among them, carbon black is particularly preferred.

The average particle size of the black colorant other than titanium black (average primary particle size) is preferably small from the viewpoint of occurrence of foreign substances and the influence thereof on the yield in the preparation of a solid-state image sensor. The average primary particle size is preferably 100 nm or less, further preferably 50 nm or less, and particularly preferably 30 nm or less.

The average particle size can be measured by applying a coloring agent onto a suitable substrate, and observing it by a scanning electron microscope.

In a case that the black colorant other than titanium black is used in addition to titanium black in the present exemplary embodiment, the total content of titanium black and the black colorant other than titanium black in the photosensitive resin composition is not particularly limited. However, the total content is preferably 5 to 98 mass %, further preferably 10 to 95 mass %, and particularly preferably 15 to 95 mass %, from the viewpoint of optical density, film strength, development latitude or the like.

In addition, known coloring agents such as a pigment or a dye of red, blue, green, yellow, cyan, magenta, violet, orange or the like may also be added in order to control the light-shielding effects at a desired wavelength.

The coloring agent to be used in combination (additional coloring agent) is used at an amount of preferably in the range of 2 to 50 mass parts, more preferably in the range of 2 to 30 mass parts, and most preferably in the range of 2 to 10 mass parts, with respect to 100 mass parts of the above-described titanium black and the black colorant other than titanium black.

<Photopolymerizable Compound>

The photosensitive resin composition of the present exemplary embodiment contains a photopolymerizable compound. The photopolymerizable compound may be similar to those that may be used in the above-mentioned first exemplary embodiment, and preferable examples are also similar.

<Photopolymerization Initiator>

The photosensitive resin composition of the present exemplary embodiment contains a photopolymerization initiator. The photopolymerization initiator may be similar to those that may be used in the above-mentioned first exemplary embodiment, and preferable examples are also similar.

<Solvent>

The photosensitive resin composition of the present exemplary embodiment contains a solvent. The solvent may be similar to those that may be used in above-mentioned first exemplary embodiment, and preferable examples are also similar.

<Other Components>

The photosensitive resin composition of the present exemplary embodiment may contain other additives such as a sensitizer, a cosensitizer, a thermal polymerization inhibitor, an adhesion promoter or the like. Such additives may be similar to those that may be used in the above-mentioned first exemplary embodiment, and preferable examples are also similar.

<Light-Shielding Color Filter>

The light-shielding color filter of the present exemplary embodiment is formed from the above-described photosensitive resin composition of the present exemplary embodiment.

Since the light-shielding color filter of the present exemplary embodiment is formed from the photosensitive resin composition of the present exemplary embodiment, the light-shielding color filter may have a fine pattern with a less amount of development residue. In addition, the light-shielding color filter of the present exemplary embodiment may exhibit favorable adhesion to a substrate on which the light-shielding color filter is formed.

The "light-shielding color filter" in the present exemplary embodiment refers to a light-shielding pattern obtained by exposing to light the photosensitive resin composition including a black colorant, a photopolymerizable compound, a resin, a photopolymerization initiator and a solvent, and developing the photosensitive resin composition that has been exposed to light. The color of the "light-shielding color filter" in the present exemplary embodiment may be an achromatic color such as black or gray, or may be black, gray or the like mixed with a chromatic color.

In addition, since the "light-shielding color filter" is obtained by exposing to light a photosensitive resin composition comprising a black colorant, a photopolymerizable compound, a resin, a photopolymerization initiator and a solvent and developing the photosensitive resin composition that has been exposed to light, the composition may also be referred to as a light-shielding film or light-shielding filter.

The thickness of the light-shielding color filter is not particularly limited, but is preferably 0.1 µm to 10 µm, more preferably 0.3 µm to 5.0 µm, and particularly preferably 0.5 µm to 3.0 µm from the viewpoint of more effectively achieving the effects of the present exemplary embodiment.

The pattern size of the light-shielding color filter is not particularly limited, but is preferably 1000 µm or less, more preferably 500 µm or less, and particularly preferably 300 µm or less from the viewpoint of more effectively achieving the effects of the present exemplary embodiment. The lower limit of the pattern size is not particularly limited, but preferably 1 µm.

Further, the spectroscopic properties of the light-shielding color filter of the present exemplary embodiment are not particularly limited. However, the light-shielding color filter of the present exemplary embodiment has a ratio $OD_{1200}/OD_{365}$ of the optical density at 1200 nm wavelength ($OD_{1200}$) and the optical density at 365 nm wavelength ($OD_{365}$) of preferably 0.5 or more and 3 or less from the viewpoint of improving the light-shielding performance in a infrared region that is necessary for a solid-state image sensor, achieving the balance between the light-shielding performances in the visible region and the infrared region, and more effectively achieving the effects of the present exemplary embodiment, or the like.

The above-mentioned optical density (OD) can be measured by a method similar to that described in the above-mentioned first exemplary embodiment. In addition, the light-shielding color filter of the present exemplary embodiment preferably satisfies the requirements in optical density as mentioned in the first present exemplary embodiment from the viewpoint of achieving the balance between the light-shielding performances in the visible region and the infrared region, and from the viewpoint of more effectively achieving the effects of the present exemplary embodiment.

The light-shielding color filter of the present exemplary embodiment can be suitably used for a solid-state image sensor such as CCDs and CMOSs, and in particular, suitably used for a solid-state image sensor such as CCDs and CMOSs having more than a million pixels.

<Method of Preparing a Light-Shielding Color Filter>

The method of forming the light-shielding color filter of the present exemplary embodiment explained above is not particularly limited. However, the light-shielding color filter of the present exemplary embodiment may be prepared by a method as mentioned in the above-mentioned first exemplary embodiment, and preferable conditions are also similar.

<Solid-State Image Sensor>

The solid-state image sensor of the present exemplary embodiment includes the light-shielding color filter of the present exemplary embodiment as described above.

Since the solid-state image sensor of the present exemplary embodiment includes the light-shielding color filter of the present exemplary embodiment that with a reduced amount of development residue, reduction in noise and improvement in color reproducibility may be achieved in the solid-state image sensor.

The constitution of the solid-state image sensor of the present exemplary embodiment is not particularly limited as long as it has the light-shielding color filter of the present exemplary embodiment, and functions as a solid-state image sensor. However, one example of the constitution of the solid-state image sensor includes, on a support, a light-receiving element formed from a plural number of photo diodes and polysilicon or the like, which serves as a light-receiving area of the solid-state image sensor (such as a CCD image sensor or a CMOS image sensor), and the light-shielding color filter of the present exemplary embodiment on the surface of the support The following are exemplary embodiments of the present invention. However, the invention is not limited thereto.

1. A photosensitive resin composition comprising a black colorant, a photopolymerizable compound, a resin, a photopolymerization initiator and a solvent, the composition capable of forming a light-shielding color filter having a ratio $OD_{1200}/OD_{365}$ of from 0.5 to 3, where $OD_{1200}$ is an optical density at a wavelength of 1200 nm and $OD_{365}$ is an optical density at a wavelength of 365 nm.
2. The photosensitive resin composition according to 1, wherein an optical density of the light-shielding color filter in a wavelength region of from 900 nm to 1300 nm is from 2 to 10.
3. The photosensitive resin composition according to 1, wherein the black colorant comprises titanium black.
4. The photosensitive resin composition according to 1, wherein the photopolymerization initiator comprises an oxime photopolymerization initiator.
5. The photosensitive resin composition according to claim 1 for use in a light-shielding color filter for a solid-state image sensor.
6. The photosensitive resin composition according to 1, wherein the content of the photopolymerization initiator with respect to the total solid content amount of the composition is from 3 to 20 mass %.
7. A light-shielding color filter formed from the photosensitive resin composition according to claim 1, the light-shielding color filter having a ratio of $OD_{1200}/OD_{365}$ of from 0.5 to 3, where $OD_{1200}$ is an optical density at a wavelength of 1200 nm and $OD_{365}$ is an optical density at a wavelength of 365 nm.

8. The light-shielding color filter according to 7, wherein an optical density of the light-shielding color filter in a wavelength region of from 900 nm to 1300 nm is from 2 to 10.

9. A method of producing a light-shielding color filter, comprising:
applying the photosensitive resin composition according to claim 1 onto a substrate;
exposing the applied photosensitive resin composition to light via a mask; and
developing the exposed photosensitive resin composition to form a pattern.

10. A solid-state image sensor comprising the light-shielding color filter according to 7.

11. A photosensitive resin composition comprising titanium black, a photopolymerizable compound, a resin A having an acid value of from 70 to 250 mgKOH/g, a resin B having an acid value of from 26 to 65 mgKOH/g, a photopolymerization initiator, and a solvent.

12. The photosensitive resin composition according to 11, wherein the mass ratio resin A/resin B, of resin A to resin B, is from 0.5 to 10.5.

13. The photosensitive resin composition according to 11, wherein the photopolymerization initiator comprises an oxime photopolymerization initiator.

14. The photosensitive resin composition according to 11, wherein the content of the photopolymerization initiator with respect to the total solid content amount of the composition is from 3 to 20 mass %.

15. A light-shielding color filter formed from the photosensitive resin composition according to 11.

16. A method of producing a light-shielding color filter, comprising:
applying the photosensitive resin composition according to 11 onto a substrate;
exposing the applied photosensitive resin composition to light via a mask; and
developing the exposed photosensitive resin composition to form a pattern.

17. A solid-state image sensor comprising the light-shielding color filter according to 15.

EXAMPLES

First Exemplary Embodiment

Hereinafter, the above-mentioned first exemplary embodiment will be further explained with reference to the following Examples. However, the present exemplary embodiment is not limited to Examples below as long as it is not beyond the gist of the present exemplary embodiment. In addition, "part" and "%" are based on mass unless otherwise stated.

Example 1-1

Light-shielding color filters were prepared using different photosensitive resin compositions, and the width of the step region of the color filters was measured. Hereinafter, preparation of the photosensitive resin composition will be specifically explained.

<<Preparation of Photosensitive Resin Composition>>

<Preparation of Sample 1-1 (A Photosensitive Resin Composition Containing Titanium Black)>

(Preparation of Titanium Black Dispersion)

The following composition was subjected to a high-viscosity dispersion treatment with a pair of rollers to prepare a dispersion. The viscosity of the dispersion was 40000 mPa·s.

In this process, kneading may be performed for 30 minutes with a kneader before the high-viscosity dispersion treatment.

| | |
|---|---|
| Titanium black (13M-T, trade name, manufactured by Jemco Inc. | 40 parts |
| Propylene glycol monomethyl acetate solution of benzyl(meth)acrylate/(meth)acrylic acid copolymer (BzMA/MAA = 70/30, Mw: 30000, the solid content: 40 mass %) | 6 parts |
| Solsperse 5000 (trade name, manufactured by Zeneca) | 1 part |

To the obtained dispersion, component (A) having the following composition was added and the mixture was stirred under the conditions of 3000 rpm using a homogenizer for 3 hours. The obtained solution of the mixture was subjected to a dispersion treatment with a dispersion machine (DISPERMAT, trade name, manufactured by GETZMANN GMBH) with use of 0.3 mm zirconia beads for 4 hours, thereby obtaining a titanium black dispersion.

The viscosity of the titanium black dispersion was 8.0 mPa·s.

—Component (A)—

| | |
|---|---|
| Propylene glycol monomethyl acetate solution of benzyl(meth)acrylate/(meth)acrylic acid copolymer (BzMA/MAA = 70/30, Mw: 30000, the solid content: 40 mass %) | 10 parts |
| Propylene glycol monomethyl ether acetate | 140 parts |

(Preparation of Photosensitive Resin Composition)

The components below were mixed to produce a photosensitive resin composition (Sample —Composition of Photosensitive Resin Composition (Sample 1-1)—

| | |
|---|---|
| Copolymer (resin; compound J-1 below, weight average molecular weight: 14,000) | 6.1 parts |
| Dipentaerythritol hexaacrylate (polymeric compound; compound T-1 below | 4.8 parts |
| Ethoxylated pentaerythritol tetraacrylate (polymeric compound; compound T-2 below) | 1.7 parts |
| Titanium black dispersion prepared above | 67 parts |
| Propylene glycol monomethyl ether acetate (PGMEA) | 15.7 parts |

| Oxime-based photopolymerization initiator (compound K-1 below) | 1.7 parts |

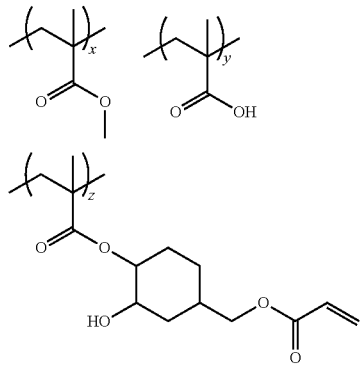

J-1 x:y:z (molar ratio) = 60:8:32

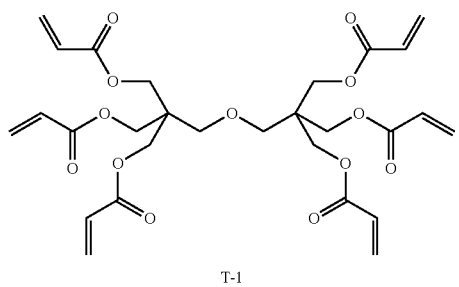

T-1

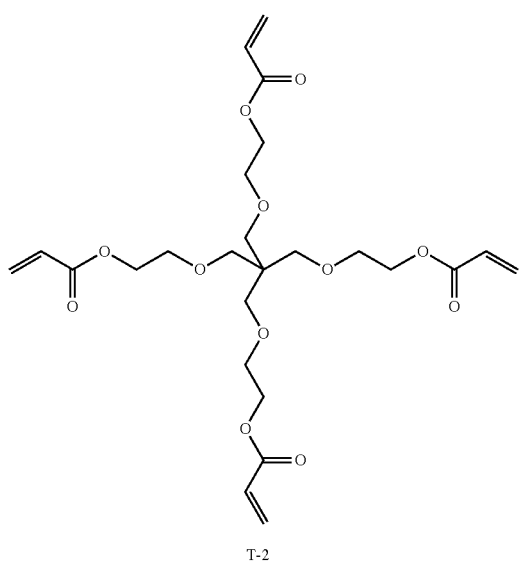

T-2

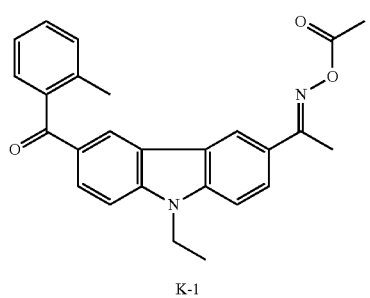

K-1

<Preparation of Sample 1-2 (A Photosensitive Resin Composition Containing Carbon Black)>

(Preparation of Carbon Black Dispersion)

The following composition was subjected to a high-viscosity dispersion treatment with a pair of rollers. The viscosity of the dispersion was 70000 mPa·s.

In the process, kneading may be performed for 30 minutes with a kneader before the high-viscosity dispersion treatment.

| Carbon black (average primary particle size: 15 nm) | 40 parts |
| Propylene glycol monomethyl acetate solution of benzyl(meth)acrylate/(meth)acrylic acid copolymer (BzMA/MAA = 70/30, Mw: 30000, the solid content: 40 mass %) | 8 parts |
| Solsperse 5000 (trade name, manufactured by Zeneca) | 2 parts |

To the obtained dispersion, component (B) having the following composition was added and the mixture was stirred in the conditions of 3000 rpm using a homogenizer for 3 hours. The obtained mixture was subjected to a dispersion treatment with a dispersion machine (DISPERMAT, trade name, manufactured by GETZMANN GMBH) with use of 0.3 mm zirconia beads for 4 hours, thereby obtaining a carbon black dispersion. The viscosity of the carbon black dispersion was 40.0 mPa·s.

—Component (B)—

| Propylene glycol monomethyl acetate solution of benzyl(meth)acrylate/(meth)acrylic acid copolymer (BzMA/MAA = 70/30, Mw: 30000, the solid content: 40 mass %) | 25 parts |
| Propylene glycol monomethyl ether acetate | 125 parts |

(Preparation of a Photosensitive Resin Composition)

The following components were mixed, to produce a photosensitive resin composition (Sample 1-2).

—Composition of a Photosensitive Resin Composition (Sample 1-2)—

| Copolymer (above-mentioned Compound J-1) | 6.1 parts |
| Dipentaerythritol hexaacrylate (above-mentioned Compound T-1) | 4.8 parts |
| Ethoxylated pentaerythritol tetraacrylate (above-mentioned Compound T-2) | 1.7 parts |
| The carbon black dispersion prepared above | 67 parts |
| Propylene glycol monomethyl ether acetate (PGMEA) | 15.7 parts |
| Oxime-based photopolymerization initiator (above-mentioned compound K-1) | 1.7 parts |

<Preparation of Sample 1-3 (Photosensitive Resin Composition Containing Titanium Black)>

Sample 1-3 was prepared in a similar manner to sample 1-1, except that an equal amount of triazine-based photopolymerization initiator shown below (compound (VI)) was used instead of the oxime-based photopolymerization initiator.

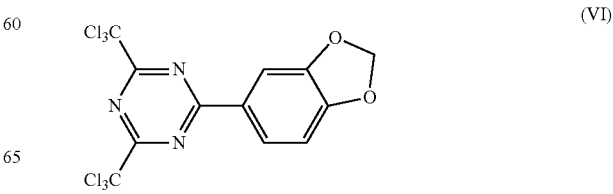

(VI)

<Preparation of Sample 1-4 (Photosensitive Resin Composition Containing Titanium Black)>

Sample 1-4 was prepared in a similar manner to sample 1-1, except that an equal amount of aminoalkylphenone-based photopolymerization initiator shown below (IRGACURE 369, trade name, manufactured by Ciba Japan, K.K.) was used instead of the oxime-based photopolymerization initiator.

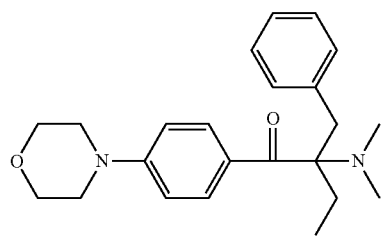

IRGACURE 369
(molecular weight: 366.5)

<Preparation of Sample 1-5 (Photosensitive Resin Composition Containing Titanium Black)>

Sample 1-5 was prepared in a similar manner to sample 1-1, except that an equal amount of compound J-2 (resin, weight average molecular weight: 30,000) shown below was used instead of compound J-1 (resin).

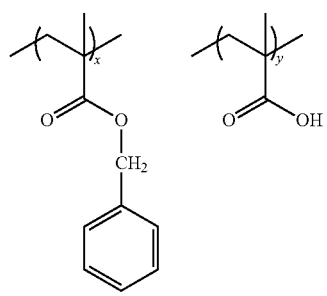

J-2 x:y (molar ratio) = 70:30

<Preparation of Sample 1-6 (Photosensitive Resin Composition Containing Titanium Black)>

Sample 1-6 was prepared in a similar manner to sample 1-1, except that titanium black powder (TILAK D, trade name, fine particle-type, manufactured by AKO KASEI CO., LTD.) was used instead of 13M-T.

<Preparation of Sample 1-7 (Photosensitive Resin Composition Containing Titanium Black)>

Sample 1-7 was prepared in a similar manner to sample 1-1, except that titanium black powder (TILAK D, trade name, ultrafine particle-type, manufactured by AKO KASEI CO., LTD.) was used instead of 13M-T.

<<Preparation and Evaluation of Light-Shielding Color Filter>>

Samples 1-1 to 1-7 (photosensitive resin compositions) obtained above were each applied onto a silicon wafer by a spin coating method, and then heated on a hot plate at 120° C. for 2 minutes, thereby preparing a photosensitive layer.

Then, the obtained photosensitive layer was exposed to light by an i-line stepper at an exposure amount of 500 mJ/cm$^2$, through a photo mask having a pattern of 3 mm square.

Following the exposure, the photosensitive layer was subjected to paddle development using a 0.3% aqueous solution of tetramethylammonium hydroxide, at 23° C. for 60 seconds. Thereafter, the photosensitive layer was rinsed with a spin shower and further washed with pure water, thereby producing a light-shielding color filter.

The obtained light-shielding color filter was subjected to measurement of the optical density at 1200 nm wavelength ($OD_{1200}$) and the optical density at 365 nm wavelength ($OD_{365}$), respectively, using an optical densiometer U-4100, trade name, manufactured by Hitachi High-Technologies Corporation., and the ratio $OD_{1200}/OD_{365}$ was calculated. Further, in a similar manner, the optical density at 1100 nm wavelength ($OD_{1100}$) and the optical density at 900 nm wavelength ($OD_{900}$) were measured and the ratios $OD_{1100}/OD_{365}$ and $OD_{900}/OD_{365}$ were calculated. The values of $OD_{1200}/OD_{365}$, $OD_{1100}/OD_{365}$ and $OD_{900}/OD_{365}$ measured at each example are shown in Table 1. Further, the OD value at a wavelength of 900 nm to 1300 nm was measured and the results are shown in Table 1.

Then, the obtained light-shielding color filter was observed with an optical microscope (100-fold magnification) to measure the width of a step region. The narrower the width of the step region is, the more favorable the light-shielding performance at the center and the periphery are.

The measurement results of samples 1-1 to 1-7 are shown in Table 1 below.

TABLE 1

| Photosensitive resin composition | Photopolymerizable compound | Resin | Photopolymerization initiator/content | Black colorant | $OD_{900}/OD_{365}$ | $OD_{1100}/OD_{365}$ | $OD_{1200}/OD_{365}$ | OD at 900 to 1300 nm | Width of step region (μm) | Notes |
|---|---|---|---|---|---|---|---|---|---|---|
| Sample 1-1 | T-1/T-2 | J-1 (with polymerizable group) | K-1 (oxime)/ 6 mass % | Titanium Black | 1.85 | 1.8 | 1.7 | 2 to 5 | 0 | The invention |
| Sample 1-2 | T-1/T-2 | J-1 | K-1 (oxime)/ 6 mass % | Carbon Black | 0.36 | 0.32 | 0.31 | 2 to 5 | 250 | Comparative |
| Sample 1-3 | T-1/T-2 | J-1 | (VI) (triazine)/ 6 mass % | Titanium Black | 1.85 | 1.8 | 1.7 | 2 to 5 | 10 | The invention |
| Sample 1-4 | T-1/T-2 | J-1 | IRGACURE 365 (aminoalkyl-phenone)/ 6 mass % | Titanium Black | 1.85 | 1.8 | 1.7 | 2 to 5 | 15 | The invention |

TABLE 1-continued

| Photosensitive resin composition | Photopoly-merizable compound | Resin | Photopolymeriza-tion initiator/ content | Black colorant | $OD_{900}/OD_{365}$ | $OD_{1100}/OD_{365}$ | $OD_{1200}/OD_{365}$ | OD at 900 to 1300 nm | Width of step region (μm) | Notes |
|---|---|---|---|---|---|---|---|---|---|---|
| Sample 1-5 | T-1/T-2 | J-2 (no polymerizable group) | K-1 (oxime)/ 6 mass % | Titanium Black | 1.85 | 1.8 | 1.7 | 2 to 5 | 30 | The invention |
| Sample 1-6 | T-1/T-2 | J-1 | K-1 (oxime)/ 6 mass % | Titanium Black | 1.05 | 0.92 | 0.88 | 2 to 5 | 0 | The invention |
| Sample 1-7 | T-1/T-2 | J-1 | K-1 (oxime)/ 6 mass % | Titanium Black | 1.5 | 1.4 | 1.35 | 2 to 5 | 0 | The invention |

In Table 1, symbols such as "T-1" represent the above-described compound T-1 or the like. Further, the content of photopolymerization initiator is shown as the content (mass %) in the total solid content of the photosensitive resin composition. The same applies to the following Table 2 and Table 3.

As shown in Table 1, when the light-shielding color filter of the present exemplary embodiment had a ratio $OD_{1200}/OD_{365}$ of 0.5 or more and 3 or less, the width of the step region was smaller. Further, the width of the step region was more suppressed when an oxime-based photopolymerization initiator was used, as shown from the comparison of samples 1-1, 1-3 and 1-4. In addition, the width of the step region was more suppressed when a resin having a polymerizable group was used, as shown from the comparison of Samples 1-1 and 1-5.

Example 1-2

Samples 1-11 to 1-20 were prepared in a similar manner to sample 1-1, but by changing the content of photopolymerization initiator in the total solid content of photosensitive resin composition, as shown in Table 2 below. Using the obtained samples 1-11 to 1-20, a light-shielding color filter was formed in a similar same manner to Example 1-1, and evaluation was performed in a similar manner to Example 1-1. The evaluation results are shown in Table 2.

As shown in Table 2, when the content of photopolymerization initiator in the total solid content of the photosensitive resin composition was 3 to 20 mass %, the width of the step region was even more suppressed.

Example 1-3

Samples 1-1-2, 1-1-3, 1-1-4, 1-11-2, 1-11-3, 1-11-4, 1-20-2, 1-20-3 and 1-20-4 shown in Table 3 were prepared in a similar manner to the preparations of samples 1-1, 1-11 and sample 1-20, respectively. In the preparation of each sample, compounds K-2, K-3 and K-4 described below were used instead of compound K-1 as an oxime-based photopolymerization initiator.

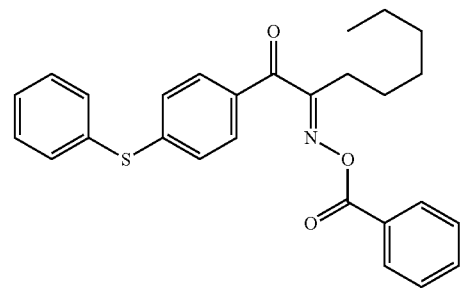

K-2

TABLE 2

| Photosensitive resin composition | Photopoly-merizable compound | Resin | Photopolymeriza-tion initiator/ content | Black colorant | $OD_{900}/OD_{365}$ | $OD_{1100}/OD_{365}$ | $OD_{1200}/OD_{365}$ | OD at 900 to 1300 nm | Width of step region (μm) | Notes |
|---|---|---|---|---|---|---|---|---|---|---|
| Sample 1-1 | T-1/T-2 | J-1 | K-1 (oxime)/ 6 mass % | Titanium Black | 1.85 | 1.8 | 1.7 | 2 to 5 | 0 | The invention |
| Sample 1-11 | T-1/T-2 | J-1 | K-1 (oxime)/ 1 mass % | Titanium Black | 1.85 | 1.8 | 1.7 | 2 to 5 | 25 | The invention |
| Sample 1-12 | T-1/T-2 | J-1 | K-1 (oxime)/ 2 mass % | Titanium Black | 1.85 | 1.8 | 1.7 | 2 to 5 | 20 | The invention |
| Sample 1-13 | T-1/T-2 | J-1 | K-1 (oxime)/ 2.5 mass % | Titanium Black | 1.85 | 1.8 | 1.7 | 2 to 5 | 15 | The invention |
| Sample 1-14 | T-1/T-2 | J-1 | K-1 (oxime)/ 3.5 mass % | Titanium Black | 1.85 | 1.8 | 1.7 | 2 to 5 | 5 | The invention |
| Sample 1-15 | T-1/T-2 | J-1 | K-1 (oxime)/ 10 mass % | Titanium Black | 1.85 | 1.8 | 1.7 | 2 to 5 | 0 | The invention |
| Sample 1-16 | T-1/T-2 | J-1 | K-1 (oxime)/ 15 mass % | Titanium Black | 1.85 | 1.8 | 1.7 | 2 to 5 | 3 | The invention |
| Sample 1-17 | T-1/T-2 | J-1 | K-1 (oxime)/ 20 mass % | Titanium Black | 1.85 | 1.8 | 1.7 | 2 to 5 | 5 | The invention |
| Sample 1-18 | T-1/T-2 | J-1 | K-1 (oxime)/ 22 mass % | Titanium Black | 1.85 | 1.8 | 1.7 | 2 to 5 | 15 | The invention |
| Sample 1-19 | T-1/T-2 | J-1 | K-1 (oxime)/ 25 mass % | Titanium Black | 1.85 | 1.8 | 1.7 | 2 to 5 | 25 | The invention |
| Sample 1-20 | T-1/T-2 | J-1 | K-1 (oxime)/ 30 mass % | Titanium Black | 1.85 | 1.8 | 1.7 | 2 to 5 | 30 | The invention |

-continued

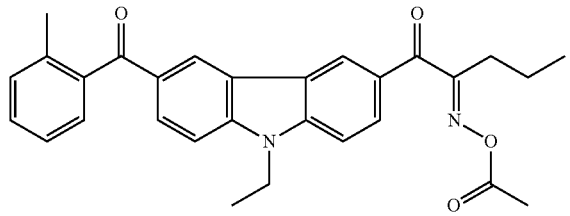

K-3

K-4

Composition

| | |
|---|---|
| Titanium black (13M-T, trade name, manufactured by Jemco Inc. | 300 parts |
| DISPERBYK 180 (trade name, product from BYK Japan K.K.) | 200 parts |
| Propylene glycol monomethyl ether acetate | 600 parts |

The dispersion treatment was conducted under the following conditions.

Diameter of beads: 0.05 mm
Filling rate of beads: 75% by volume
Peripheral speed: 8 m/sec
Pump feed rate: 10 kg/hour
Cooling water: tap water
Volume of circular path of bead mill: 0.15 L
Amount of mixture to be dispersed: 1.1 kg
Time for dispersion treatment: 8 hours —Composition of Photosensitive Resin Composition—

The following components were mixed to prepare a photosensitive resin composition (Sample 1-31).

TABLE 3

| Photosensitive resin composition | Photopoly-merizable compound | Resin | Photopolymeriza-tion initiator/content | Black colorant | $OD_{900}/OD_{365}$ | $OD_{1100}/OD_{365}$ | $OD_{1200}/OD_{365}$ | OD at 900 to 1300 nm | Width of step region (μm) | Notes |
|---|---|---|---|---|---|---|---|---|---|---|
| Sample 1-1 | T-1/T-2 | J-1 | K-1 (oxime)/ 6 mass % | Titanium Black | 1.85 | 1.8 | 1.7 | 2 to 5 | 0 | The invention |
| Sample 1-1-2 | T-1/T-2 | J-1 | K-2 (oxime)/ 6 mass % | Titanium Black | 1.85 | 1.8 | 1.7 | 2 to 5 | 3 | The invention |
| Sample 1-1-3 | T-1/T-2 | J-1 | K-3 (oxime)/ 6 mass % | Titanium Black | 1.85 | 1.8 | 1.7 | 2 to 5 | 0 | The invention |
| Sample 1-1-4 | T-1/T-2 | J-1 | K-4 (oxime)/ 6 mass % | Titanium Black | 1.85 | 1.8 | 1.7 | 2 to 5 | 0 | The invention |
| Sample 1-11 | T-1/T-2 | J-1 | K-1 (oxime)/ 1 mass % | Titanium Black | 1.85 | 1.8 | 1.7 | 2 to 5 | 25 | The invention |
| Sample 1-11-2 | T-1/T-2 | J-1 | K-2 (oxime)/ 1 mass % | Titanium Black | 1.85 | 1.8 | 1.7 | 2 to 5 | 30 | The invention |
| Sample 1-11-3 | T-1/T-2 | J-1 | K-3 (oxime)/ 1 mass % | Titanium Black | 1.85 | 1.8 | 1.7 | 2 to 5 | 20 | The invention |
| Sample 1-11-4 | T-1/T-2 | J-1 | K-4 (oxime)/ 1 mass % | Titanium Black | 1.85 | 1.8 | 1.7 | 2 to 5 | 15 | The invention |
| Sample 1-20 | T-1/T-2 | J-1 | K-1 (oxime)/ 30 mass % | Titanium Black | 1.85 | 1.8 | 1.7 | 2 to 5 | 30 | The invention |
| Sample 1-20-2 | T-1/T-2 | J-1 | K-2 (oxime)/ 30 mass % | Titanium Black | 1.85 | 1.8 | 1.7 | 2 to 5 | 35 | The invention |
| Sample 1-20-3 | T-1/T-2 | J-1 | K-3 (oxime)/ 30 mass % | Titanium Black | 1.85 | 1.8 | 1.7 | 2 to 5 | 25 | The invention |
| Sample 1-20-4 | T-1/T-2 | J-1 | K-4 (oxime)/ 30 mass % | Titanium Black | 1.85 | 1.8 | 1.7 | 2 to 5 | 20 | The invention |

As shown in Table 3, a sample using the novel oxime-based initiator K-4 achieved a narrow and favorable width of the step region.

Example 1-4

Preparation of Photosensitive Resin Composition

<Preparation of Sample 1-31 (A Photosensitive Resin Composition Containing Titanium Black)>

(Preparation of Titanium Black Dispersion)

The following composition was subjected to a dispersion treatment with a disperser (bead mill, ULTRA APEX MILL, trade name, manufactured by Kotobuki Industries Co., Ltd).

| | |
|---|---|
| Titanium black dispersion prepared above | 40 parts |
| Dipentaerythritol hexaacrylate (compound T-1 above) | 7 parts |
| Oxime-based photopolymerization initiator (compound K-1 above) | 5 parts |
| Resin (compound J-1 above) | 7 parts |
| Propylene glycol monomethyl ether acetate | 30 parts |

<Preparation of Samples 1-32 to 1-39 (Photosensitive Resin Compositions Containing Titanium Black)>

Samples 1-32 to 1-39 were prepared in a similar manner, except that the photopolymerization initiator and resin were changed as shown in the following Table 4.

<<Preparation and Evaluation of Light-Shielding Color Filter>>

Light-shielding color filters were prepared using the above-obtained samples 1-31 to 1-39 in a similar manner to Example 1-1, and evaluation was conducted in a similar manner to Example 1-1. The results are shown in Table 4.

TABLE 4

| Photosensitive resin composition | Photopoly-merizable compound | Resin | Photopolymeriza-tion initiator/ content | Black colorant | $OD_{900}/OD_{365}$ | $OD_{1100}/OD_{365}$ | $OD_{1200}/OD_{365}$ | OD at 900 to 1300 nm | Width of step region (μm) | Notes |
|---|---|---|---|---|---|---|---|---|---|---|
| Sample 1-31 | T-1 | J-1 | K-1 (oxime)/ 13 mass % | Titanium Black | 1.2 | 0.8 | 0.7 | 2 to 5 | 0 | The invention |
| Sample 1-32 | T-1 | J-1 | (VI) (triazine)/ 13 mass % | Titanium Black | 1.2 | 0.8 | 0.7 | 2 to 5 | 5 | The invention |
| Sample 1-33 | T-1 | J-1 | K-3 (oxime)/ 6 mass % | Titanium Black | 1.2 | 0.8 | 0.7 | 2 to 5 | 7 | The invention |
| Sample 1-34 | T-1 | J-2 | IRGACURE 369 (aminoalkyl phenone)/ 13 mass % | Titanium Black | 1.2 | 0.8 | 0.7 | 2 to 5 | 3 | The invention |
| Sample 1-35 | T-1 | J-2 | (VI) (triazine)/ 13 mass % | Titanium Black | 1.2 | 0.8 | 0.7 | 2 to 5 | 8 | The invention |
| Sample 1-36 | T-1 | J-2 | IRGACURE 369 (aminoalkyl phenone)/ 13 mass % | Titanium Black | 1.2 | 0.8 | 0.7 | 2 to 5 | 10 | The invention |
| Sample 1-37 | T-1 | J-1 | K-2 (oxime)/ 13 mass % | Titanium Black | 1.2 | 0.8 | 0.7 | 2 to 5 | 2 | The invention |
| Sample 1-38 | T-1 | J-1 | K-3 (oxime)/ 13 mass % | Titanium Black | 1.2 | 0.8 | 0.7 | 2 to 5 | 0 | The invention |
| Sample 1-39 | T-1 | J-1 | K-4 (oxime)/ 13 mass % | Titanium Black | 1.2 | 0.8 | 0.7 | 2 to 5 | 0 | The invention |

As shown in Table 4, each of the light-shielding color filters prepared from Samples 1-31 to 1-39 had a suppressed width of step region.

The above explanation has been given with reference to the examples in which a specific compound is used as a black colorant, a photopolymerizable compound, a resin, a photopolymerization initiator or a solvent. However, even when other compounds are used in place of the above, similar effects will be achieved as long as the light-shielding color filter has a ratio of $OD_{1200}/OD_{365}$ in a range of 0.5 or more and 3 or less.

In addition, in the above examples, the light-shielding color filter was formed on a silicon wafer. However, it is also within the scope of the invention to replace the silicon water with a substrate for a solid-state image sensor on which light-receiving elements such as photo diodes are formed, and form a light-shielding color filter on a side opposite to the surface on which the light-receiving elements are formed (backside), in order to obtain a solid-state image sensor having a reduced amount of noise and excellent color reproducibility.

Second Exemplary Embodiment

In the following, the weight average molecular weight was measured by gel permeation chromatography (GPC). The GPC was performed using HLC-8120 GPC and SC-8020 (manufactured by Tosoh Corporation), TSK gels and Super HM-H (manufactured by Tosoh Corporation, 6.0 mm ID×15 cm) as the columns, and THF (tetrahydrofuran) as an eluent. In addition, the measurement was performed at a sample concentration of 0.5 mass %, flow rate of 0.6 ml/min, sample injection amount of 10 μl and a temperature of 40° C., using an RI detector. In addition, the calibration curve was prepared from 10 samples of the "polystyrene standard samples, TSK standard" manufactured by Tosoh Corporation: "A-500", "F-1", "F-10", "F-80", "F-380", "A-2500", "F-4", "F-40", "F-128" and "F-700".

Further, the acid value of the resin was measured by a method defined in Section 11.1 of JIS K 5407 (1990).

Example 2-1

Preparation of Photosensitive Resin Composition

<Preparation of Sample 2-1 (Photosensitive Resin Composition Containing Titanium Black)>

(Preparation of Titanium Black Dispersion)

The following components were subjected to a high-viscosity dispersion treatment with a pair of rollers to prepare a dispersion. The viscosity of the dispersion was 40000 mPa·s.

In this process, the dispersion may be subjected to kneading for 30 minutes with a kneader before the high-viscosity dispersion treatment.

| | |
|---|---|
| Titanium black (13M-T, trade name, manufactured by Jemco Inc.) | 45 parts |
| Solsperse 5000 (trade name, manufactured by The Lubrizol Corporation) | 3.5 parts |

To the obtained dispersion, 150 parts of propylene glycol monomethyl ether acetate was added, and the obtained mixture was subjected to a dispersion treatment with a dispersion machine (DISPERMAT, trade name, manufactured by GETZMANN GMBH) with use of 0.5 mm zirconia beads for 4 hours to produce a titanium black dispersion. The viscosity of the titanium black dispersion was 4.0 mPa·S.

(Synthesis of Exemplary Resin A-1 (Resin A))

In a 300 ml four-neck flask, 44.2 g (0.425 mol) of styrene, 5.40 g (0.075 mol) of acrylic acid, and 50 g of propylene glycol monomethyl ether acetate were put and stirred under nitrogen atmosphere at 80° C. A solution dissolving 0.3118 g ($1.91 \times 10^{-3}$ mol) of 2,2'-azobisisobutylnitrile (AIBN) in 10 g of propylene glycol monomethyl ether acetate was added to the mixture as a thermal polymerization initiator, and the mixture was stirred for 6 hours. Subsequently, the supply of nitrogen was stopped and a solution dissolving 0.22 g ($1.5 \times 10^{-3}$ mol) of p-methoxyphenol in 15 g of propylene glycol monomethyl ether acetate was added to the mixture. Then, the mixture was stirred at an elevated temperature of 95° C. for 2 hours, thereby obtaining an Exemplary Resin A-1 (as resin A in the present exemplary embodiment). The acid value of the obtained Exemplary Resin A-1 was 70 mg KOH/g, and the weight average molecular weight was 8000.

(Synthesis of Exemplary Resin B-1 (Resin B))

Exemplary Resin B-1 was synthesized as resin B in the present exemplary embodiment in a similar manner to the synthesis of Exemplary Resin A-1, except that the amount of styrene was changed to 50.75 g (0.487 mol), and the amount of acrylic acid was changed to 0.94 g (0.013 mol), respectively. The acid value of the obtained Exemplary Resin B-1 was 15 mg KOH/g, and the weight average molecular weight was 9000.

(Preparation of Photosensitive Resin Composition)

A photosensitive resin composition (sample 2-1) was prepared by mixing the components.

—Composition of Photosensitive Resin Composition (Sample 2-1)—

| | |
|---|---|
| Exemplary Resin A-1 synthesized above | 2 parts |
| Exemplary Resin B-1 synthesized above | 1 part |
| Dipentaerythritol hexaacrylate (polymerizable compound; compound T-1 below) | 1.9 parts |
| Ethoxylated pentaerythritol tetraacrylate (polymerizable compound; compound T-2 below) | 1.4 parts |
| Titanium black dispersion prepared above | 30 parts |
| Propylene glycol monomethyl ether acetate (PGMEA) | 5 parts |
| Ethyl-3-ethoxypropionate (EEP) | 3 parts |
| Oxime-based photopolymerization initiator (compound K-1 below) | 2.8 parts |

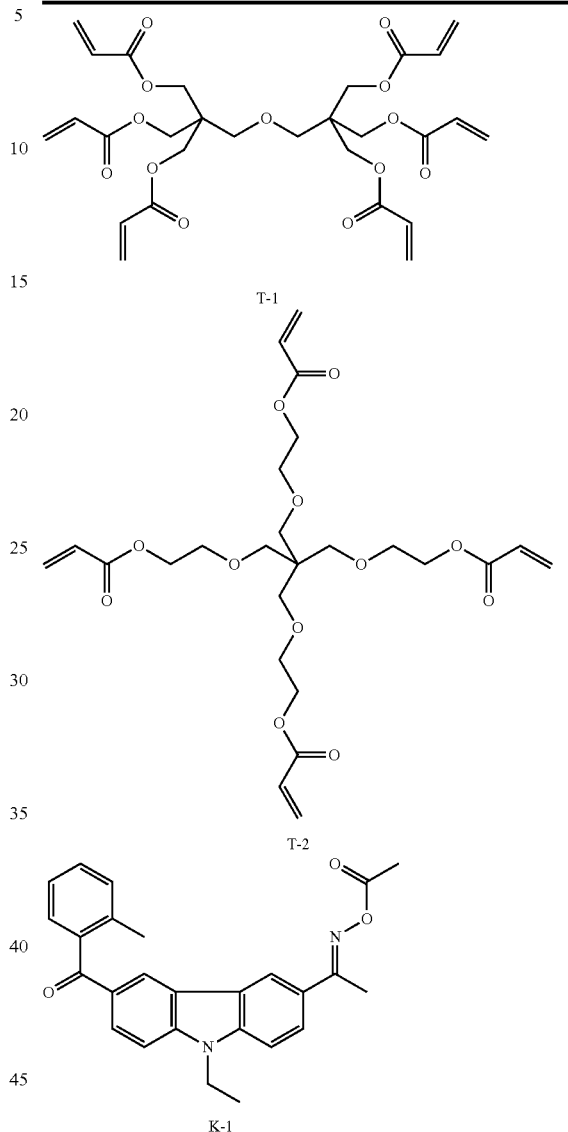

<Preparation of Sample 2-2 to Sample 2-25>

Sample 2-2 to sample 2-25 were prepared as a photosensitive resin composition in a similar manner as in sample 2-1, except that the acid values of Exemplary Resin A-1 and Exemplary Resin B-1 were adjusted to the values as shown in Table 4 by changing the amount of styrene and acrylic acid in the preparation of sample 2-1. Further, the weight average molecular weight of Exemplary Resin A-1 and the weight average molecular weight of Exemplary Resin B-1 in samples 2-2 to 2-25 were equal to those of sample 2-1, respectively.

<<Evaluation of Temporal Stability of Photosensitive Resin Composition>>

The obtained photosensitive resin compositions (sample 2-1 to sample 2-25) were left to stand at 4° C. for 6 months, and then the viscosity of the photosensitive resin compositions was measured (unit: Pa·s). The viscosity was compared with the viscosity (unit: Pa·s) that had been measured immediately after the preparation of the photosensitive resin composition (within 1 hour after the mixing of the total components, temperature: 23° C.).

The measurement of viscosity was performed using an E-type viscometer (manufactured by TOKI SANGYO CO., LTD.).

The temporal stability of the photosensitive resin composition was evaluated by calculating a change rate in viscosity with time (%) by the following expression. The closer the change rate in viscosity is to 0%, the more favorable the temporal stability of photosensitive resin composition is. Evaluation results are shown in Table 5.

Change rate in viscosity with time (%)=((viscosity A−viscosity B)/(viscosity B))×100

In the above expression, viscosity A represents a viscosity after being left for 6 months at 4° C., and viscosity B represents a viscosity measured immediately after the preparation.

<<Preparation and Evaluation of Light-Shielding Color Filter>>

The photosensitive resin composition obtained above was applied onto a silicon wafer by a spin coating method, and then heated on a hot plate at 120° C. for 2 minutes, thereby preparing a photosensitive layer.

Then, the obtained photosensitive layer was exposed to light using an i-line stepper at an exposure amount of 500 mJ/cm$^2$ through a photo mask having a linear pattern (aperture pattern) of 3 μm width.

Following the exposure, the photosensitive layer was subjected to paddle development using 0.3% aqueous solution of tetramethylammonium hydroxide at 23° C. for 60 seconds. Thereafter, the photosensitive layer was rinsed with a spin shower and further washed with pure water, thereby producing a light-shielding color filter.

The obtained light-shielding color filter was observed with an optical microscope (1000-fold magnification), and the state of development residue and pattern adhesion were evaluated on the basis of the following standards.

—Development Residue—

A: Residue is not found, or slightly found at a non-exposed portion but at an acceptable level.

N: Residue is found at a non-exposed portion.

—Pattern Adhesion—

A: Exfoliation of pattern is not found.

N: Exfoliation of pattern is partially found.

The evaluation results are shown in Table 5.

TABLE 5

|  | Acid value of Resin A (mgKOH/g) | Amount of Resin A (part) | Acid value of Resin B (mgKOH/g) | Amount of Resin B (part) | Change rate in viscosity with time (%) | Development residue | Pattern adhesion | Notes |
| --- | --- | --- | --- | --- | --- | --- | --- | --- |
| Sample 2-1 | 70 | 2 | 15 | 1 | 13 | N | A | Comparative |
| Sample 2-2 | 75 | 2 | 30 | 1 | 5 | A | A | The invention |
| Sample 2-3 | 100 | 2 | 30 | 1 | 4 | A | A | The invention |
| Sample 2-4 | 100 | 2 | 10 | 1 | 16 | N | A | Comparative |
| Sample 2-5 | 110 | 2 | 5 | 1 | 23 | N | A | Comparative |
| Sample 2-6 | 110 | 2 | 30 | 1 | 3 | A | A | The invention |
| Sample 2-7 | 110 | 2.4 | 30 | 0.6 | 4 | A | A | The invention |
| Sample 2-8 | 110 | 1.5 | 30 | 1.5 | 3 | A | A | The invention |
| Sample 2-9 | 200 | 2 | 30 | 1 | 5 | A | A | The invention |
| Sample 2-10 | 250 | 2 | 30 | 1 | 5 | A | A | The invention |
| Sample 2-11 | 260 | 2 | 30 | 1 | 12 | A | N | Comparative |
| Sample 2-12 | 300 | 2 | 30 | 1 | 14 | A | N | Comparative |
| Sample 2-13 | 110 | 2 | 15 | 1 | 20 | N | A | Comparative |
| Sample 2-14 | 110 | 2 | 23 | 1 | 18 | N | A | Comparative |
| Sample 2-15 | 110 | 2 | 26 | 1 | 5 | A | A | The invention |
| Sample 2-16 | 110 | 2 | 40 | 1 | 4 | A | A | The invention |
| Sample 2-17 | 110 | 2 | 65 | 1 | 5 | A | A | The invention |
| Sample 2-18 | 110 | 2 | 68 | 1 | 15 | N | A | Comparative |
| Sample 2-19 | 110 | 2 | 90 | 1 | 25 | N | A | Comparative |
| Sample 2-20 | 110 | 3 | — | 0 | 35 | N | A | Comparative |
| Sample 2-21 | 70 | 3 | — | 0 | 25 | N | A | Comparative |
| Sample 2-22 | 50 | 2 | 10 | 1 | 20 | N | A | Comparative |
| Sample 2-23 | 50 | 2 | 30 | 1 | 20 | N | A | Comparative |
| Sample 2-24 | 65 | 2 | 30 | 1 | 15 | N | A | Comparative |
| Sample 2-25 | 70 | 2 | 30 | 1 | 5 | A | A | The invention |

As shown in Table 5, the photosensitive resin composition of the present exemplary embodiment, including resin A having an acid value of 70 mg KOH/g or more and 250 mg KOH/g or less and resin B having an acid value of 26 mg KOH/g or more and 65 mg KOH/g or less, exhibited a small change rate in viscosity with time, excellent temporal stability, and a suppressed amount of development residue. Further, the photosensitive resin composition of the present exemplary embodiment also exhibited excellent pattern adhesion.

Examples 2-2

Synthesis of Resin A (Synthesis of Exemplary Resin A-2)

Exemplary Resin A-2 shown below was synthesized as resin A in a similar manner to the synthesis of Exemplary Resin A-1, except that the copolymerization components were changed from styrene and acrylic acid to benzylmethacrylate, isobutylmethacrylate, methacrylate, and "BLEMMER PME400", trade name, manufactured by NOF CORPORATION.

The acid value of obtained Exemplary Resin A-2 was 106 mg KOH/g, and the weight average molecular weight was 10,000.

Exemplary Resin A-2

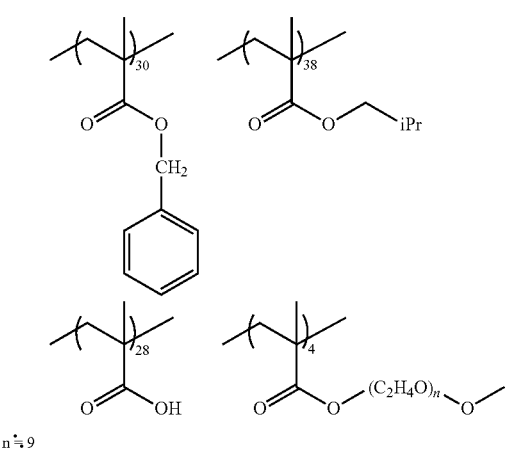

(Synthesis of Exemplary Resin A-3)

Exemplary Resin A-3 below was synthesized as resin A in a similar manner to the synthesis of Exemplary Resin A-1, except that the copolymerization components were changed from styrene and acrylic acid to benzylmethacrylate and methacrylate.

The acid value of obtained Exemplary Resin A-3 was 110 mg KOH/g, and the weight average molecular weight was 30000.

Exemplary Resin A-3

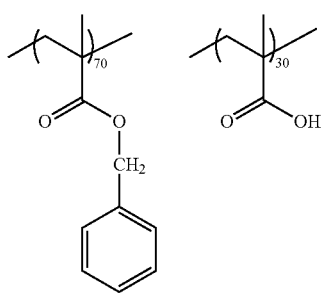

(Synthesis of Exemplary Resin A-4)

Exemplary Resin A-4 below was synthesized as resin A in a similar manner to the synthesis of Exemplary Resin A-1, except that the copolymerization components were changed from styrene and acrylic acid to benzylmethacrylate, 2-hydroxyethylmethacrylate, methacrylate and "BLEMMER PME400", trade name, manufactured by NOF CORPORATION.

The acid value of obtained Exemplary Resin A-4 was 120 mg KOH/g, and the weight average molecular weight was 9,000.

Exemplary Resin A-4

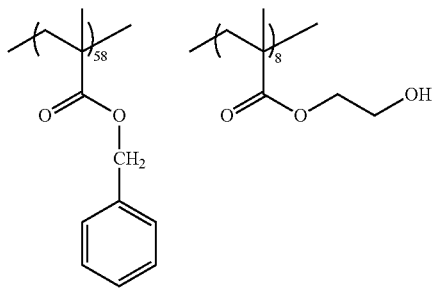

-continued

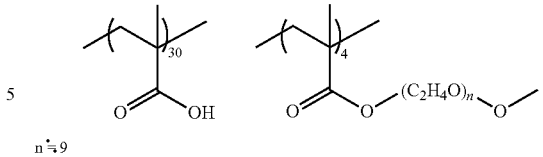

<Synthesis of Resin B>

(Synthesis of Exemplary Resin B-2)

Exemplary resin B-2 below was synthesized as resin B in a similar manner to the synthesis of Exemplary Resin A-1, except that the copolymerization components were changed from styrene and acrylic acid to methylmethacrylate, methacrylic acid and 2-hydroxy-4-acryloyloxymethyl-cyclohexylmethacrylate.

The acid value of obtained Exemplary Resin B-2 was 37 mg KOH/g, and the weight average molecular weight was 14,000.

Exemplary Resin B-2

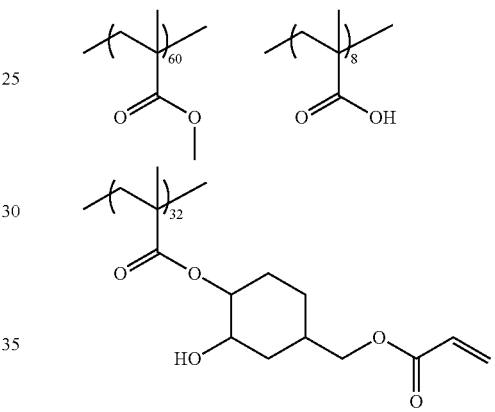

(Synthesis of Exemplary Resin B-3)

Exemplary Resin B-3 below was synthesized as resin B in a similar manner to the synthesis of Exemplary Resin A-1, except that the copolymerization components were changed from styrene and acrylic acid to benzylmethacrylate, 2-hydroxyethylmethacrylate and methacrylic acid.

The acid value of obtained Exemplary Resin B-3 was 30 mg KOH/g, and the weight average molecular weight was 14,000.

Exemplary Resin B-3

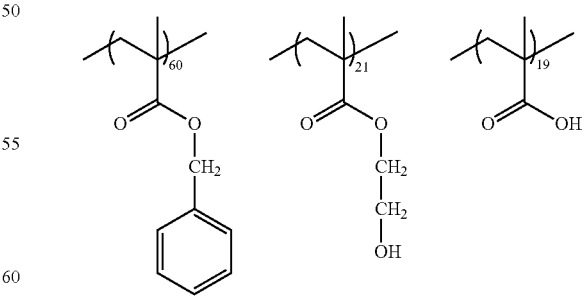

<Preparation of Sample 2-26>

(Preparation of Titanium Black Dispersion)

The following components were mixed to prepare a dispersion of titanium black (titanium black dispersion). The viscosity of the obtained titanium black dispersion was 3.0 mPa·S.

—Composition of the Titanium Black Dispersion—

| | |
|---|---|
| Titanium black (13M-T, trade name, manufactured by Jemco Inc. | 35 parts |
| KAYAMER-PM21 (manufactured by Nippon Kayaku Co., Ltd.) | 3.5 parts |
| Above-mentioned Exemplary Resin A-2 | 30 parts |
| Propylene glycol monomethyl acetate solution of benzyl(meth)acrylate/(meth)acrylic acid copolymer (BzMA/MAA = 70/30, Mw: 30000, solid content: 40 mass %, acid value: 106 mg KOH/g) | 5 parts |

(Preparation of Photosensitive Resin Composition)

The following components were mixed to prepare a photosensitive resin composition (sample 2-26).

—Composition of Photosensitive Resin Composition (Sample 2-26)—

| | |
|---|---|
| Exemplary Resin B-2 synthesized above | 3 parts |
| Dipentaerythritol hexaacrylate (polymeric compound; above-mentioned Compound T-1) | 3 parts |
| Titanium black dispersion prepared above | 25 parts |
| Propylene glycol monomethyl ether acetate (PGMEA) | 6 parts |
| Ethyl-3-ethoxypropionate (EEP) | 3 parts |
| Oxime-based photopolymerization initiator (above-mentioned compound K-1) | 3.5 parts |

<Preparation of Sample 2-27 to Sample 2-37>

Each of the photosensitive resin compositions (Sample 2-27 to Sample 2-37) was produced in a similar manner to the preparation of sample 2-26, except that Exemplary Resin A-2 used in the preparation of titanium black dispersion, and Exemplary Resin B-2 used in the preparation of photosensitive resin composition were respectively changed to those shown in Table 6 below in the preparation of Sample 2-26.

<<Evaluation of Temporal Stability of Photosensitive Resin Composition>>

The change rate in viscosity (%) of the photosensitive resin compositions obtained above (Sample 2-26 to Sample 2-37) was calculated in a similar manner as in Example 2-1, and temporal stability of the photosensitive resin composition was evaluated. The evaluation results are shown in Table 6.

<<Preparation and Evaluation of Light-Shielding Color Filter>>

Using the photosensitive resin compositions obtained above (sample 2-26 to sample 2-37), a light-shielding color filter was prepared in a similar manner to Example 2-1 and the development residue was determined in a similar manner to Examples 2-1. The evaluation results are shown in Table 6.

As shown in Table 6, the photosensitive resin composition of the present exemplary embodiment, containing resin A having an acid value of 70 mg KOH/g or more and 250 mg KOH/g or less and resin B having an acid value of 26 mg KOH/g or more and 65 mg KOH/g or less, exhibited a small change in viscosity with time, excellent storage stability and a suppressed amount of development residue, even when the type of the resin is different.

The above explanation has been given with reference to the examples in which a specific compound is used as titanium black, a photopolymerizable compound, resin A, resin B, photopolymerization initiator or a solvent. However, similar effects will be achieved even when other compounds are used in place of the above, as long as the requirements of present exemplary embodiment are satisfied.

In addition, in the above examples, the light-shielding color filter was formed on a silicon wafer. However, it is also within the scope of the invention to replace the silicon water with a substrate for a solid-state image sensor on which light-receiving elements such as photo diodes are formed, and form a light-shielding color filter on a side opposite to the surface on which the light-receiving elements are formed (backside), in order to obtain a solid-state image sensor having a reduced amount of noise and excellent color reproducibility.

All publications, patent applications, and technical standards mentioned in this specification are herein incorporated by reference to the same extent as if each individual publication, patent application, or technical standard was specifically and individually indicated to be incorporated by reference.

What is claimed is:

1. A photosensitive resin composition comprising titanium black, a photopolymerizable compound, a resin A having an acid value of from 70 mgKOH/g to 250 mgKOH/g, a resin B having an acid value of from 26 mgKOH/g to 65 mgKOH/g, a photopolymerization initiator, and a solvent, the photopolymerization initiator comprising an oxime photopolymerization compound having a structure represented by the following Formula (2):

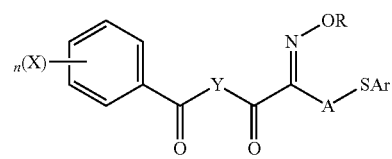

TABLE 6

| | Resin used in preparation of titanium black dispersion | | Resin used in preparation of photosensitive resin composition | | Change in viscosity with time (%) | Development residue | Notes |
|---|---|---|---|---|---|---|---|
| | Exemplary Resin | Acid value | Exemplary Resin | Acid value | | | |
| Sample 2-26 | A-2 | 106 | B-2 | 37 | 5 | A | The invention |
| Sample 2-27 | A-2 | 106 | B-3 | 30 | 3 | A | The invention |
| Sample 2-28 | A-3 | 110 | B-2 | 37 | 6 | A | The invention |
| Sample 2-29 | A-4 | 120 | B-2 | 37 | 5 | A | The invention |
| Sample 2-30 | B-2 | 37 | A-2 | 106 | 4 | A | The invention |
| Sample 2-31 | B-2 | 37 | A-3 | 110 | 6 | A | The invention |
| Sample 2-32 | B-2 | 37 | A-4 | 120 | 5 | A | The invention |
| Sample 2-33 | A-2 | 106 | A-2 | 106 | 35 | A | Comparative |
| Sample 2-34 | B-2 | 37 | B-2 | 37 | 15 | N | Comparative |
| Sample 2-35 | B-3 | 30 | B-3 | 30 | 23 | N | Comparative |
| Sample 2-36 | A-3 | 110 | A-3 | 110 | 43 | A | Comparative |
| Sample 2-37 | A-4 | 120 | A-4 | 120 | 37 | A | Comparative | wherein in Formula (2), R and X each independently represent a monovalent substituent, A and Y each independently represent a bivalent organic group, Ar represents an aryl group, N represents nitrogen, O represents oxygen, S represents sulfur, and n is an integer of 0 to 5, wherein the bivalent organic group represented by Y has any one of the following structures in which * represents a position at which Y is bonded to an adjacent carbon atom in Formula (2):

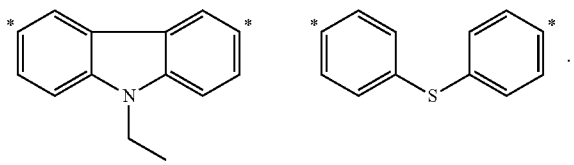

2. The photosensitive resin composition according to claim 1, wherein the mass ratio of resin A to resin B, represented by resin A/resin B, is from 0.5 to 10.5.

3. The photosensitive resin composition according to claim 1, wherein the content of the photopolymerization initiator with respect to the total solid content amount of the composition is from 3 mass % to 20 mass %.

4. A light-shielding color filter formed from the photosensitive resin composition according to claim 1.

5. A method of producing a light-shielding color filter, comprising:
applying the photosensitive resin composition according to claim 1 onto a substrate;
exposing the applied photosensitive resin composition to light via a mask; and
developing the exposed photosensitive resin composition to form a pattern.

6. The photosensitive composition according to claim 1, wherein the acid value of resin A is from 70 mgKOH/g to 200 mgKOH/g.

7. The photosensitive composition according to claim 1, wherein the acid value of resin B is from 30 mgKOH/g to 60 mgKOH/g.

8. The photosensitive composition according to claim 1, wherein the total content of resin A and resin B in the total solid content of the photosensitive resin composition is from 2% by mass to 40% by mass.

9. A solid-state image sensor comprising the light-shielding color filter according to claim 4.

10. A photosensitive resin composition comprising titanium black, a photopolymerizable compound, a resin A having an acid value of from 70 mgKOH/g to 250 mgKOH/g, a resin B having an acid value of from 26 mgKOH/g to 65 mgKOH/g, a photopolymerization initiator, and a solvent, wherein a change in viscosity of the photosensitive resin composition over time is 6% or less.

11. The photosensitive resin composition according to claim 10, wherein the mass ratio of resin A to resin B, represented by resin A/resin B, is from 0.5 to 10.5.

12. The photosensitive resin composition according to claim 10, wherein the content of the photopolymerization initiator with respect to the total solid content amount of the composition is from 3 mass % to 20 mass %.

13. A light-shielding color filter formed from the photosensitive resin composition according to claim 10.

14. A method of producing a light-shielding color filter, comprising:
applying the photosensitive resin composition according to claim 10 onto a substrate;
exposing the applied photosensitive resin composition to light via a mask; and
developing the exposed photosensitive resin composition to form a pattern.

15. The photosensitive composition according to claim 10, wherein the acid value of resin A is from 70 mgKOH/g to 200 mgKOH/g.

16. The photosensitive composition according to claim 10, wherein the acid value of resin B is from 30 mgKOH/g to 60 mgKOH/g.

17. The photosensitive composition according to claim 10, wherein the total content of resin A and resin B in the total solid content of the photosensitive resin composition is from 2% by mass to 40% by mass.

18. The photosensitive composition according to claim 10, wherein the photopolymerization initiator comprises an oxime photopolymerization compound having a structure represented by the following Formula (2):

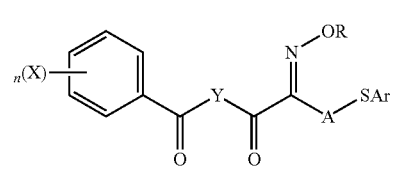

wherein in Formula (2), R and X each independently represent a monovalent substituent, A and Y each independently represent a bivalent organic group, Ar represents an aryl group, N represents nitrogen, O represents oxygen, S represents sulfur, and n is an integer of 0 to 5, wherein the bivalent organic group represented by Y has any one of the following structures in which * represents a position at which Y is bonded to an adjacent carbon atom in Formula (2):

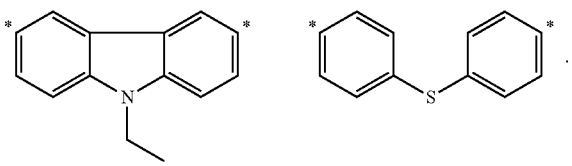

19. A solid-state image sensor comprising the light-shielding color filter according to claim 13.

* * * * *